US010559492B2

(12) United States Patent
Peng et al.

(10) Patent No.: US 10,559,492 B2
(45) Date of Patent: Feb. 11, 2020

(54) PATTERNING METHODS FOR SEMICONDUCTOR DEVICES AND STRUCTURES RESULTING THEREFROM

(71) Applicant: Taiwan Semiconductor Manufacturing Company, Ltd., Hsinchu (TW)

(72) Inventors: Tai-Yen Peng, Hsinchu (TW); Wen-Yen Chen, Chu Tung Township (TW); Chih-Hao Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/004,086

(22) Filed: Jun. 8, 2018

(65) Prior Publication Data
US 2019/0148221 A1 May 16, 2019

Related U.S. Application Data

(60) Provisional application No. 62/586,438, filed on Nov. 15, 2017.

(51) Int. Cl.
*H01L 21/768* (2006.01)
*H01L 21/033* (2006.01)
(Continued)

(52) U.S. Cl.
CPC .... *H01L 21/76816* (2013.01); *H01L 21/0335* (2013.01); *H01L 21/0337* (2013.01);
(Continued)

(58) Field of Classification Search
CPC ......... H01L 21/76816; H01L 21/31144; H01L 21/0337; H01L 21/0338; H01L 21/0335;
(Continued)

(56) References Cited

U.S. PATENT DOCUMENTS 7,960,797 B2 * 6/2011 Lee ................... H01L 21/76816
257/382
8,563,229 B2 * 10/2013 Tran .................... H01L 21/0274
430/323
(Continued)

FOREIGN PATENT DOCUMENTS

WO 2014158200 A1 10/2014

OTHER PUBLICATIONS

Xu, F. et al., "Designing a Practical Access Point Association Protocol," IEEE INFOCOM 2010 Proceedings, 9 pages.

*Primary Examiner* — William Coleman
(74) *Attorney, Agent, or Firm* — Slater Matsil, LLP

(57) ABSTRACT

Semiconductor devices and methods of forming semiconductor devices are provided. A method includes forming a first mask layer over a target layer, forming a plurality of spacers over the first mask layer, and forming a second mask layer over the plurality of spacers and patterning the second mask layer to form a first opening, where in a plan view a major axis of the opening extends in a direction that is perpendicular to a major axis of a spacer of the plurality of spacers. The method also includes depositing a sacrificial material in the opening, patterning the sacrificial material, etching the first mask layer using the plurality of spacers and the patterned sacrificial material, etching the target layer using the etched first mask layer to form second openings in the target layer, and filling the second openings in the target layer with a conductive material.

20 Claims, 47 Drawing Sheets

(51) Int. Cl.
   *H01L 23/522*   (2006.01)
   *H01L 23/528*   (2006.01)
   *H01L 21/311*   (2006.01)

(52) U.S. Cl.
   CPC .... *H01L 21/0338* (2013.01); *H01L 21/31144* (2013.01); *H01L 21/7684* (2013.01); *H01L 21/76877* (2013.01); *H01L 23/5226* (2013.01); *H01L 23/5286* (2013.01)

(58) Field of Classification Search
   CPC ............ H01L 23/5286; H01L 21/7684; H01L 23/5226; H01L 21/76877
   See application file for complete search history.

(56) References Cited

U.S. PATENT DOCUMENTS

| | | | |
|---|---|---|---|
| 8,936,948 B2* | 1/2015 | Fujita | H01L 21/3081 |
| | | | 257/E21.218 |
| 9,099,400 B2* | 8/2015 | Huang | H01L 21/0337 |
| 9,378,976 B2* | 6/2016 | Shaviv | H01L 23/5226 |
| 9,818,613 B1* | 11/2017 | Huang | H01L 21/0332 |
| 9,881,794 B1* | 1/2018 | Su | H01L 21/0332 |
| 10,002,786 B1* | 6/2018 | Licausi | H01L 23/53242 |
| 10,043,703 B2* | 8/2018 | Bouche | H01L 21/0337 |
| 10,170,307 B1* | 1/2019 | Huang | H01L 21/0337 |
| 10,312,106 B2* | 6/2019 | Hsu | H01L 21/32134 |
| 2009/0321791 A1 | 12/2009 | Wagner | |
| 2013/0034965 A1* | 2/2013 | Kim | H01L 21/0274 |
| | | | 438/703 |
| 2013/0107651 A1 | 5/2013 | Singh | |
| 2016/0049307 A1* | 2/2016 | Chen | H01L 21/0337 |
| | | | 438/696 |
| 2016/0225634 A1* | 8/2016 | Anderson | H01L 21/3086 |

\* cited by examiner

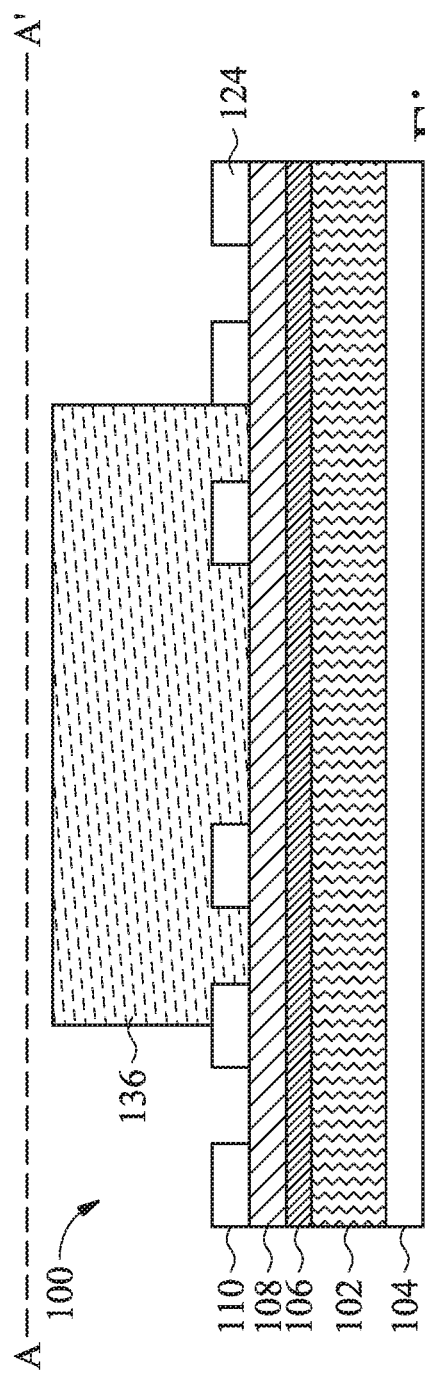
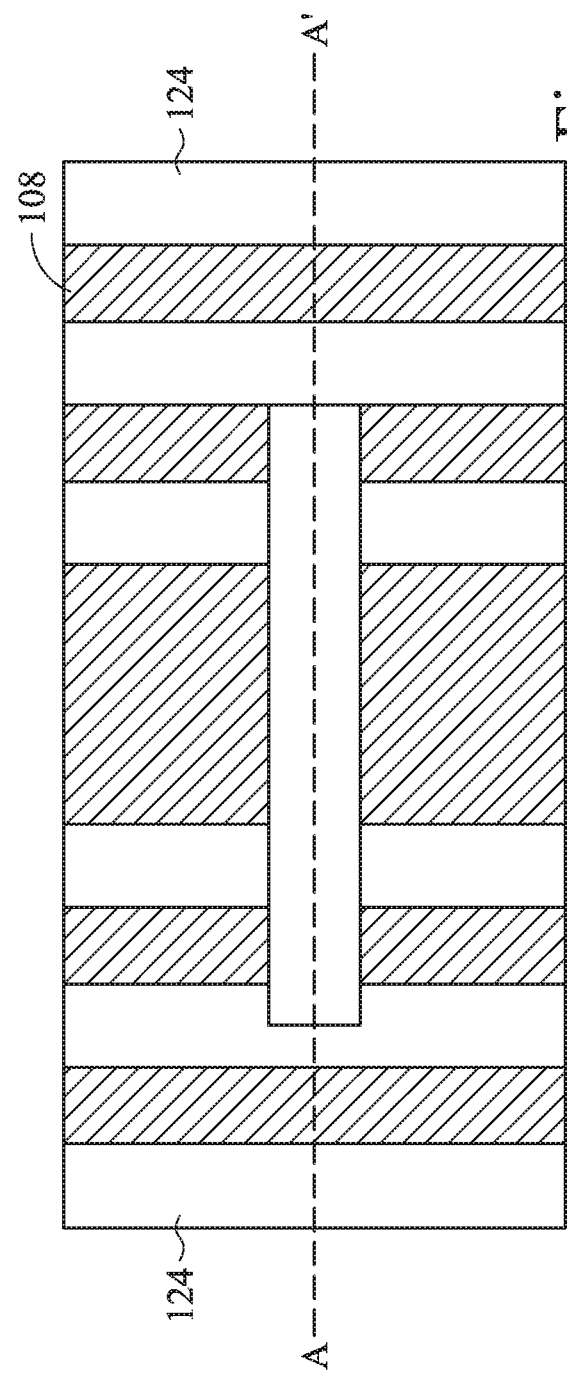
Figure 12A
Figure 12B

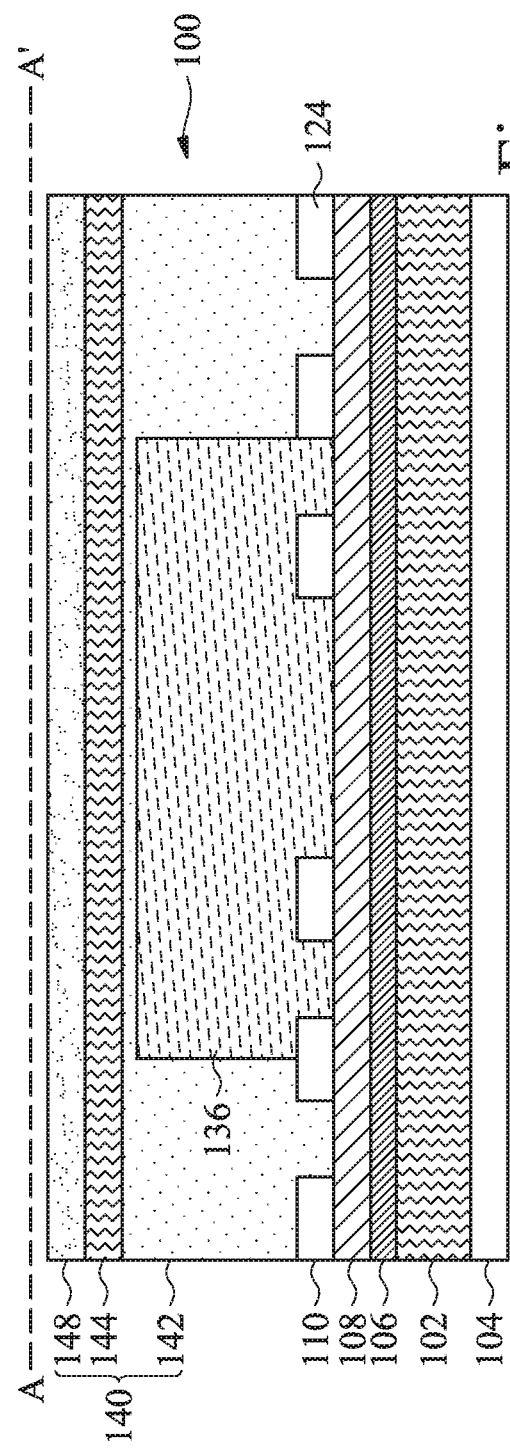
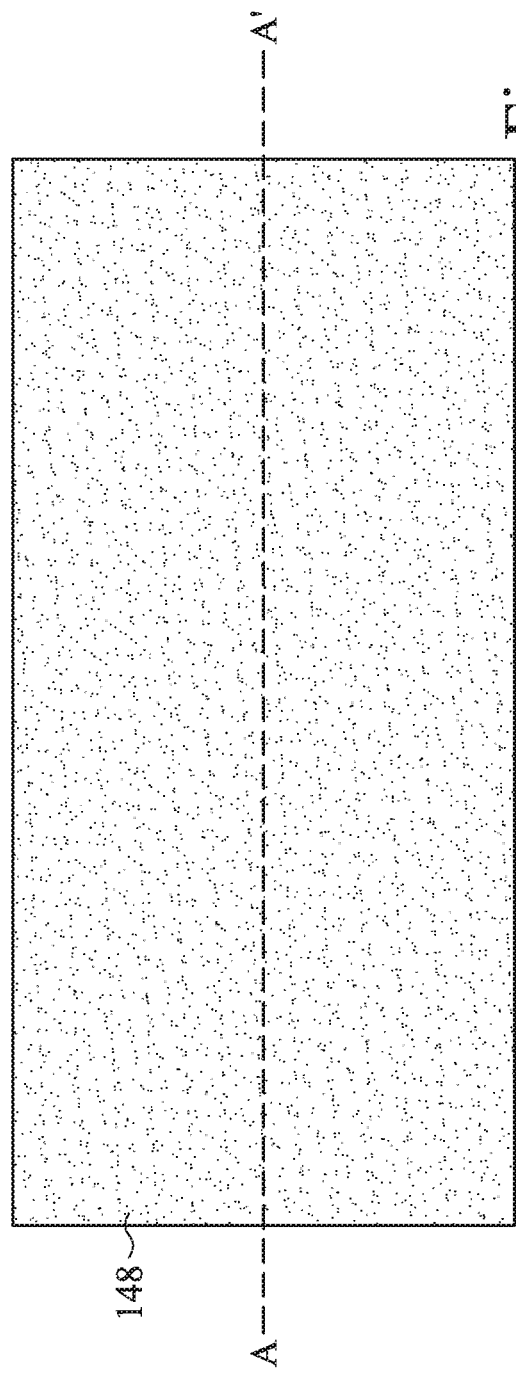
Figure 13A
Figure 13B

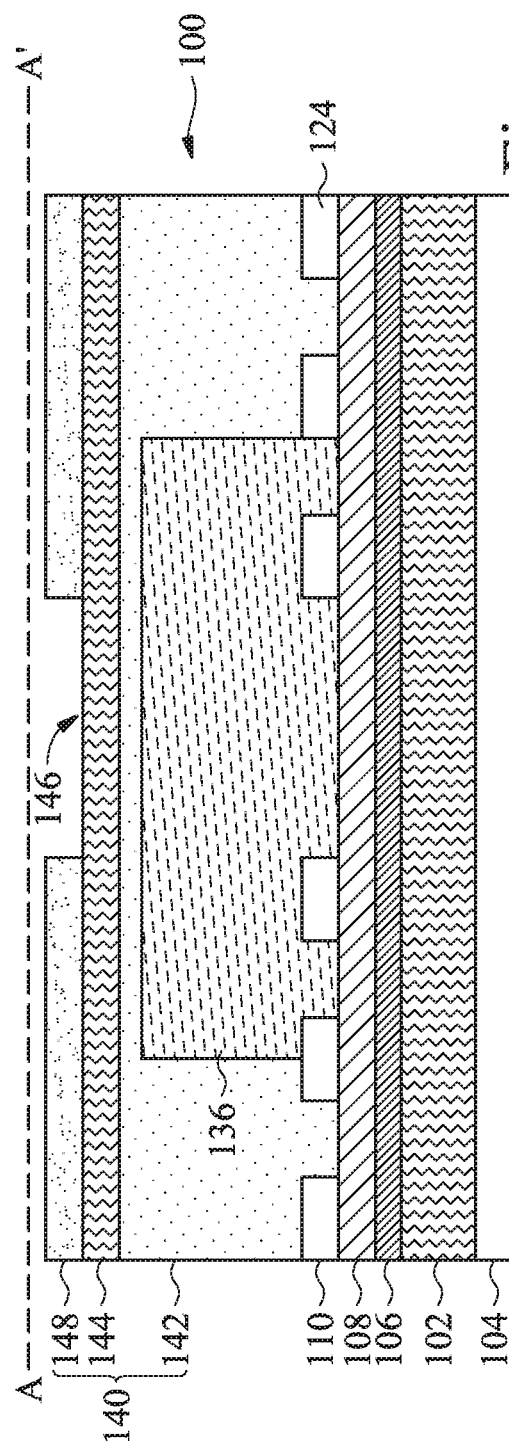
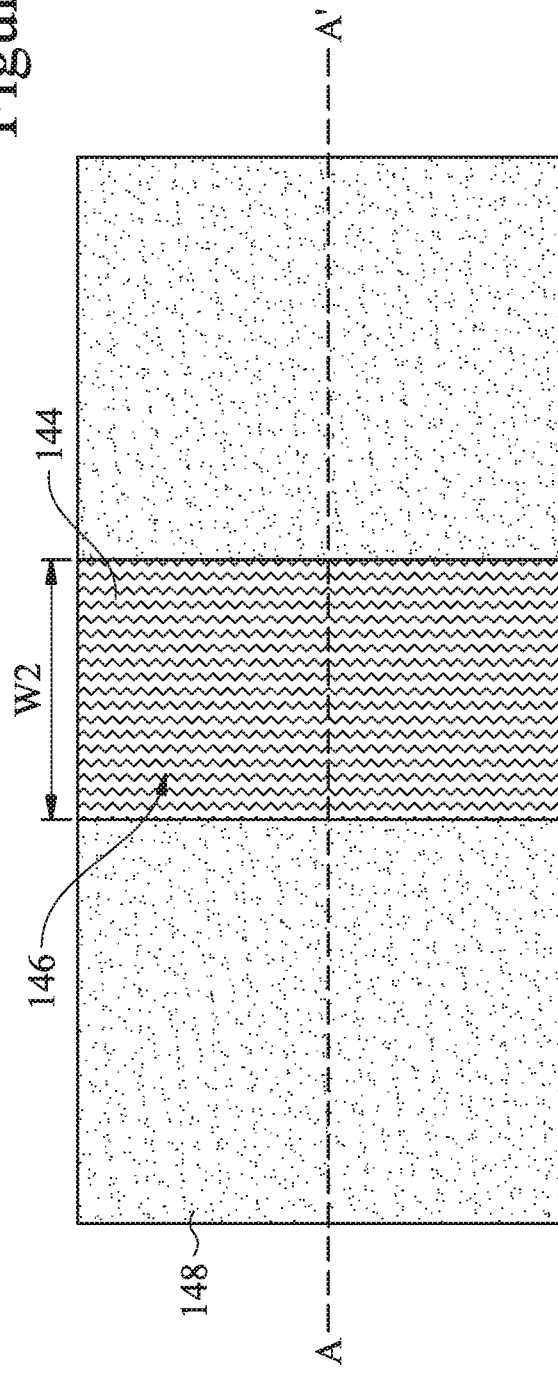

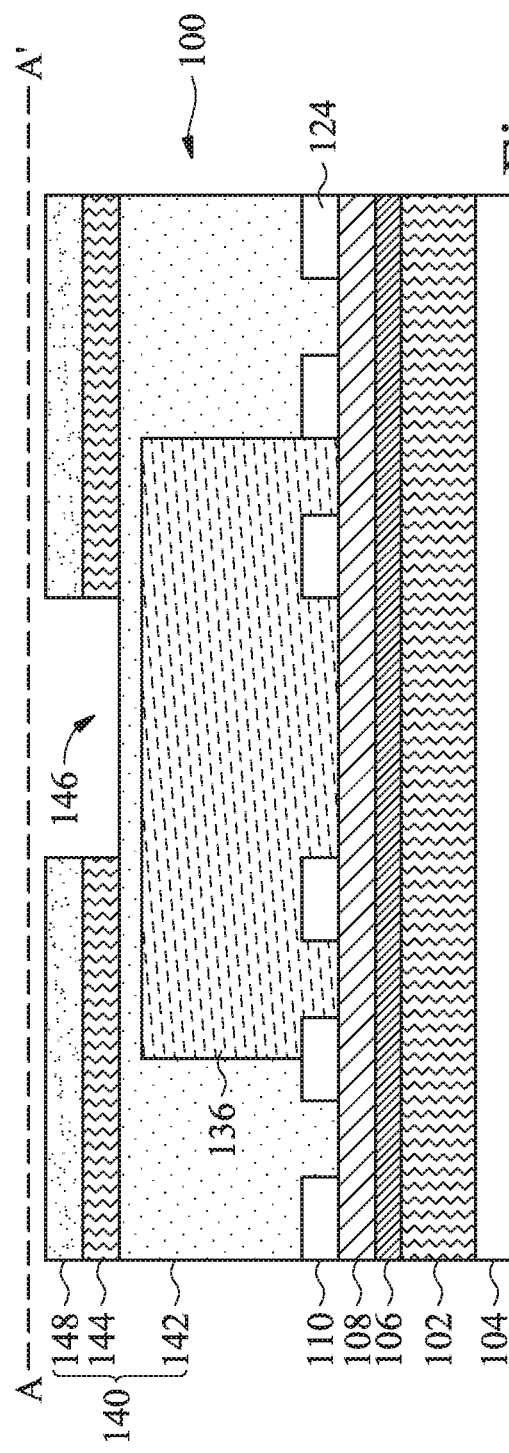
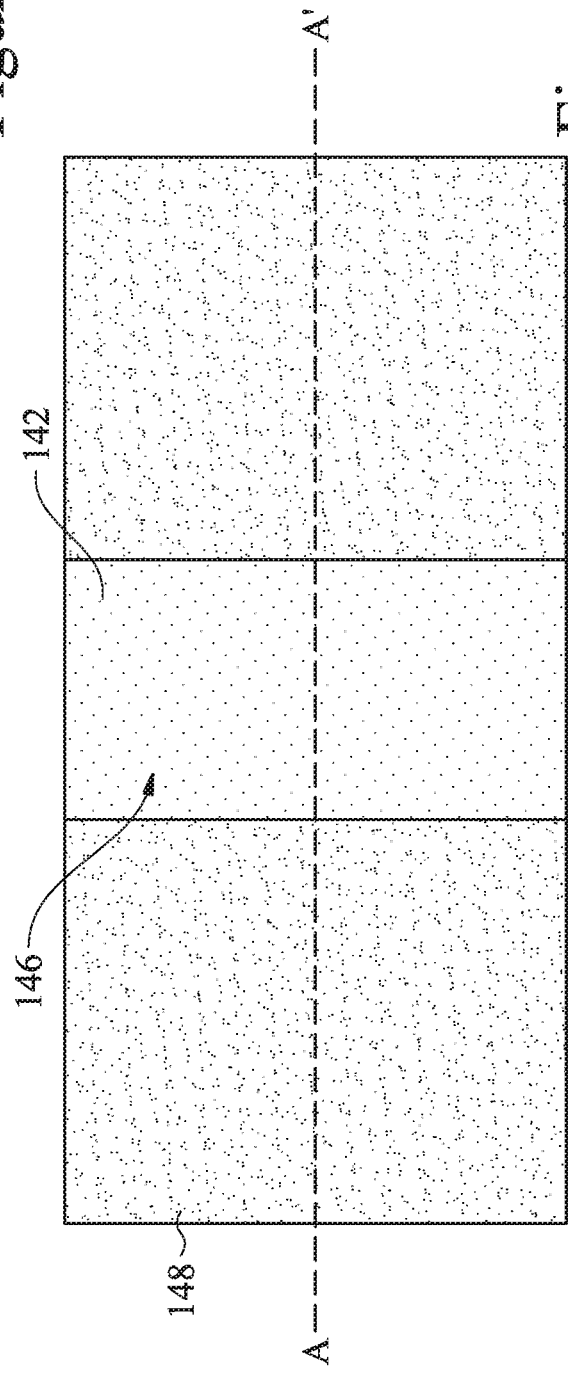
Figure 15A
Figure 15B

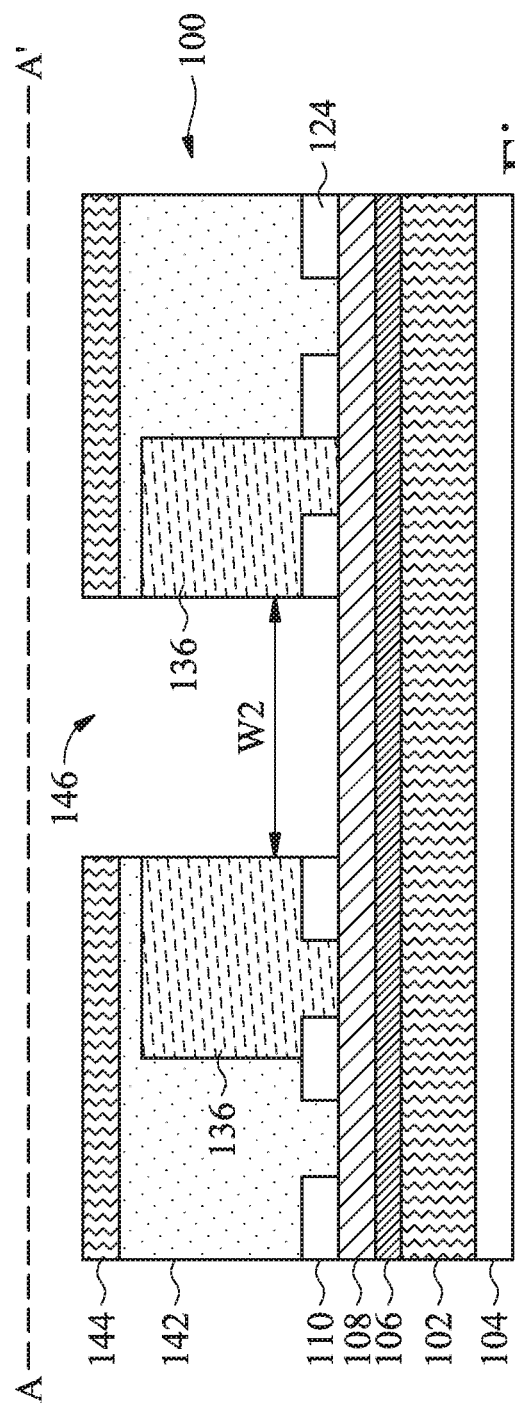
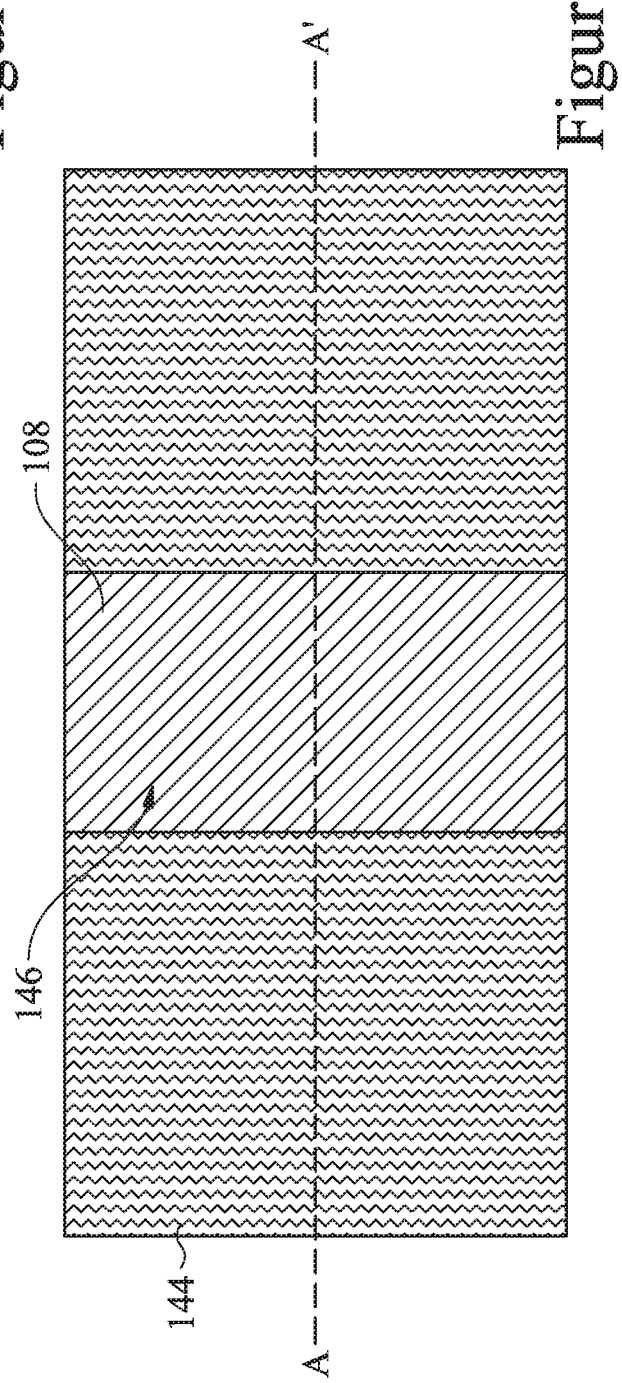
Figure 16A
Figure 16B

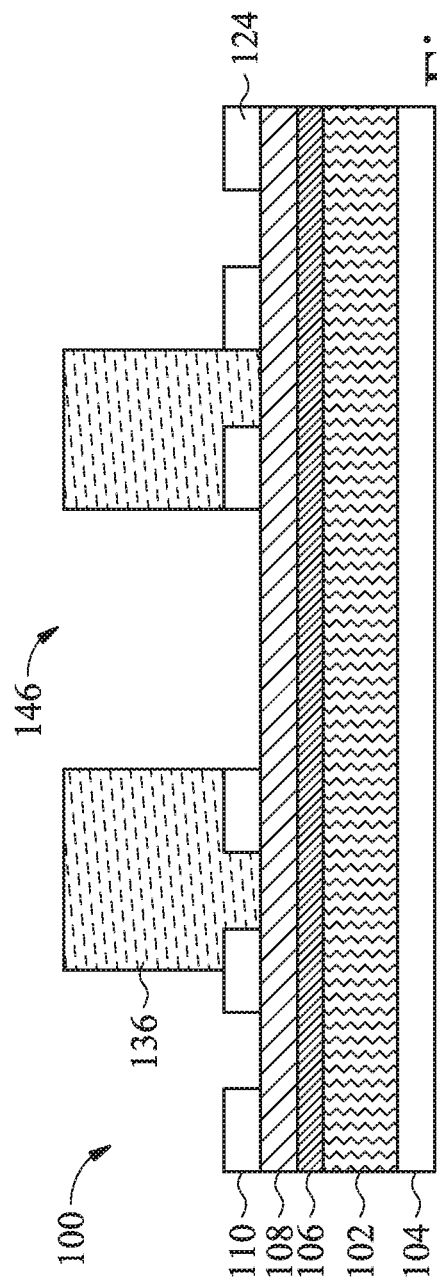
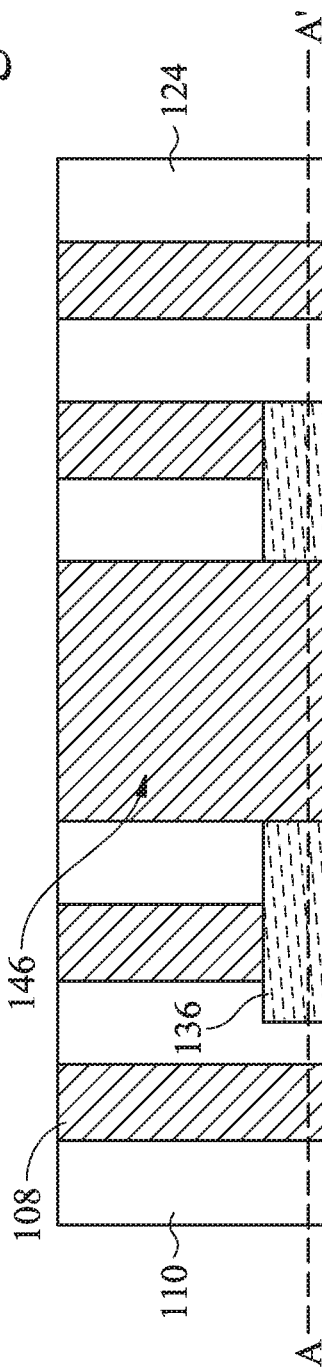

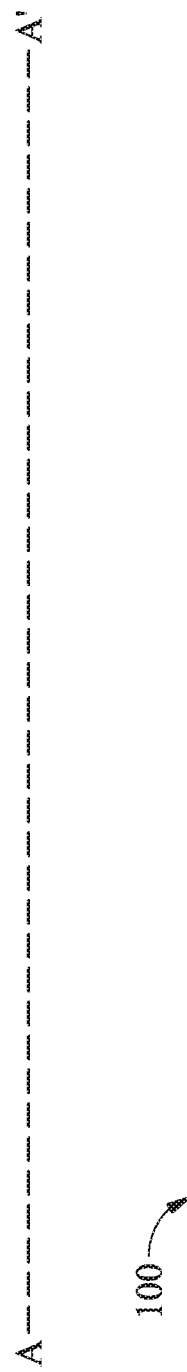
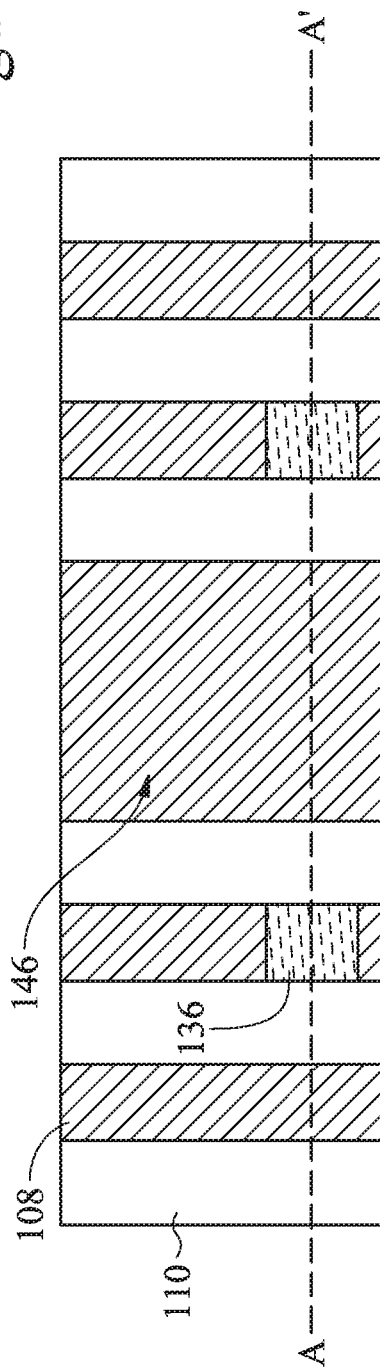
Figure 18A
Figure 18B

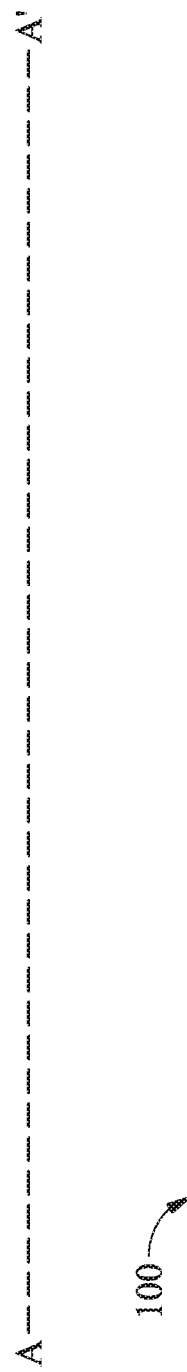
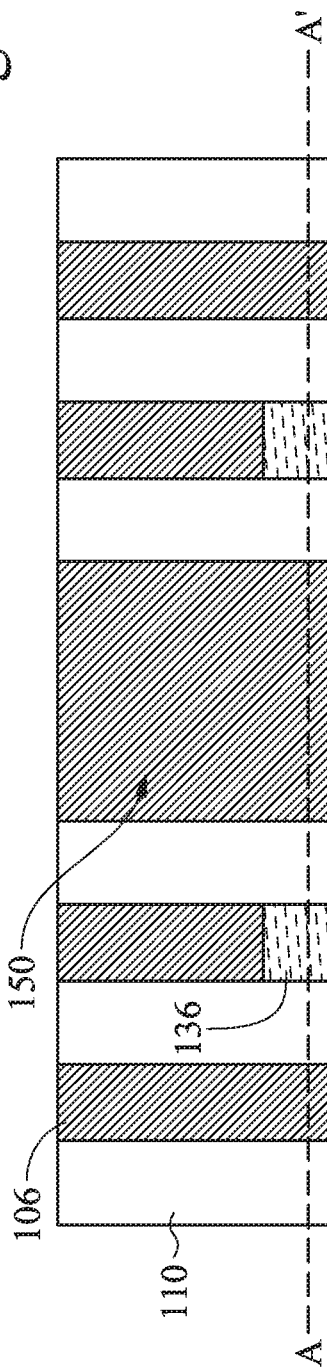
Figure 19A
Figure 19B

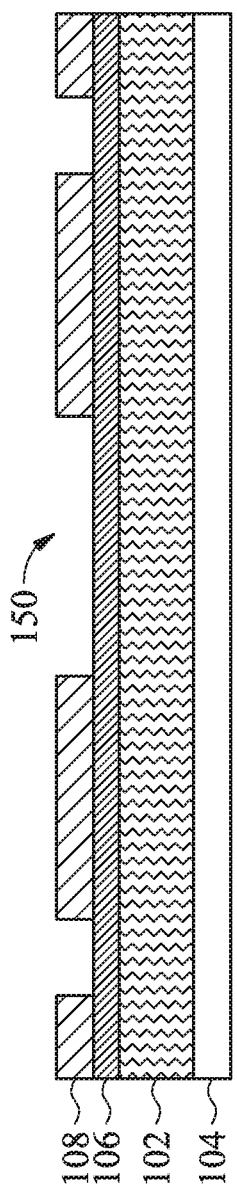
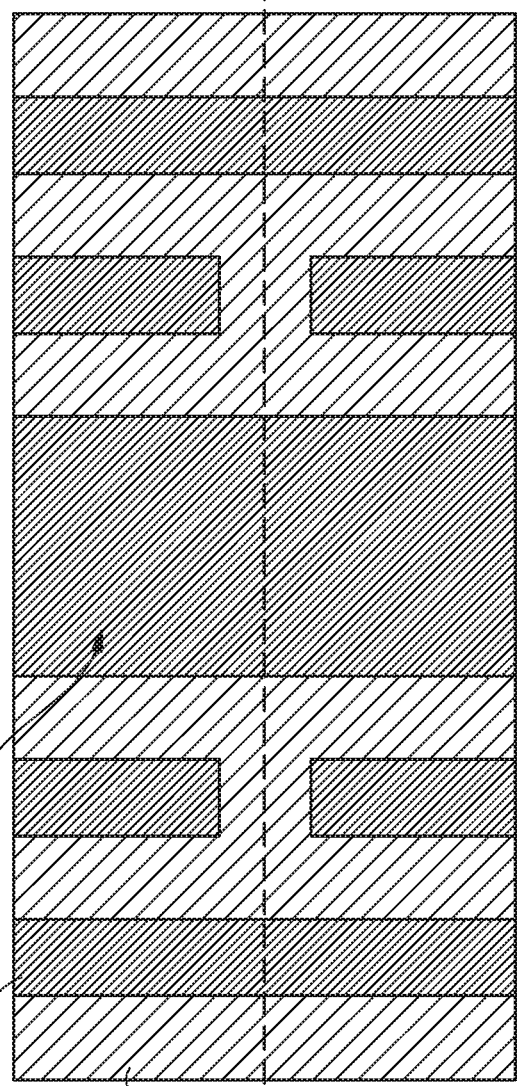
Figure 20A
Figure 20B

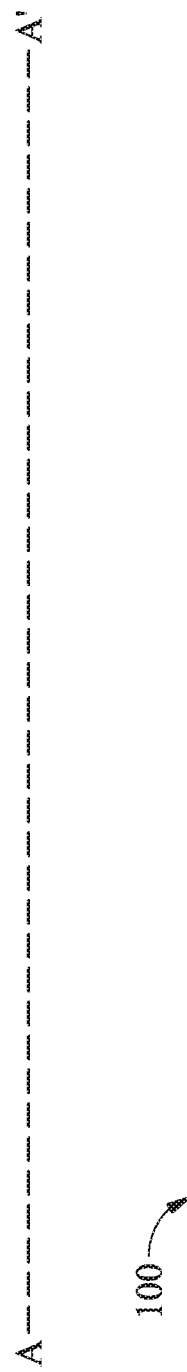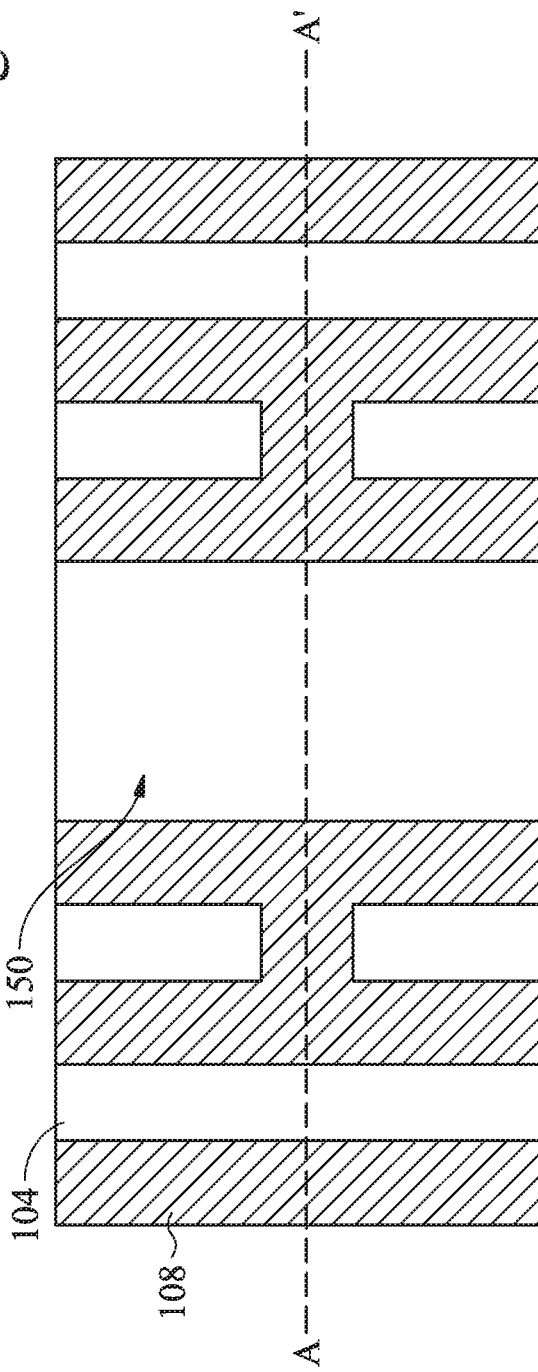
Figure 21A
Figure 21B

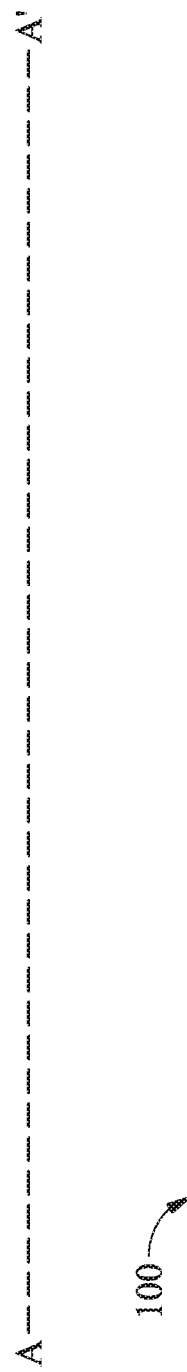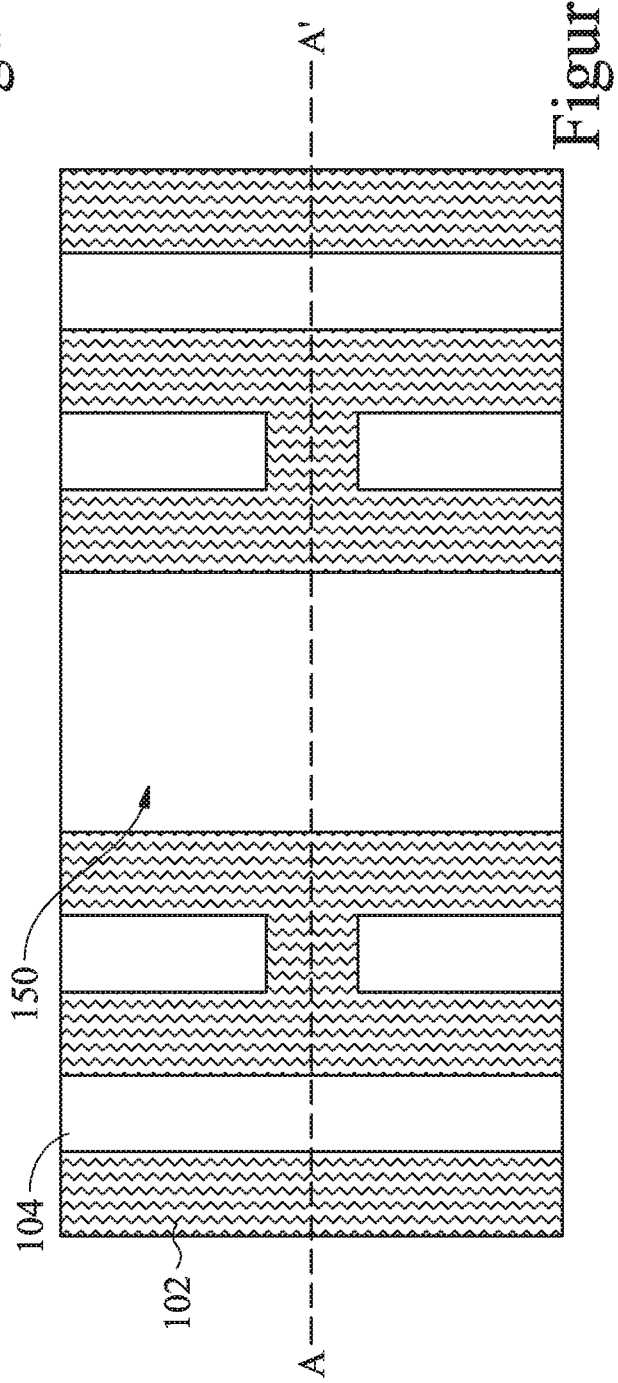

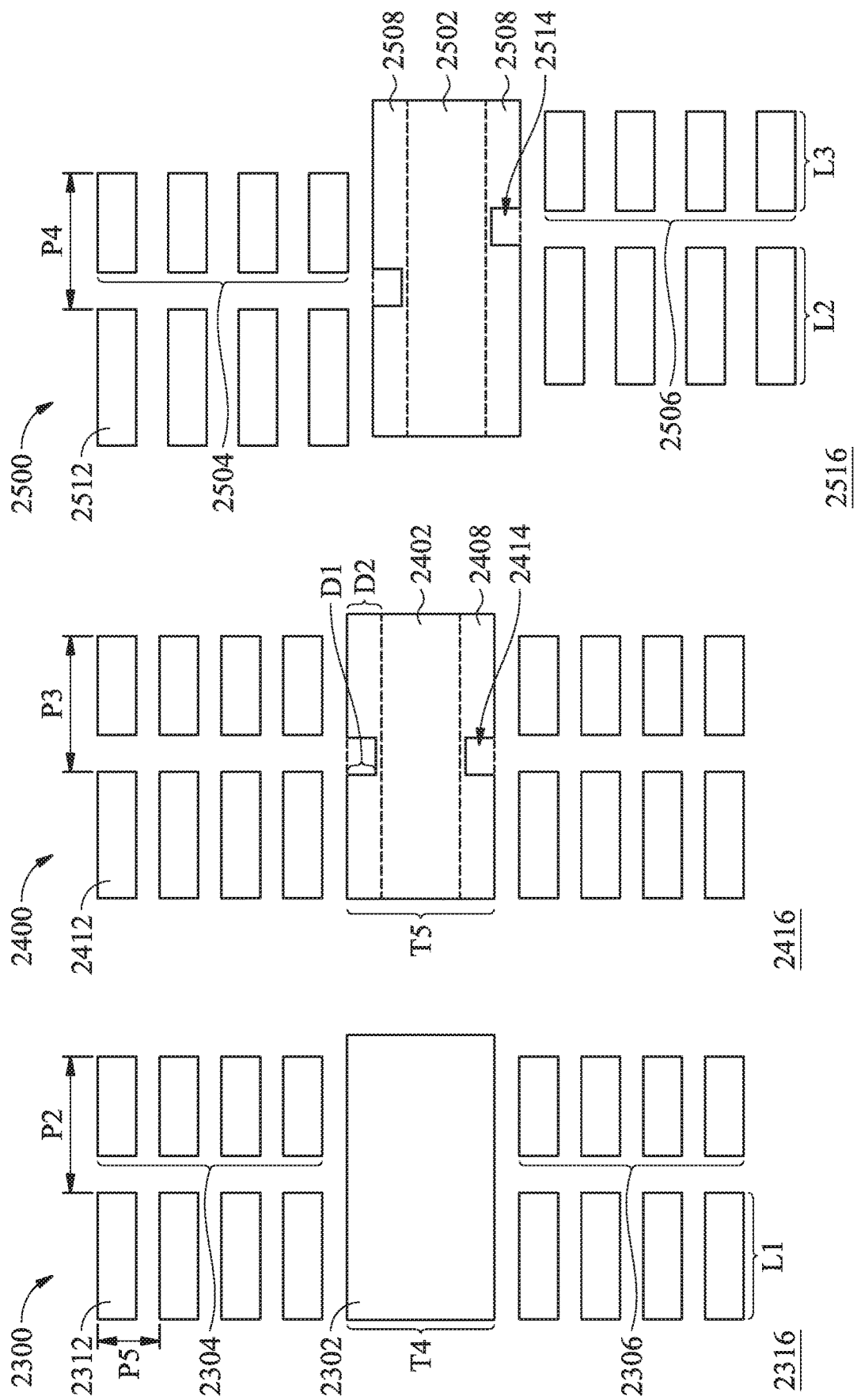

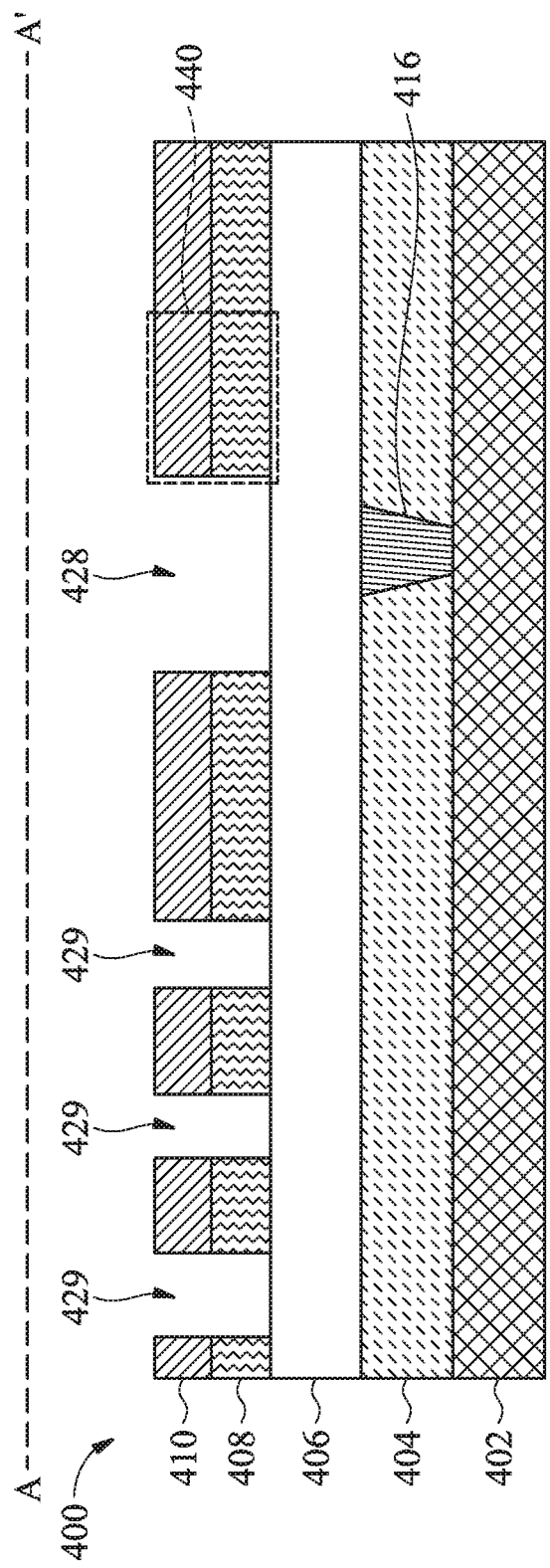
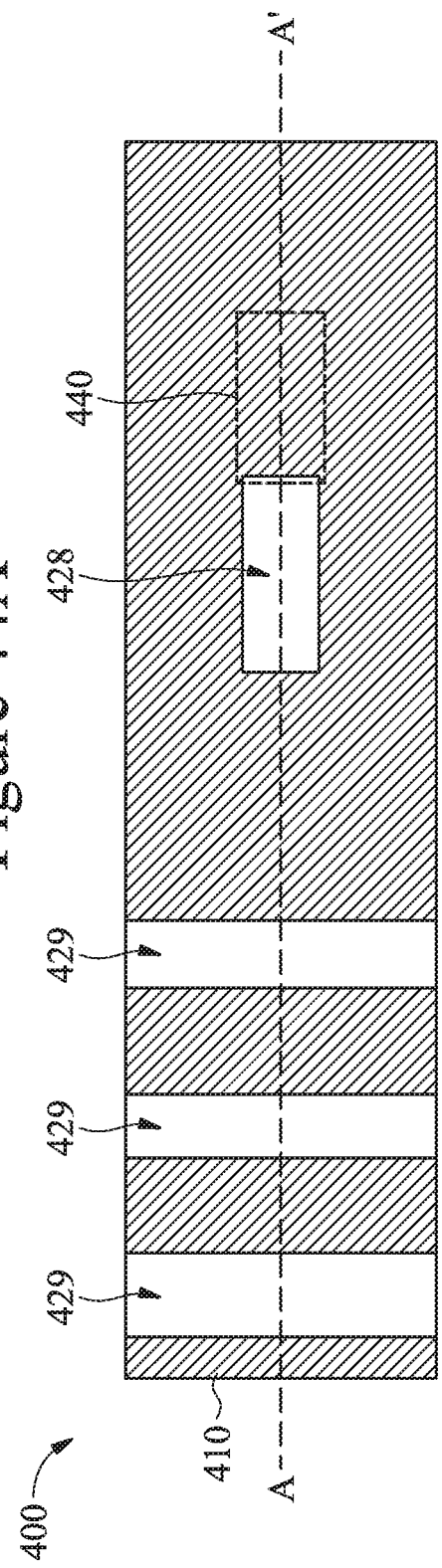

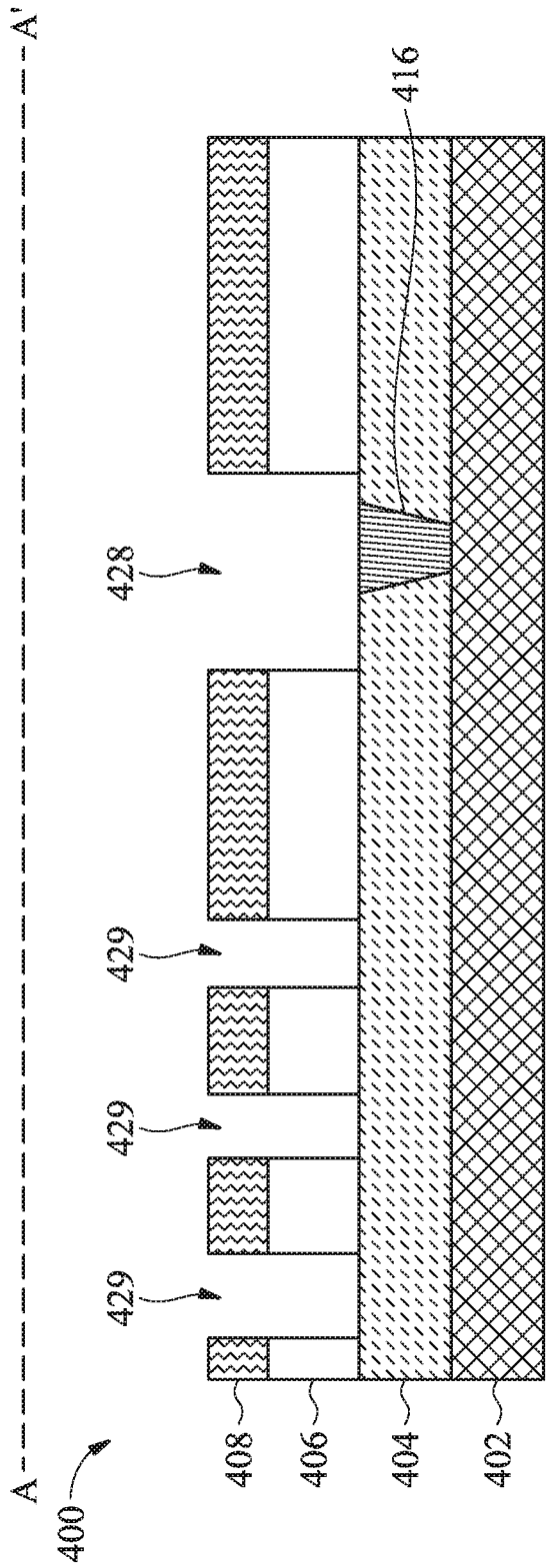
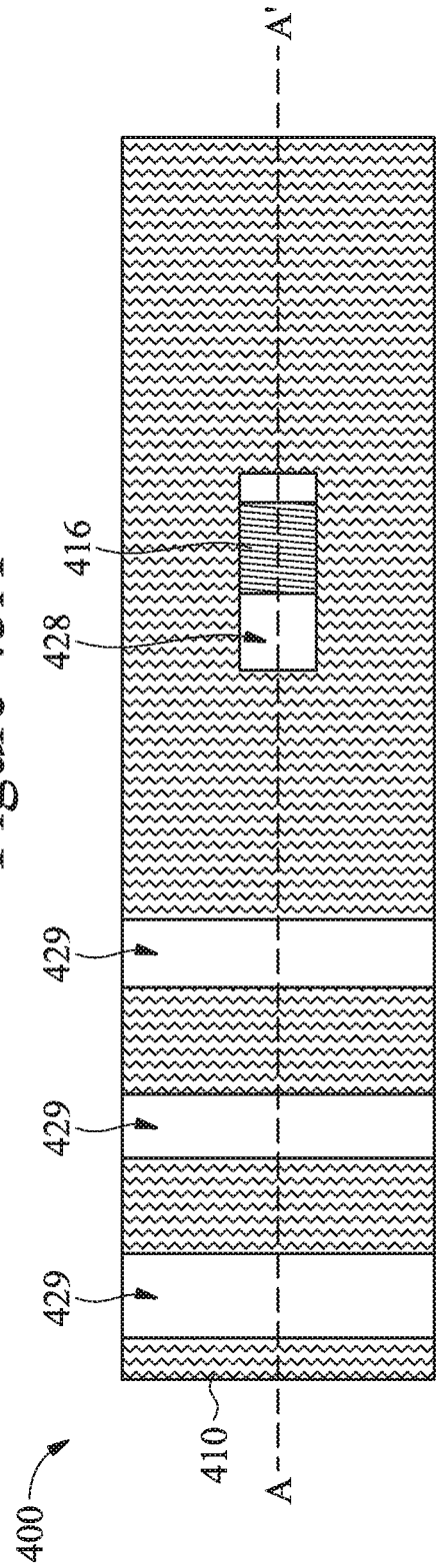
Figure 45A
Figure 45B

PATTERNING METHODS FOR SEMICONDUCTOR DEVICES AND STRUCTURES RESULTING THEREFROM

PRIORITY CLAIM AND CROSS-REFERENCE

This application claims priority to U.S. Provisional Patent Application No. 62/586,438, entitled "Patterning Methods for Semiconductor Devices and Structures Resulting Therefrom," filed on Nov. 15, 2017, which application is hereby incorporated herein by reference.

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. However, as semiconductor processes have increasingly smaller process windows, the manufacture of these devices have approached and even surpassed the theoretical limits of photolithography equipment. As semiconductor devices continue to shrink, the spacing desired between elements (i.e., the pitch) of a device is less than the pitch that can be manufactured using traditional optical masks and photolithography equipment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12A, 12B, 13A, 13B, 14A, 14B, 15A, 15B, 16A, 16B, 17A, 17B, 18A, 18B, 19A, 19B, 20A, 20B, 21A, 21B, 22A, and 22B, illustrate cross-sectional and plan views of various intermediary stages of manufacturing a semiconductor device in accordance with some embodiments.

FIGS. 27, 28, 29, and 30 illustrate plan views of semiconductor devices in accordance with some embodiments.

FIGS. 44A, 44B, 45A, and 45B are cross-sectional and plan views of intermediary stages of manufacturing a semiconductor device in accordance with some embodiments.

DETAILED DESCRIPTION

Figure 1:
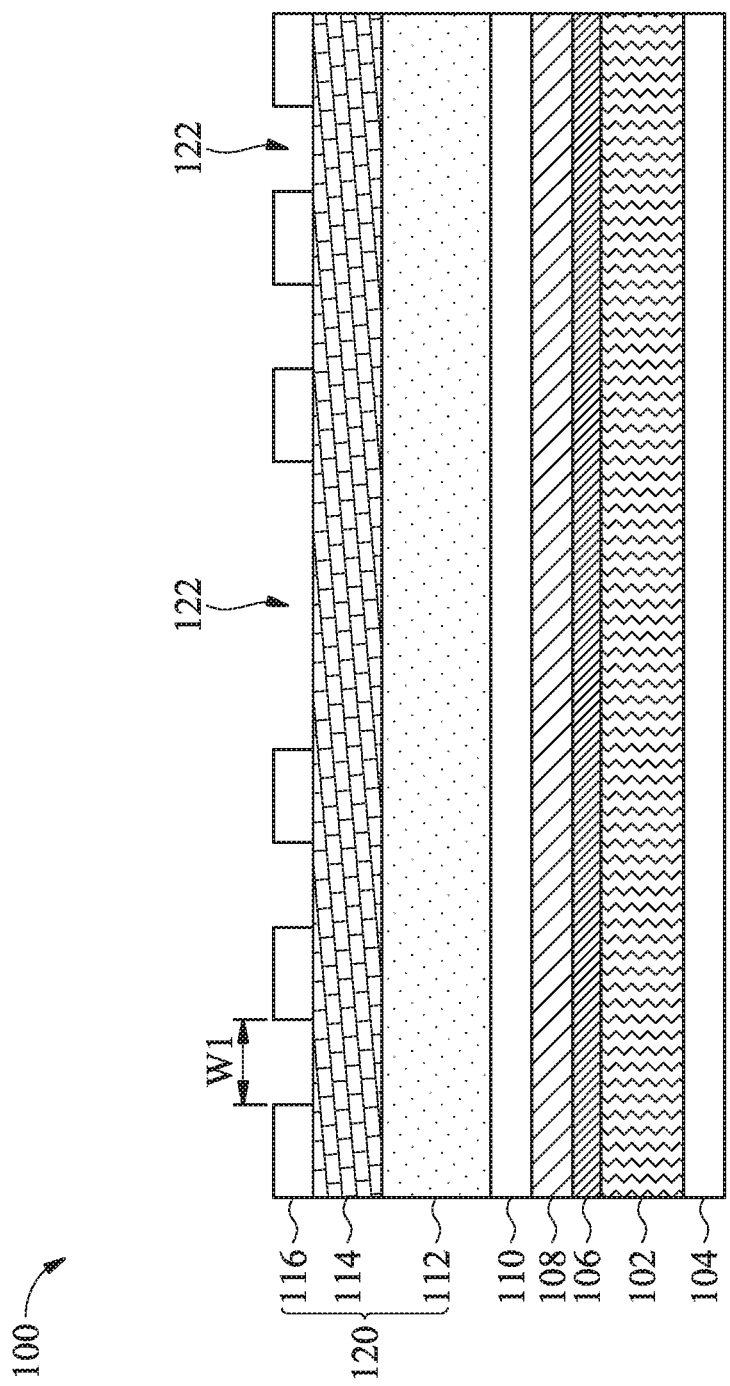
FIGS. 1, 2, 3, 4, 5, 6, 7, 8, 9, 10, and 11 illustrate cross-sectional views of various intermediary stages of manufacturing a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices and methods of forming semiconductor devices are provided in accordance with some embodiments. In some embodiments, a patterning process is performed to pattern lines in a target layer of a semiconductor device. A dielectric layer is patterned using photolithography to form spacers. A patterned sacrificial material (sometimes referred to as a reverse material) is formed over the spacers. The patterned sacrificial material may comprise an inorganic material, and is formed by patterning openings in a mask (the openings exposing selected areas of the patterned lines) and depositing the inorganic material in the openings using a suitable film deposition process, such as chemical vapor deposition (CVD), physical vapor deposition (PVD), atomic layer deposition (ALD), and the like. After the sacrificial material is formed, the sacrificial material is patterned by forming an opening in the sacrificial material. The spacers and the sacrificial material are used to pattern an underlying mask layer, which is in turn used to pattern a target layer. The underlying target layer may be a layer used for a variety of purposes. For example, the target layer may be a low-k dielectric layer, in which openings are patterned using the mask layer. Subsequently, conductive material(s) may be filled in the openings of the low-k dielectric layer to define interconnect lines, the interconnect lines having line cuts as defined by the patterned sacrificial material. The interconnect lines may have a fine pitch, and/or the one or more line cuts may have a fine pitch, and/or the interconnect lines and line cuts may be formed having fine pitches using a simplified patterning process. For example, the target layer can be patterned to form fine pitch interconnect lines having one or more line cuts using a single patterning process to pattern the target layer. Because the target layer is patterned in a single patterning process, and/or using a simplified process as described herein, increased accuracy of the pattern may be achieved and manufacturing costs may be decreased. For example, if target layer 102 were etched in two or more different processes, the pattern that is actually etched into the target layer 102 may differ from the desired pattern, for example due to difficulties in exactly aligning etch masks with desired portions to be etched. When the target layer 102 is etched using a single etch step, and/or a patterning process is simplified as described herein, increased accuracy is possible. As such, multiple interconnect lines having multiple line cuts may be formed to have the same dimensions or substantially the same dimensions, which allows for greater control of resistance of the interconnect lines. Additionally, due to the simplified processing, manufacturing costs may be decreased.

In some embodiments, the processes described herein may be used to form power rail and metal island structures having narrower power rails, metal islands having substantially similar dimensions, and/or groups of metal islands that are well aligned to other groups of metal islands. Due to the processes used to form the power rail and metal islands, kinks may be present in the formed power rail. Kinks may reduce reliability of contacts that are made to the power rail. To avoid the kinks, contacts to the power rail may be formed outside of a "contact free zone" in which kinks may be present at the edges of the power rail.

In some embodiments, interconnect lines may have one or more line cuts, which may refer to a physical separation between two adjacent portions of an interconnect line. Line cuts may be formed by physically removing a section of the interconnect line after the interconnect line is formed. Alternatively, the interconnect line may be formed in a manner that the line cut is present after the interconnect line is formed due to processes used to form the interconnect line. In some devices, multiple adjacent interconnect lines may have a line cut in a same location in a middle portion of the interconnect lines. The line cut may be made in a manner that an undesired portion of one or more of the interconnect lines remains after the line cut. For example, a line cut may be formed in a same location of a group of adjacent interconnect lines. An interconnect line of the group of adjacent interconnect lines may connect to a via that is located more than a minimum distance away from the line edge that is formed by the line cut, and the portion of the interconnect line between the line edge that is formed by the line cut and the via may not be necessary or desired in a particular design. An unnecessary or undesired interconnect line that is not removed from a semiconductor device may be disadvantageous, for example because the RC performance of the device may be degraded, and/or the space consumed by unnecessary line edges may undesirably increase the size or footprint of a semiconductor device. In some embodiments, line ends may be removed from a semiconductor device being formed, thereby improving the RC performance of the semiconductor device, and/or reducing the size or footprint required for the device.

FIGS. 1 through 25B illustrate cross-sectional views and/or plan views of intermediate stages in the formation of features in a target layer 102 on a semiconductor device 100, in accordance with some exemplary embodiments. The target layer 102 is a layer in which a pattern is to be formed in accordance with embodiments of the present disclosure. In some embodiments, semiconductor device 100 is processed as part of a larger wafer. In such embodiments, after various features of the semiconductor device 100 is formed (e.g., active devices, interconnect structures, and the like), a singulation process may be applied to scribe line regions between individual dies of the wafer in order to separate individual semiconductor dies from the wafer (also referred to as singulation).

In some embodiments, the target layer 102 is an inter-metal dielectric (IMD) layer. In such embodiments, the target layer 102 comprises a low-k dielectric material having a dielectric constant (k value) lower than 3.8, lower than about 3.0, or lower than about 2.5, for example. In alternative embodiments, target layer 102 is an IMD layer comprising high-k dielectric material having a k value higher than 3.8. Openings may be patterned in the target layer 102 with the embodiment processes, and conductive lines and/or vias may be formed in the openings as described below.

In some embodiments, the target layer 102 is a semiconductor substrate. The semiconductor substrate may be formed of a semiconductor material such as silicon, silicon germanium, or the like. In some embodiments, the semiconductor substrate is a crystalline semiconductor substrate such as a crystalline silicon substrate, a crystalline silicon carbon substrate, a crystalline silicon germanium substrate, a III-V compound semiconductor substrate, or the like. The semiconductor substrate may be patterned with an embodiment process, and subsequent process steps may be used to form shallow trench isolation (STI) regions in the substrate. Semiconductor fins may protrude from between the formed STI regions. Source/drain regions may be formed in the semiconductor fins, and gate dielectric and electrode layers may be formed over channels regions of the fins, thereby forming semiconductor devices such as fin field effect transistors (finFETs).

In some embodiments, the target layer 102 is a conductive layer, such as, a metal layer or a polysilicon layer, which is blanket deposited. Embodiment patterning processes may be applied to the target layer 102 in order to pattern semiconductor gates and/or dummy gates of finFETS. By using embodiment processes to pattern a conductive target layer 102, spacing between adjacent gates may be reduced and gate density may be increased.

In FIG. 1, a film stack including the target layer 102 is formed in semiconductor device 100. In some embodiments, the target layer 102 may be formed over a semiconductor substrate 104. The semiconductor substrate 104 may be formed of a semiconductor material such as silicon, doped or undoped, or an active layer of a semiconductor-on-insulator (SOI) substrate. The semiconductor substrate 104 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not illustrated), such as transistors, diodes, capacitors, resistors, etc., may be formed in and/or on an active surface of semiconductor substrate 104. In other embodiments where the target layer 102 is a semiconductor substrate used to form finFETs, the semiconductor substrate 104 may be omitted.

Although FIG. 1 illustrates target layer 102 being in physical contact with semiconductor substrate 104, any number of intervening layers may be disposed between target layer 102 and semiconductor substrate 104. Such intervening layers may include an inter-layer dielectric (ILD) layer comprising a low-k dielectric and having contact plugs formed therein, other IMD layers having conductive lines and/or vias formed therein, one or more intermediary layers (e.g., etch stop layers, adhesion layers, etc.), combinations thereof, and the like. For example, an optional etch stop layer (not illustrated) may be disposed directly under the target layer 102. The etch stop layer may act as a stop for an etching process subsequently performed on the target layer 102. The material and process(es) used to form the etch stop layer may depend on the material of the target layer 102. In some embodiments, the etch stop layer may be formed of silicon nitride, SiON, SiCON, SiC, SiOC, $SiC_xN_y$, $SiO_x$, other dielectrics, combinations thereof, or the like, and may be formed by plasma enhanced chemical vapor deposition (PECVD), low pressure CVD (LPCVD), physical vapor deposition (PVD), or the like. Other materials and processes may be used.

The film stack further includes an anti-reflective coating (ARC) 106 formed over the target layer 102. The ARC 106 aids in the exposure and focus of overlying photoresist layers (discussed below) during patterning of the photoresist layers. In some embodiments, the ARC 106 may be formed from SiON, silicon carbide, materials doped with oxygen (O) and nitrogen (N), or the like. In some embodiments, the ARC 106 is substantially free from nitrogen, and may be formed from an oxide. In such embodiments, the ARC 106 may be also referred to as a nitrogen-free ARC (NFARC). A material composition of ARC 106 may be selected to prevent reflection in some embodiments. The ARC 106 may be formed by Plasma Enhance Chemical Vapor Deposition (PECVD), High-Density Plasma (HDP) deposition, or the like. Other processes and materials may be used.

The film stack further includes a hard mask layer 108 formed over the ARC 106 and the target layer 102. The hard mask layer 108 may be formed of a material that comprises a metal (e.g., titanium nitride, titanium, tantalum nitride, tantalum, a metal-doped carbide (e.g., tungsten carbide), or the like) and/or a metalloid (e.g., silicon nitride, boron nitride, silicon carbide, or the like). In some embodiments, a material composition of hard mask layer 108 may be determined to provide a high etch selectivity, for example with respect to ARC 106 and/or target layer 102. Hard mask layer 108 may be formed by PVD, Radio Frequency PVD (RFPVD), Atomic Layer Deposition (ALD), or the like. Other processes and materials may be used. In subsequent processing steps, a pattern is formed on the hard mask layer 108 using an embodiment patterning process. The hard mask layer 108 is then used as an etching mask for etching the target layer 102, where the pattern of the hard mask layer 108 is transferred to the target layer 102.

The film stack further includes a dielectric layer 110 formed over the hard mask layer 108 in some embodiments. In subsequent processing dielectric layer 110 may be used to form a plurality of spacers that will be used to pattern a target layer (see FIGS. 18A-B and 19A-B). The dielectric layer 110 may be formed from a silicon oxide, such as borophosphosilicate tetraethylorthosilicate (BPTEOS) or undoped tetraethylorthosilicate (TEOS) oxide, and may be formed by CVD, ALD, spin-on coating, or the like. Other processes and materials may be used.

A tri-layer masking layer 120 is formed on the film stack over the dielectric layer 110. The tri-layer masking layer 120 includes a bottom layer 112, a middle layer 114 over the bottom layer 112, and an upper layer 116 over the middle layer 114. The upper layer 116 may be formed of a photoresist (e.g., a photosensitive material), which includes organic materials, and may be a positive photosensitive material or a negative photosensitive material. The bottom layer 112 may be formed of a polymer in some embodiments. The bottom layer 112 may also be a bottom anti-reflective coating (BARC) layer or an ashing removal dielectric (ARD) layer (such as amorphous carbon). The middle layer 114 may comprise an inorganic material, which may be a nitride (such as silicon nitride), an oxynitride (such as silicon oxynitride), an oxide (such as silicon oxide), or the like. The middle layer 114 may have a high etching selectivity relative to the upper layer 116 and the bottom layer 112. The various layers of the tri-layer masking layer 120 may be blanket deposited sequentially using, for example, spin-on processes. Other processes and materials may be used. Although a tri-layer masking layer 120 is discussed herein, in other embodiments, the tri-layer masking layer 120 may actually be a monolayer masking layer or a bilayer masking layer (e.g., comprising only the bottom layer 112 and the upper layer 116 without the middle layer 114). The type of masking layer used (e.g., monolayer masking layer, bilayer masking layer, or tri-layer masking layer) may depend on the photolithography process used to pattern the dielectric layer 110. For example, in extreme ultraviolet (EUV) lithography processes, a monolayer masking layer or bilayer masking layer may be used.

In some embodiments, the upper layer 116 is patterned using a photolithographic process. Subsequently, the upper layer 116 is used as an etching mask for patterning of the middle layer 114 (see FIG. 2). The middle layer 114 is then used as an etching mask for patterning of the bottom layer 112, and the bottom layer 112 is then used to pattern the dielectric layer 110 (see FIG. 3). It has been observed that by using a tri-layer photoresist (e.g., tri-layer photoresist 120) to etch a target layer (e.g., dielectric layer 110), improved definition in fine-pitched patterns can be achieved in the target layer (e.g., dielectric layer 110).

The upper layer 116 is patterned using any suitable photolithography process to form openings 122 therein. As an example of patterning openings 122 in the upper layer 116, a photomask (not shown) may be disposed over the upper layer 116. The upper layer 116 may then be exposed to a radiation beam including an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser, or the like while the photomask masks areas of the upper layer 116. Exposure of the top photoresist layer may be performed using an immersion lithography system or an extreme ultraviolet lithography system to increase resolution and decrease the minimum achievable pitch. One or multiple exposure steps may be performed. A bake or cure operation may be performed to harden the upper layer 116, and a developer may be used to remove either the exposed or unexposed portions of the upper layer 116 depending on whether a positive or negative resist is used. The openings 122 may have strip shapes in a plan view (not illustrated). A minimum width W1 of the openings 122 may be about 19 nm. Other widths of the openings 122 are also contemplated.

Figure 2:
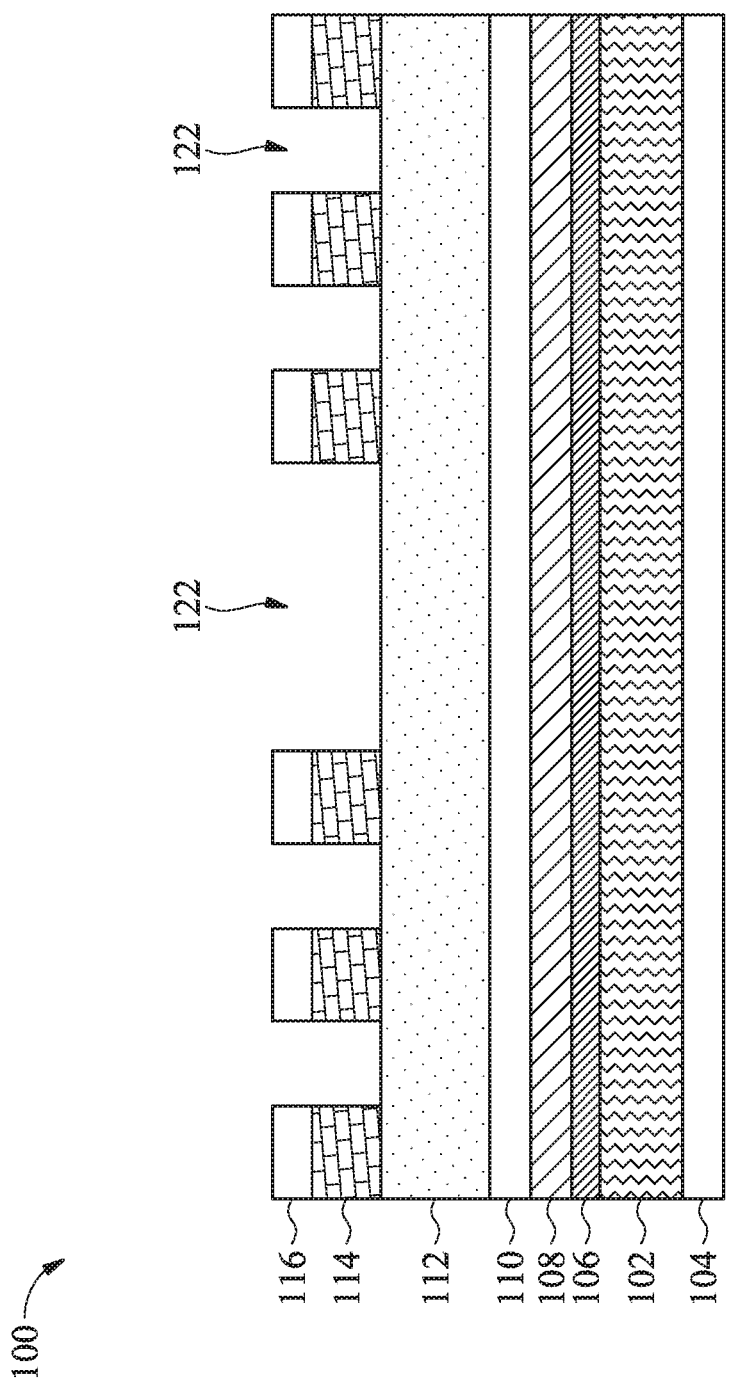

Referring to FIG. 2, after the patterning of the upper layer 116, the pattern of the upper layer 116 is transferred to the middle layer 114 in an etching process. The etching process is anisotropic, so that the openings 122 in the upper layer 116 are extended through the middle layer 114 and have about the same sizes (or are slightly smaller) in the middle layer 114 as they do in the upper layer 116. The resulting structure is illustrated in FIG. 2.

Figure 3:
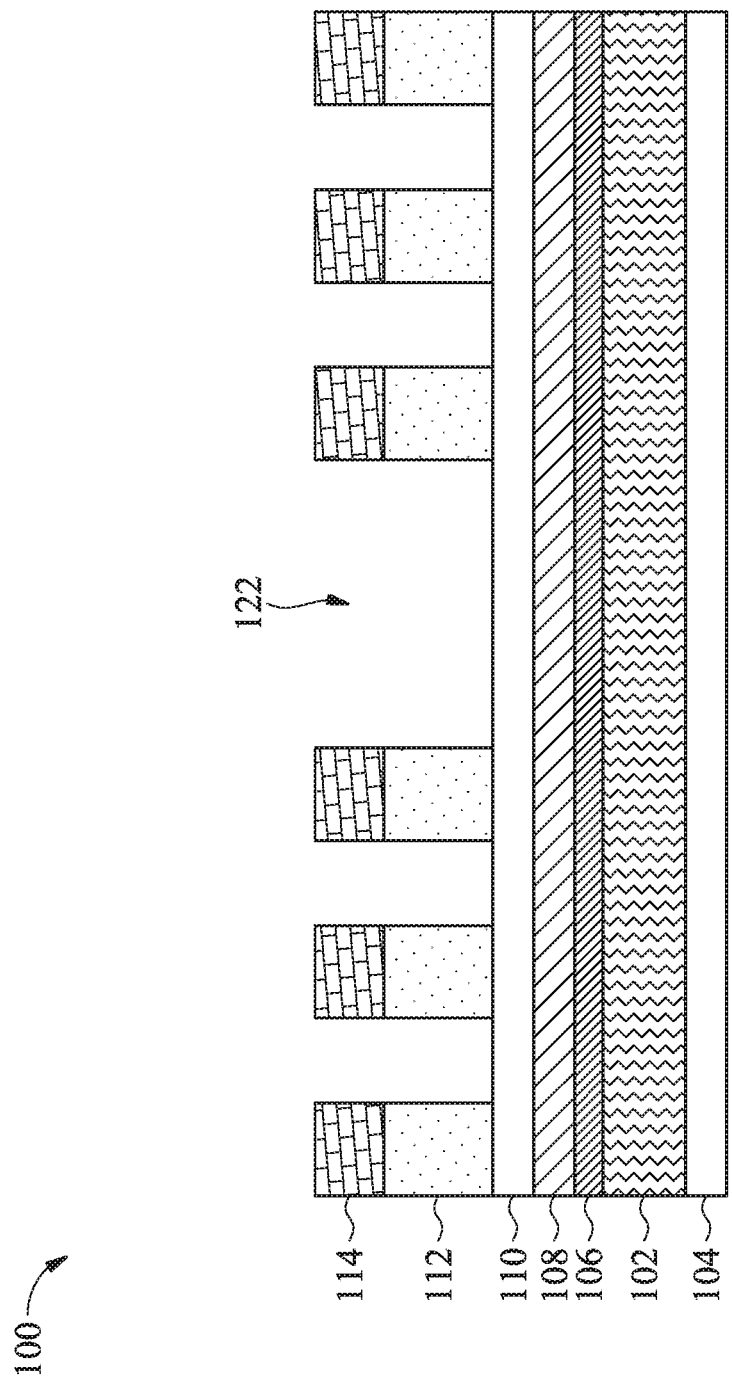

As shown in FIG. 3, an etching process may be performed to transfer the pattern of the middle layer 114 to the bottom layer 112, thereby extending the openings 122 through the bottom layer 112. The etching process of the bottom layer 112 is anisotropic, so that the openings 122 in the middle layer 114 are extended through the bottom layer 112 and have about the same sizes (or are slightly smaller) in the bottom layer 112 as they do in the middle layer 114. As part of etching the bottom layer 112, the upper layer 116 may be consumed.

Figure 4:
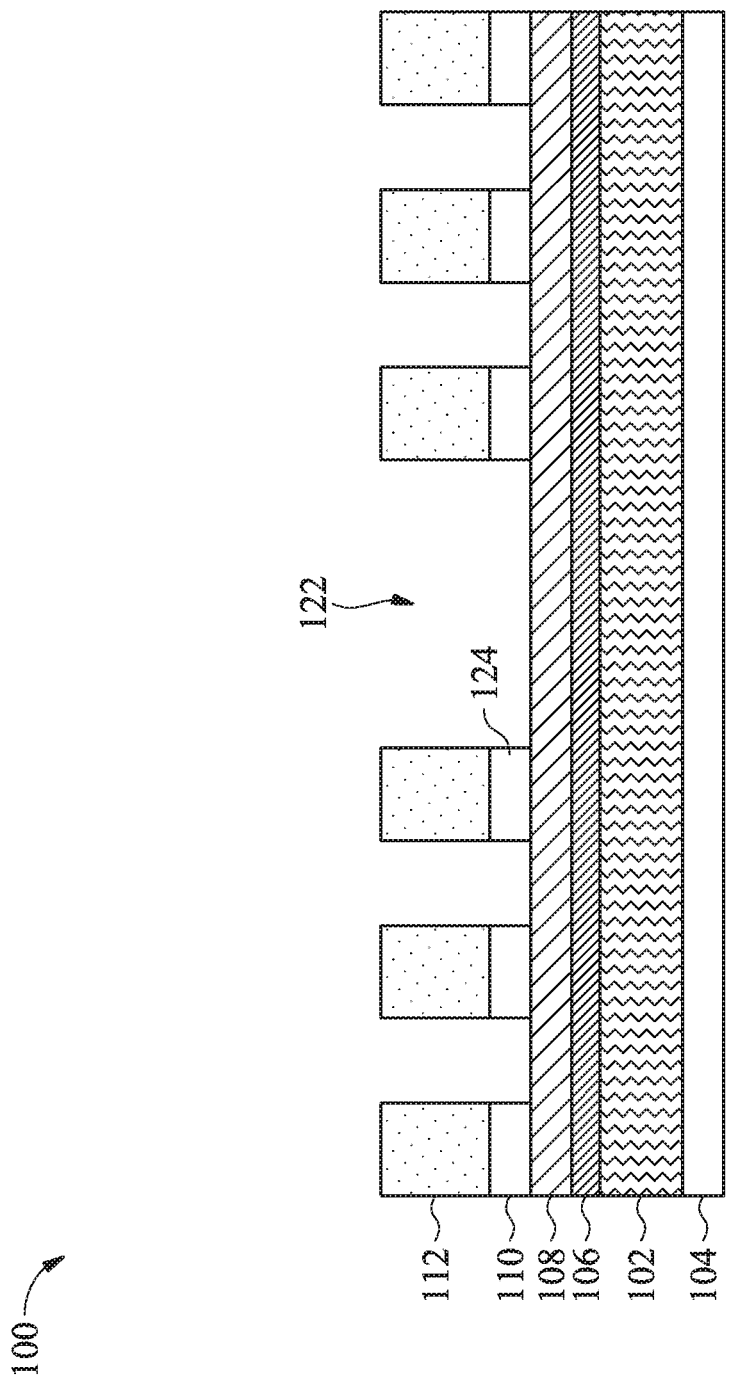
Figure 5:
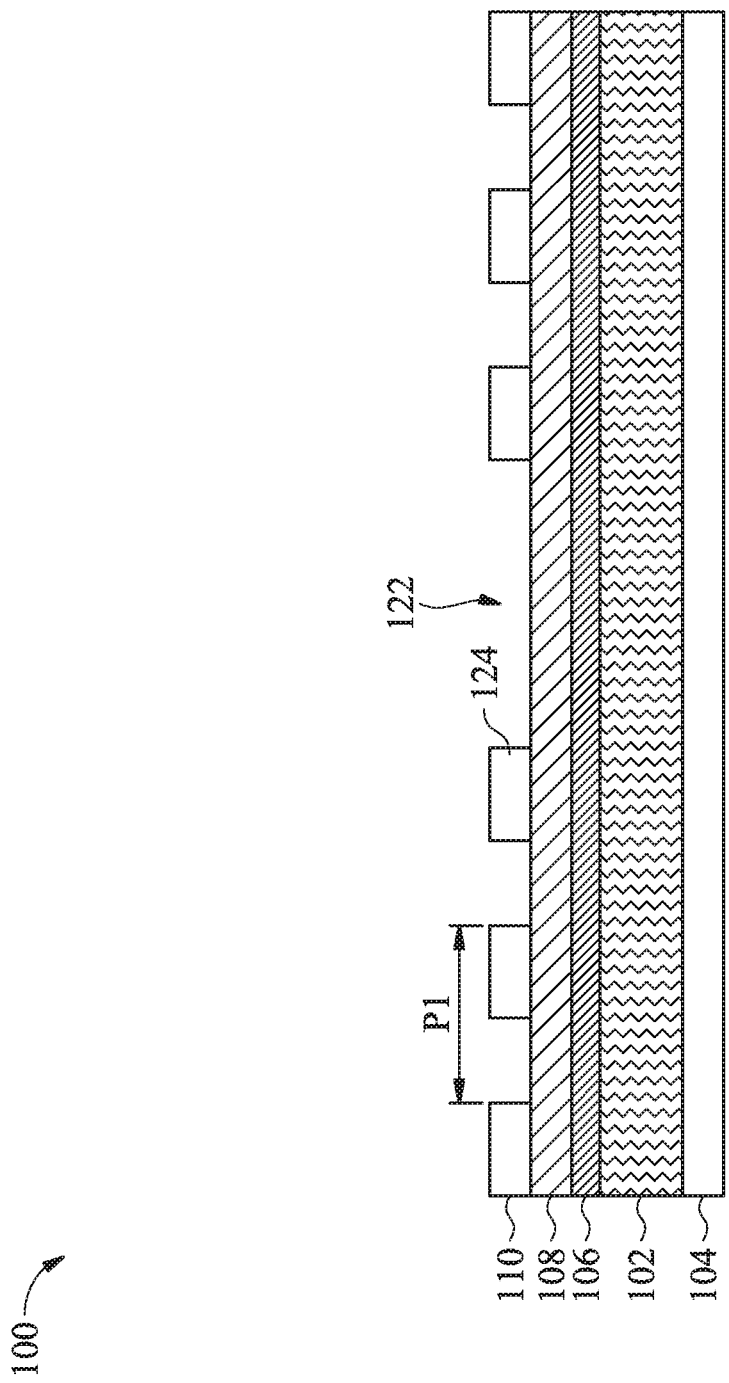

In FIG. 4, the pattern of the bottom layer 112 is transferred to the dielectric layer 110 using an etching process. The etching process is anisotropic, so that the openings 122 in the bottom layer 112 are extended through the dielectric layer 110 and have about the same sizes (or are slightly smaller) in the dielectric layer 110 as they do in the bottom layer 112. Thus, spacers 124 are defined from remaining portions of the dielectric layer 110 (e.g., portions of dielectric layer 110 between openings 122). During the etching of the dielectric layer 110, the middle layer 114 is consumed, and bottom layer 112 may be at least partially consumed. In embodiments when the bottom layer 112 is not completely consumed while etching the dielectric layer 110, an ashing process may be performed to remove remaining residue of the bottom layer 112. The remaining structure is depicted in FIG. 5. In a plan view, gaps between spacers 124 define regions in which conductive lines will be formed in target layer 102. Spacers 124 may have a line pitch P1 that is greater than or equal to 30 nm.

Figure 6:
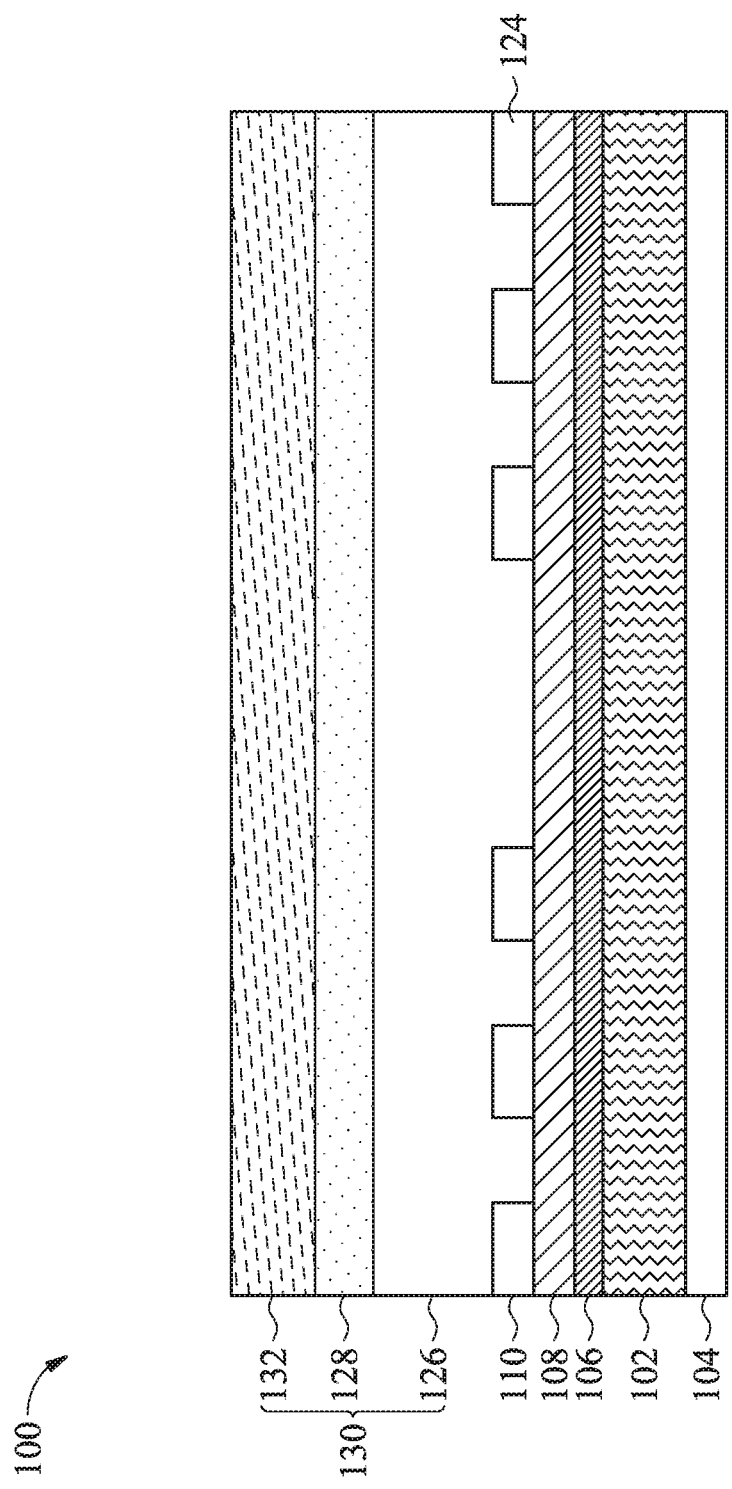

In FIG. 6, masking layer 130 is formed over the patterned dielectric layer 110. Masking layer 130 may include a bottom layer 126, a middle layer 128, and an upper layer 132. The upper layer 132 may be formed of a photoresist (e.g., a photosensitive material), which include organic materials. The upper layer 132 may be a positive photosensitive material or a negative photosensitive material. In some embodiments, the bottom layer 126 may be a polymer, a bottom anti-reflective coating (BARC) layer, or an ashing removal dielectric (ARD) layer, or the like. The middle layer 128 may comprise an inorganic material, which may be a nitride (such as silicon nitride), an oxynitride (such as silicon oxynitride), an oxide (such as silicon oxide), or the like. The middle layer 128 may have a high etching selectivity relative to the upper layer 132 and the bottom layer 126. The various layers of the masking layer 130 may be blanket deposited sequentially using, for example, spin-on processes. Other processes and materials may be used. Although a tri-layer masking layer 130 is discussed herein, in other embodiments, the masking layer 130 may be a monolayer masking layer or a bilayer masking layer (e.g., comprising only the bottom layer 126 and the upper layer 132 without the middle layer 128).

Figure 7:
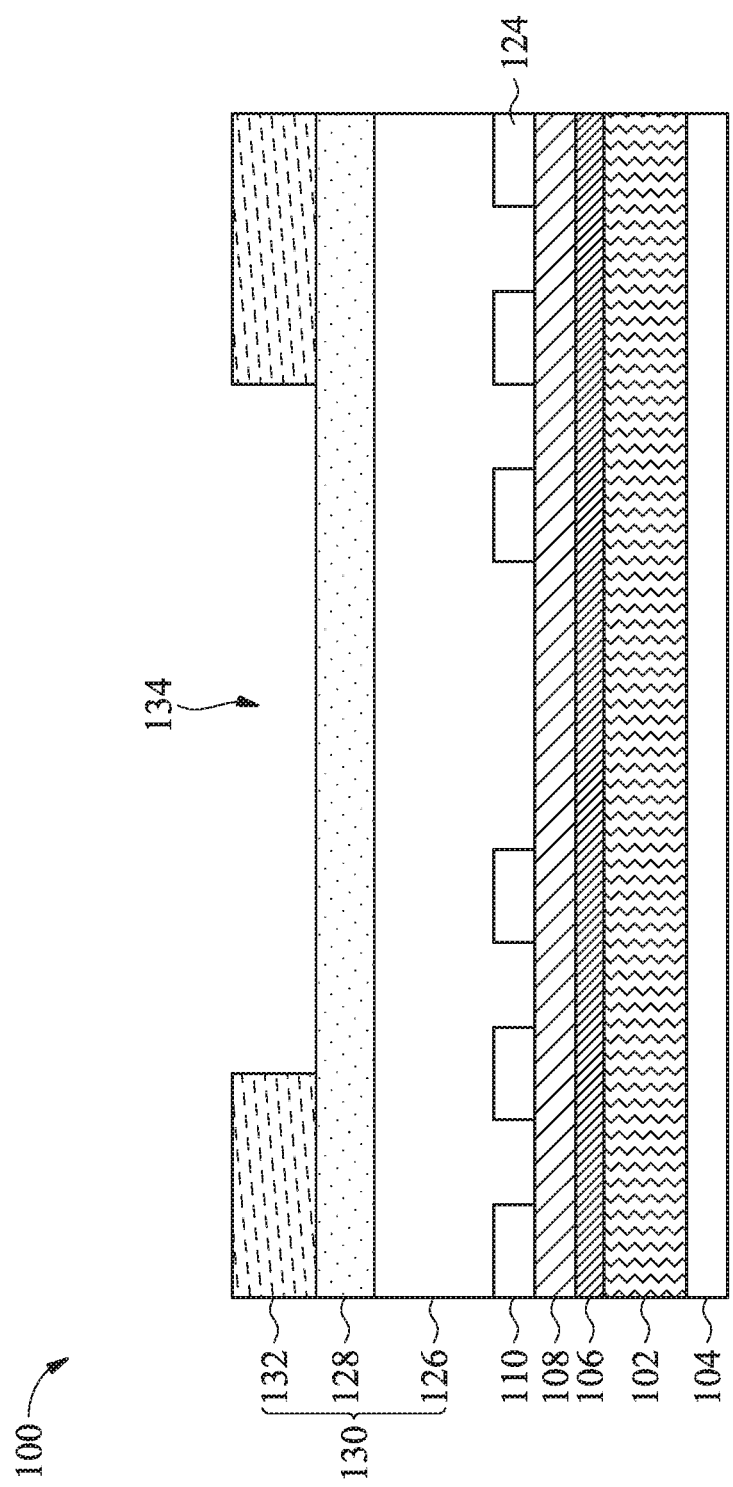

In FIG. 7, the upper layer 132 is patterned using a photolithographic process to form opening 134. Subsequently, the upper layer 132 is used as an etching mask for patterning of the middle layer 128 (see FIG. 7). The middle layer 128 is then used as an etching mask for patterning of the bottom layer 126, and the bottom layer 126 is then used to define a perimeter of a sacrificial material that is subsequently formed (see FIGS. 10-11).

Referring to FIG. 7, the upper layer 132 is patterned using any suitable photolithography process to form an opening 134 therein. As an example of patterning opening 134 in the upper layer 132, a photomask (not shown) may be disposed over the upper layer 132. The upper layer 132 may then be exposed to a radiation beam including an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser, or the like while the photomask masks areas of the upper layer 132. Exposure of the top photoresist layer may be performed using an immersion lithography system or an extreme ultraviolet lithography system to increase resolution and decrease the minimum achievable pitch. A single exposure step or multiple exposure steps may be performed. A bake or cure operation may be performed to harden the upper layer 132, and a developer may be used to remove either the exposed or unexposed portions of the upper layer 132 depending on whether a positive or negative resist is used.

Figure 8:
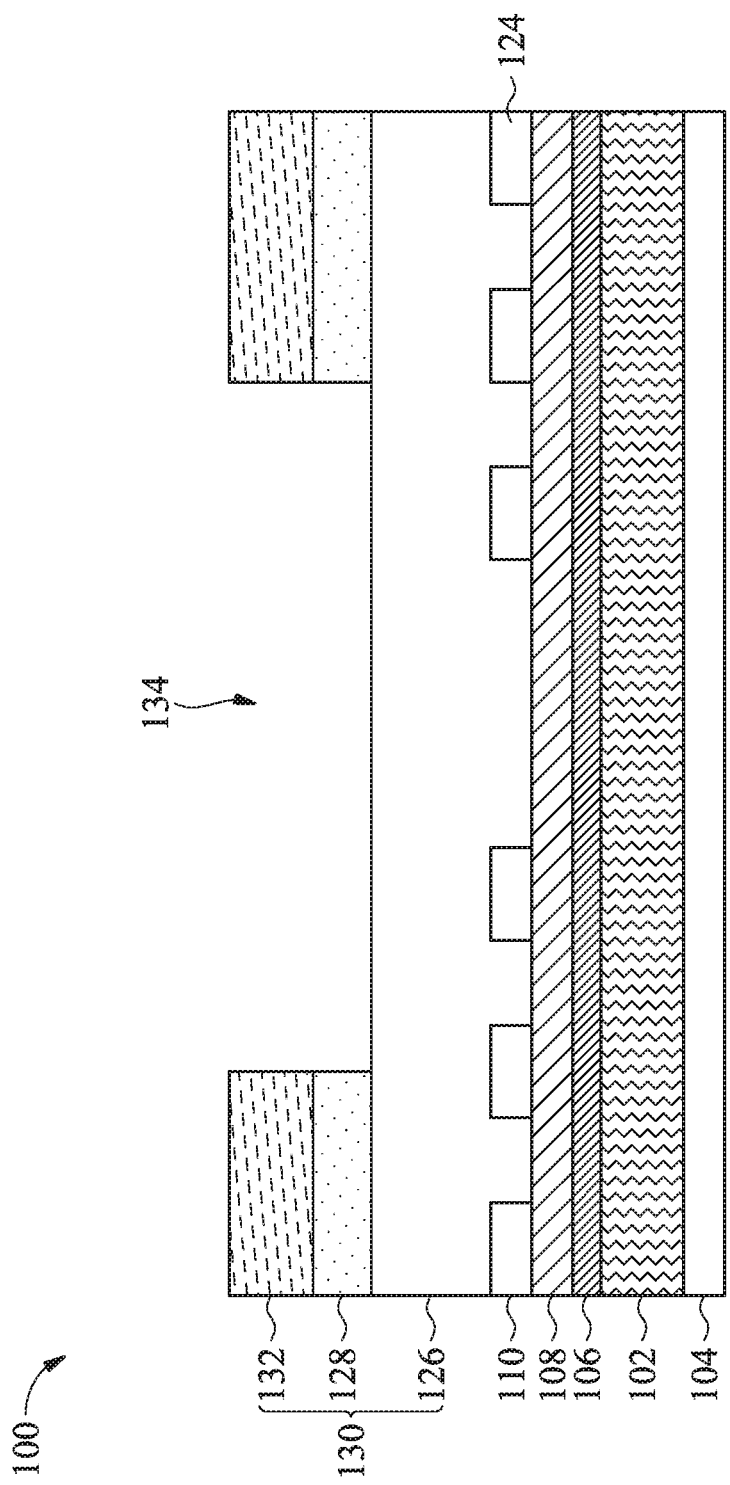

Referring to FIG. 8, after the patterning of the upper layer 132, the pattern of the upper layer 132 is transferred to the middle layer 128 in an etching process. The etching process is anisotropic, so that the opening 134 in the upper layer 132 is extended through the middle layer 128 and has about the same size (or is slightly smaller) in the middle layer 128 as it has in the upper layer 132. The resulting structure is illustrated in FIG. 8.

Figure 9:
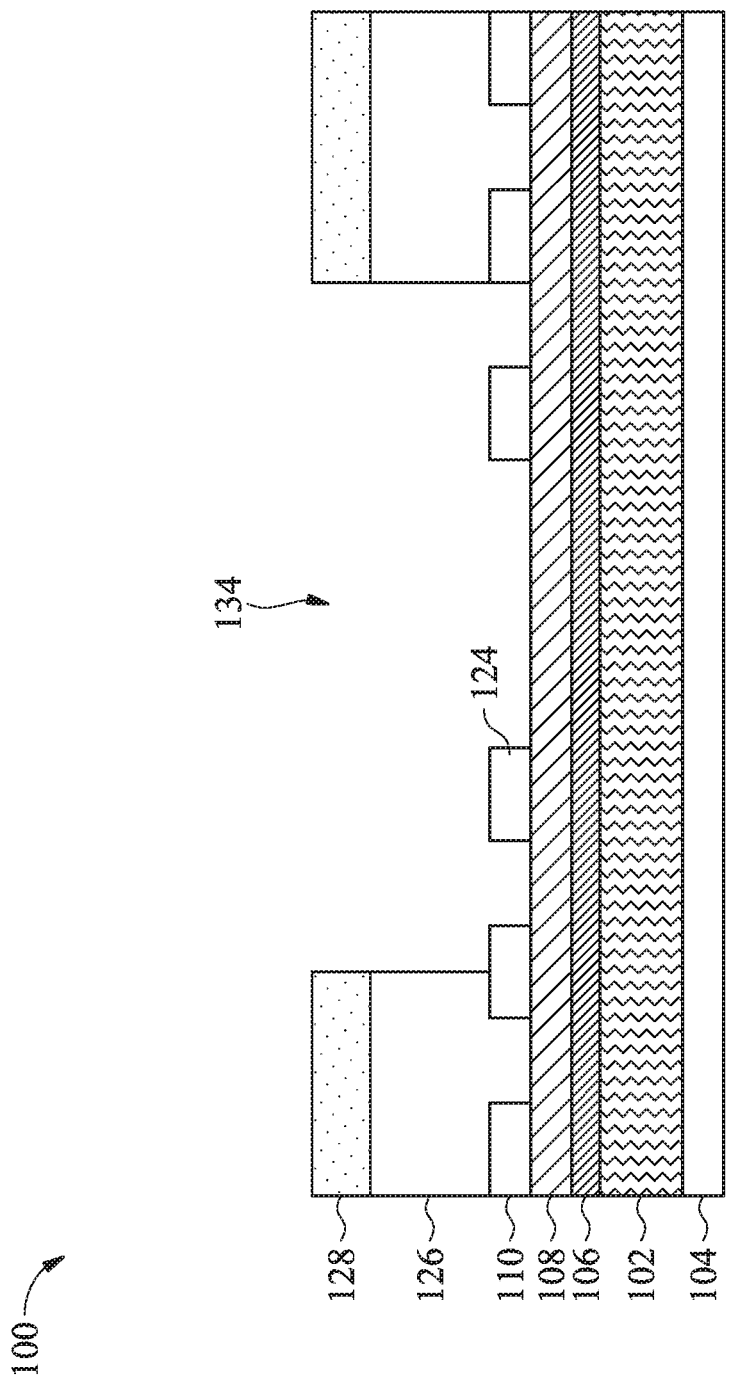

As shown in FIG. 9, an etching process may be performed to transfer the pattern of the middle layer 128 to the bottom layer 126, thereby extending the opening 134 through the bottom layer 126. The etching process of the bottom layer 126 is anisotropic, so that the opening 134 in the middle layer 128 is extended through the bottom layer 126 and has about the same size (or is slightly smaller) in the bottom layer 126 as it has in the middle layer 128. As part of etching the bottom layer 126, the upper layer 132 may be consumed. After the patterning of the bottom layer 126, the opening 134 may expose one or more spacers 124 formed of the remaining dielectric layer 110. The opening 134 may also expose sections of the hard mask layer 108 that extend between adjacent spacers 124.

Figure 10:
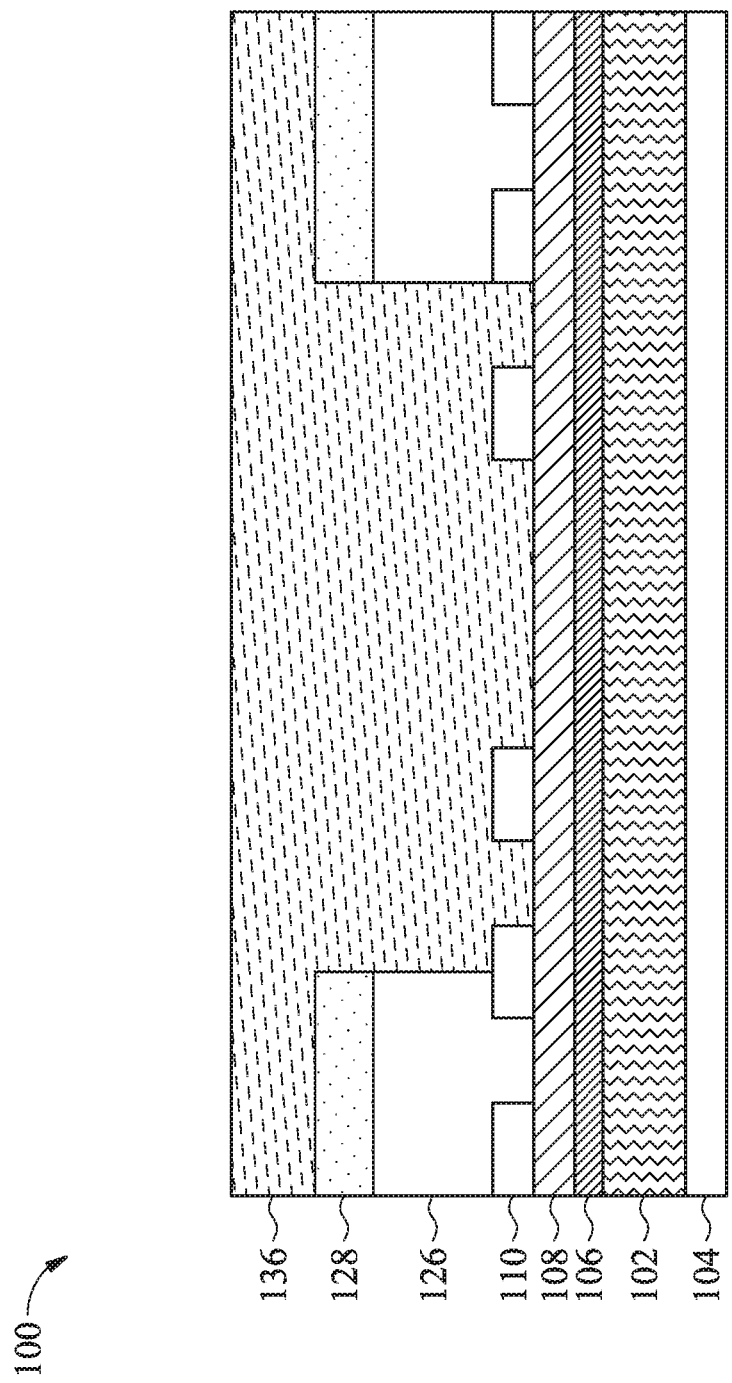

In FIG. 10, a sacrificial material 136 is formed in opening 134. As will be described in greater detail below, in subsequent processing the sacrificial material 136 will be further patterned, and the patterned sacrificial material may be used to define a line cut between two adjacent conductive lines that will be formed in the target layer 102. Although FIG. 10 depicts the forming of sacrificial material in a single opening 134, in some embodiments more that one opening 134 may be present and sacrificial material may be formed in the more than one opening 134 (for example to form additional line cuts). In some embodiments, the sacrificial material 136 may be deposited in the opening 134 over the spacers 124 and over exposed portions of the hard mask layer 108. The sacrificial material may be formed along sidewalls and along a top surface of the middle layer 128 (or a top surface of the bottom layer 126 in a case that the middle layer 128 has been removed).

In various embodiments, the sacrificial material 136 comprises an inorganic material. For example, the sacrificial material 136 may be an inorganic oxide, such as, titanium oxide, tantalum oxide, silicon oxide, and the like. Other materials may be used, such as silicon nitride, silicon carbide, a metal nitride, a metal oxide, or the like. Sacrificial material 136 may be selected, at least in part, in consideration of an etching selectivity between the material of the sacrificial material 136 and the material that is used to form the hard mask layer 108, the middle layer 128 and/or the bottom layer 126. In some embodiments, the inorganic material is a low temperature oxide (LTO). As used herein, the term "LTO" refers to an oxide deposited using a relatively low process temperature (e.g., 200° C. or less). It has been observed that in such embodiments, the low temperature deposition process does not cause significant damage to the bottom layer 126. Other materials may be used.

The sacrificial material 136 may be formed using a semiconductor film deposition process, such as, CVD, PVD, ALD, a spin process, or the like. Other processes may be used. The semiconductor film deposition process may be a conformal process, which forms on sidewalls and a bottom surface of opening 134. As deposition continues, portions of the sacrificial material 136 on opposing sidewalls of the opening 134 may merge, which fills the opening. As a result of the semiconductor film deposition process, a top surface of the sacrificial material 136 may not be planar.

Figure 11:
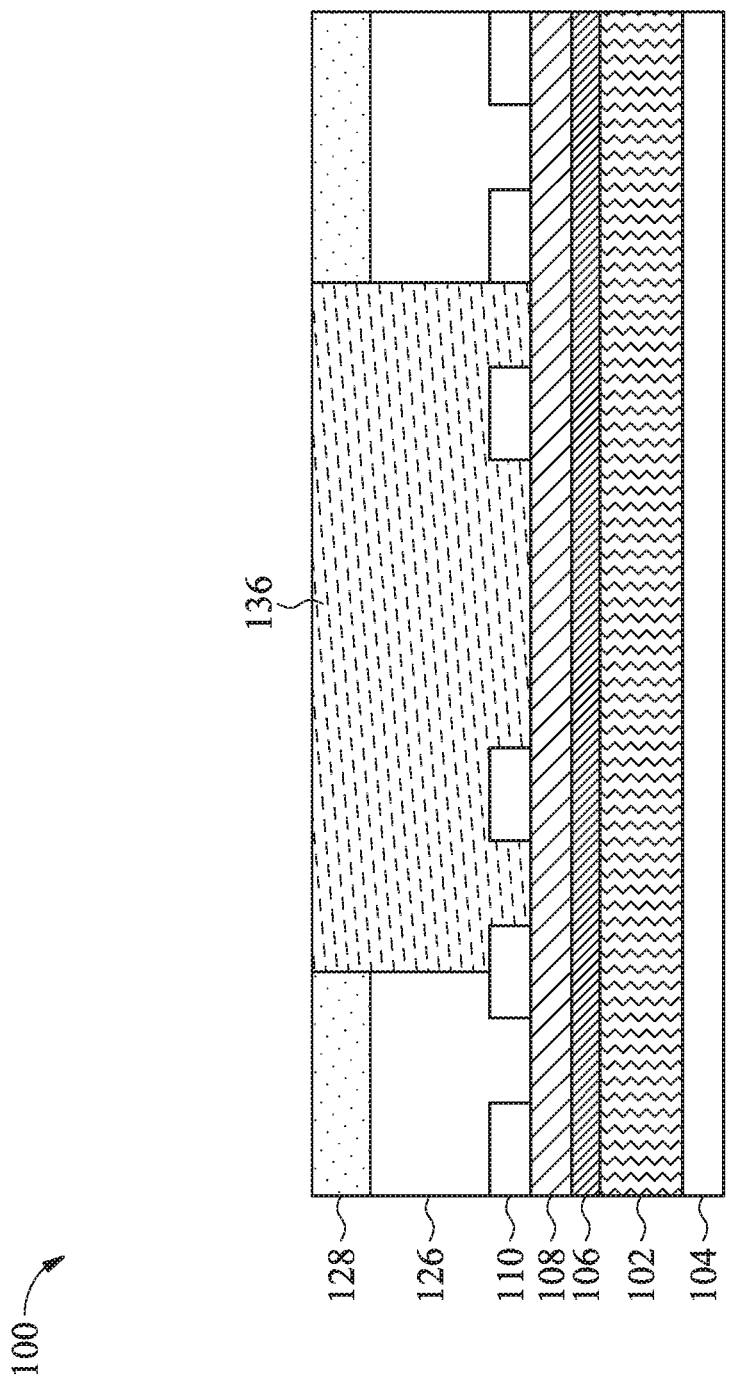

Next, in FIG. 11, a planarization process (e.g., a chemical mechanical polish (CMP), dry etching, combinations thereof, or the like) is performed to remove excess portions of the sacrificial material 136 outside of the opening 134. In some embodiments (not shown) the planarization process may continue until middle layer 128 and portions of sacrificial material adjacent to middle layer 128 are also removed.

Next, the middle layer 128 and the bottom layer 126 are removed using an ashing process. After the bottom layer 126 is removed, the sacrificial material 136 remains and covers a portion of the spacers 124 and the hard mask layer 108. Other spacers 124 and portions of the hard mask layer 108 are exposed by the removal of the bottom layer 126. The remaining structure is shown in FIG. 12A (in cross-sectional view) and FIG. 12B (in plan view). The cross-sectional view of FIG. 12A is along line A-A' shown in the plan view of FIG. 12B. As shown in FIG. 12B, in a plan view, the sacrificial material 136 forms a rectangle that has a major axis that extends in a direction that is substantially perpendicular to the direction of the spacers 124 in a plan view. As such, a line cut that is defined by the sacrificial material 136 is substantially perpendicular to conductive lines that are formed in recesses between adjacent spacers 124, which will result in a wider overlay process window.

As depicted in FIGS. 9 to 12A-B, a thickness of sacrificial material 136 may be determined at least in part on the basis of a thickness of bottom layer 126. For example, by decreasing the thickness of bottom layer 126, the thickness of the sacrificial material 136 is also decreased. As will be described below, in some embodiments if sacrificial material 136 has a thickness that is relatively thin it may be unnecessary to perform a subsequent planarization process. As such, manufacturing costs and time may be decreased.

In some embodiments, a length of the strip of sacrificial material 136 shown in FIGS. 12A and 12B may be extended, for example to extend the line cut to additional conductive lines. Although only one strip of sacrificial material 136 is shown in FIG. 12B, in some embodiments additional strips of sacrificial material 136 may be formed using the same or similar processes described above, for example to form additional line cuts. In some embodiments, multiple strips of sacrificial 136 may be formed, where each strip of sacrificial material 136 extends in a direction that is parallel to other strips of sacrificial material 136 and perpendicular to a direction in which the spacers 124 extend in a plan view.

Referring to FIGS. 13A-B, a masking layer 140 is formed over the spacers 124, the hard mask layer 108, and the sacrificial material 136. Masking layer 140 may include a bottom layer 142, a middle layer 144 and an upper layer 148. Although a trilayer masking layer 140 is shown, in some embodiments the masking layer 140 may be a monolayer masking layer or a bilayer masking layer as discussed above. The bottom layer 142 may completely cover the sacrificial material 136 in some embodiments, and may extend along exposed spacers 124 and the hard mask layer 108 as shown in FIG. 14A.

In some embodiments, the upper layer 148 may be formed of a photoresist (e.g., a photosensitive material), which include organic materials. Upper layer 148 may be formed of a positive photosensitive material or a negative photosensitive material. In some embodiments, the bottom layer 142 may be a polymer, a bottom anti-reflective coating (BARC) layer, and/or an ashing removal dielectric (ARD) layer, or the like. The middle layer 144 may comprise an inorganic material, which may be a nitride (such as silicon nitride), an oxynitride (such as silicon oxynitride), an oxide (such as silicon oxide), or the like. The middle layer 144 has a high etching selectivity relative to the upper layer 148 and the bottom layer 142. The various layers of the tri-layer masking layer 140 may be blanket deposited sequentially using, for example, spin-on processes. Other processes and materials may be used.

In FIGS. 14A-B, the upper layer 148 is patterned using a photolithographic process. Subsequently, the upper layer 148 is used as an etching mask for patterning of the middle layer 144 (see FIGS. 15A-B). The middle layer 144 is then used as an etching mask for patterning of the bottom layer 142 (See FIGS. 16A-B).

The upper layer 148 is patterned using any suitable photolithography process, for example the procedures discussed earlier, to form an opening 146 therein. For example, a photomask (not shown) may be disposed over the upper layer 148. The upper layer 148 may then be exposed to a radiation beam including an ultraviolet (UV) or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser, or the like while the photomask masks areas of the upper layer 116. Exposure of the top photoresist layer may be performed using an immersion lithography system or an extreme ultraviolet lithography system to increase resolution and decrease the minimum achievable pitch. One or multiple exposure steps may be performed. A bake or cure operation may be performed to harden the upper layer 148, and a developer may be used to remove either the exposed or unexposed portions of the upper layer 148 depending on whether a positive or negative resist is used. Opening 146 may have a width W2, where W2 is about 50 nm in some embodiments.

Referring to FIGS. 15A-B, after the patterning of the upper layer 148, the pattern of the upper layer 148 is transferred to the middle layer 144 in an etching process. The etching process is anisotropic, so that the opening 146 in the upper layer 148 is extended through the middle layer 144 and has about the same size (or is slightly smaller) in the middle layer 144 as it has in the upper layer 148. The resulting structure is illustrated in FIGS. 15A-B.

As shown in FIGS. 16A-B, an etching process may be performed to transfer the pattern of the middle layer 144 to the bottom layer 142 and sacrificial material 136, thereby extending the opening 146 through the bottom layer 142 and sacrificial material 136. The etching process of the bottom layer 142 is anisotropic, so that the opening 146 in the middle layer 144 is extended through the bottom layer 142 and has about the same sizes (or is slightly smaller) in the bottom layer 142 as it has in the middle layer 144. The etching process may include etching using $CH_4$, $Cl_2$, $SF_6$, $CH_xF_y$, He, $BCl_3$, $N_2$, $O_2$, $H_2$, $CF_x$, $CHF_x$, $NF_3$, Ar, $SiCl_4$, a combination, or the like.

As part of etching the bottom layer 142, the upper layer 148 may be consumed. After the patterning of the bottom layer 142, the opening 146 may expose a sidewall of one or more the spacers 124 formed of the remaining dielectric layer 110. The opening 146 may also expose sections of the hard mask layer 108 that extend between adjacent spacers 124. Other portions of the spacers 124, such as top surfaces, or other sections of the hard mask layer 108 may be exposed in some embodiments.

Next, referring to FIGS. 17A-B, the bottom layer 142 and any remaining portions of the middle layer 144 are removed, for example using an ashing process. As shown in the plan view of FIG. 17B, the sacrificial layer 136 has been patterned to form two discrete portions, and each portion overlies a gap between two adjacent spacers 124 (at least in part). The two discrete portions each extend in directions that are perpendicular to a direction in which the spacers 124 extend.

Next, referring to FIGS. 18A-B, a planarization process is performed to remove excess portions of the sacrificial material 136 and planarize a top surface of the sacrificial material 136 to be level with top surfaces of the spacers 124. In some embodiments, the planarization process comprises one or more etching processes. For example, a dry etching process using $CH_4$, $Cl_2$, $SF_6$, $CH_xF_y$, He, $SiCl_4$, HBr, $N_2$, $O_2$, $H_2$, $CF_x$, $CHF_x$, $NF_3$, Ar, $NF_3$, or the like, may be used. In some embodiments, a wet etching process may be used, for example using diluted hydrofluoric acid (DHF) as an etching chemical. In other embodiments, a grinding process such as CMP may be used. The resulting structure is depicted in FIGS. 18A and 18B. The cross-sectional view of FIG. 18A is taken along the line A-A' shown in the plan view of FIG. 18B. As can be seen in FIGS. 18A-B, the planarization of the sacrificial material has created a plurality of discrete portions of the sacrificial material, where each discrete portion overlies a gap between two adjacent spacers. In some embodiments, each discrete portion overlies a region in which a line cut between two adjacent portions of conductive line will be formed.

In some embodiments, the planarization process shown in FIGS. 18A-B is not performed. In embodiments in which the planarization process shown in FIGS. 18A-B is not performed, subsequent process may proceed with top surfaces of sacrificial material 136 being offset from top surfaces of spacers 124. For example, as described earlier in connection with FIGS. 9 through 12A-B, in some embodiments, the thickness of sacrificial material 136 may be controlled by controlling a thickness of bottom layer 126 (shown in FIGS. 9 through 12A-B). When sacrificial material 136 is relatively thin, for example because bottom layer 126 is formed to be relatively thin, the planarization process depicted in FIGS. 18A-B may be unnecessary. As such, manufacturing costs and/or manufacturing time may be reduced.

FIGS. 19A-B through 22A-B depict patterning the hard mask layer 108 and the target layer 102. In each of FIGS. 19A-B through 22A-B, figures ending with an "A" are cross-sectional views taken along the line A-A' shown in the plan view of the corresponding drawing ending with a "B".

Referring to FIGS. 19A-B, the hard mask layer 108 is patterned using the spacers 124 and the sacrificial material 136 as an etching mask to form opening 150. As such, the pattern of the spacers 124 and sacrificial material 136 is transferred to the hard mask layer 108. In some embodiments, etching the hard mask layer 108 comprises an anisotropic dry etch and/or wet etch. The resulting structure is shown in FIGS. 19A and 19B. The cross-sectional view of FIG. 19A is taken along the line A-A' shown in the plan view of FIG. 19B.

As shown in FIGS. 19A and 19B, the remaining portions of the sacrificial material 136 prevented the etching of the hard mask layer 108 underlying the remaining portions of sacrificial material 136, and, where present, effectively caused a break, or "cut" in the opening 150 that is otherwise created in hard mask layer 108 between two adjacent spacers 124. As will be discussed in detail below, when the pattern of the hard mask layer 108 is subsequently transferred to the target layer 102, and conductive features are formed in the recesses, the sacrificial material 136 causes a gap, or "line cut", between two adjacent portions of a conductive line.

After the hard mask layer 108 is patterned, a wet cleaning may be performed to remove any remaining portions of the spacers 124 and the sacrificial material 136. The resulting structure is depicted in FIGS. 20A and 20B.

Subsequently, in FIGS. 21A and 21B, the hard mask layer 108 is used as an etching mask to extend openings 150 into the target layer 102. Etching the target layer 102 may comprise an anisotropic dry etch process and/or a wet etch process, which sequentially etches through the ARC layer 106 to the target layer 102. Remaining portions of the target layer 102 may have a same pattern as the spacers 124 and the sacrificial material 136 of FIGS. 19A-B. As such, target layer 102 is patterned in a single patterning step.

After the openings 150 are patterned, a wet cleaning process may be performed to remove any remaining portions of the hard mask layer 108 and the ARC layer 106. The resulting structure is shown in FIGS. 22A-B.

After openings 150 are patterned in the target layer 102, features may be formed in the openings. In an embodiment, the target layer 102 is a low-k dielectric, and the patterned target layer 102 provides an IMD for an interconnect structure. Conductive features such as copper lines, copper vias, and/or cobalt plugs may be formed in the IMD.

Figure 23:
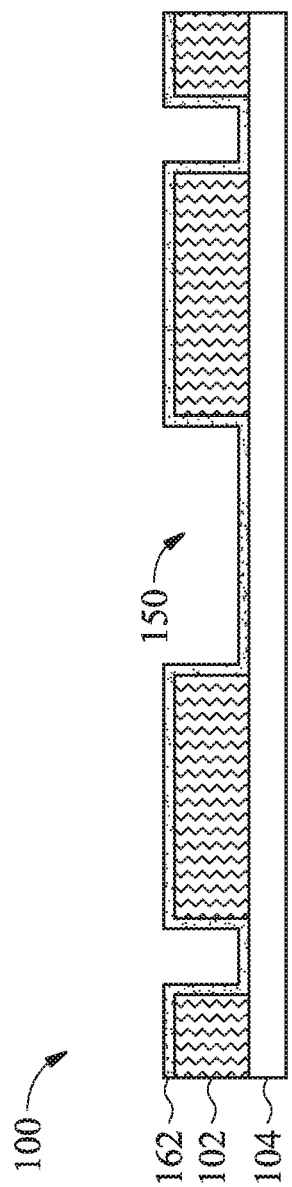
FIGS. 23 and 24 illustrate cross-sectional views of various intermediary stages of manufacturing a semiconductor device in accordance with some embodiments.

Referring to FIG. 23, one or more liners 162 may be formed along sidewalls and a bottom surface of the openings 150. The liners 162 may comprise TiO, TiN, TaO, TaN, Ru, Co, Ta, or the like, and may provide diffusion barrier, adhesion, and/or seed layers for the conductive feature. The liners may be deposited using any suitable process, such as, PVD, CVD, ALD, and the like.

Figure 24:
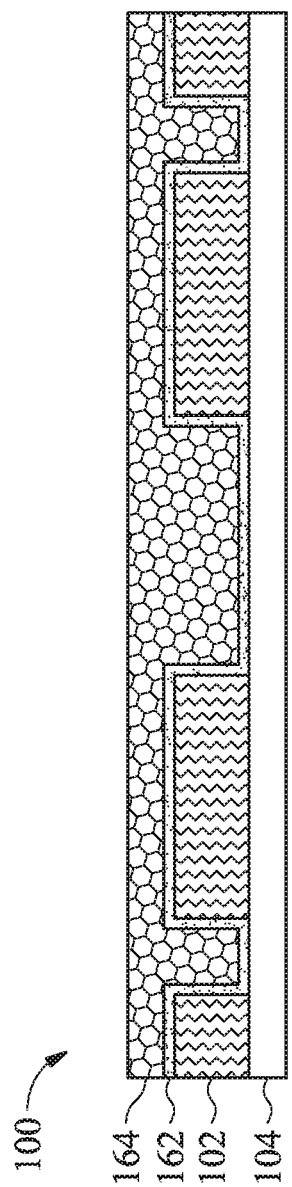

Next, as shown in FIG. 24, remaining portions of the openings 150 (shown in FIG. 23) may be filled with a conductive material 164, such as copper, using, e.g., PVD, plating, or the like. The conductive material 164 may be initially deposited to overfill the openings 150.

Figure 25A:
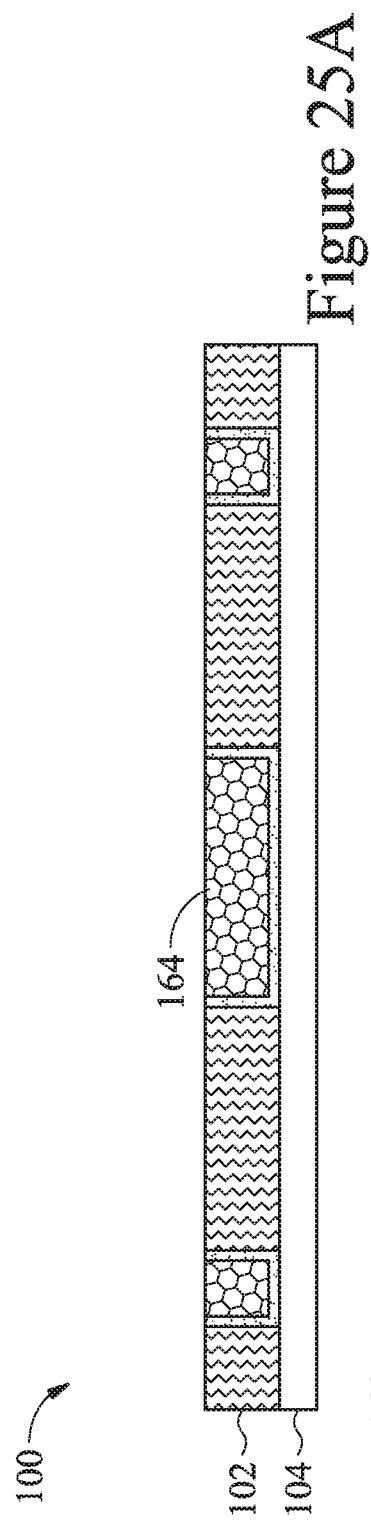
FIGS. 25A and 25B illustrate a cross-sectional and plan view of an intermediary stage of manufacturing a semiconductor device in accordance with some embodiments.
Figure 25B:
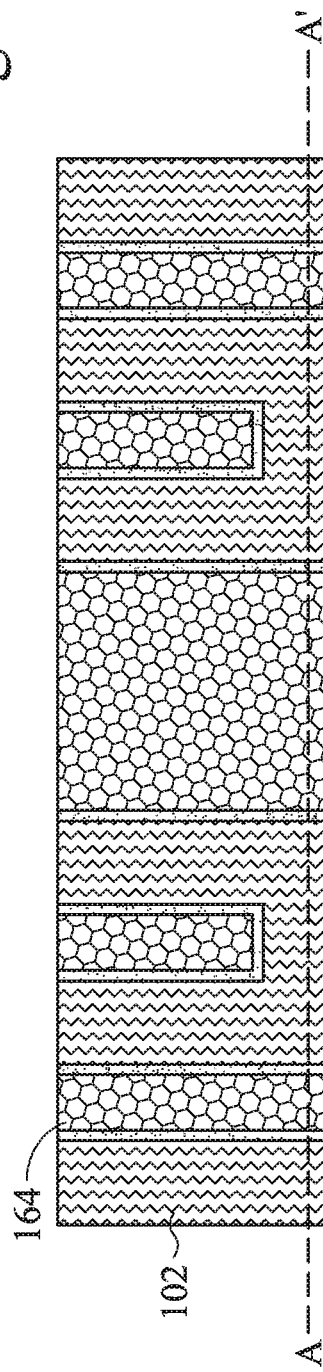

Referring to FIGS. 25A-B, a planarization process is performed to remove excess portions of the conductive material 164 over the target layer 102. Thus, conductive features may be formed in the target layer 102. In embodiments where the conductive features in the target layer 102 are conductive lines, the areas that was underneath the portions of sacrificial material 136 (see FIGS. 19A-B) when hard mask 108 was patterned are areas where the conductive lines have gaps, or "line cuts."

As discussed above in connection with FIGS. 12A and 12B, in some embodiments, the length of the strip of sacrificial material 136 shown in FIGS. 12A and 12B could be extended, or additional strips of sacrificial material 136 could be formed. If the length of sacrificial material 136 were extended, then the line cut shown in FIGS. 25A-25B may be extended so that additional conductive lines have the depicted line cut. If multiple strips of sacrificial material 136 were formed, the conductive lines depicted in FIG. 25B may have additional line cuts that are offset from the depicted line cuts. By employing the embodiments discussed herein, fine pitch conductive lines having line cuts with a line cut pitch of about 85.5 nm or more may be formed. If an extreme ultraviolet lithography system is used in the patterning processes discussed herein, for example to pattern upper layer 132 as discussed above in connection with FIG. 7, a reduced line cut pitch may be achievable. For example, a line cut pitch of about 30 nm or more may be achieved.

If the processes discussed herein are employed multiple times, conductive lines having a line cut pitch of about 30 nm or 48 nm or more can be formed with fewer manufacturing defects and increased yield. For example, the processes discussed above in connection with FIGS. 6 to 12A-B may be repeated multiple times to form multiple lines of patterned sacrificial material (for example to form multiple adjacent line cuts in subsequent processing), followed by the additional processes discussed in connection with FIGS. 13A-B to 25A-B to transfer the conductive lines with multiple adjacent line cuts to the target layer. With the additional processing, a line cut pitch of about 30 nm or 48 nm or more may be achieved. However, because the processes discussed in FIGS. 6 to 12A-B are repeated multiple times, and the dimensions of the interconnect lines are decreased, the dimensions of the formed interconnect lines may vary slightly from the target dimensions and/or alignment problems may occur.

Figure 26:
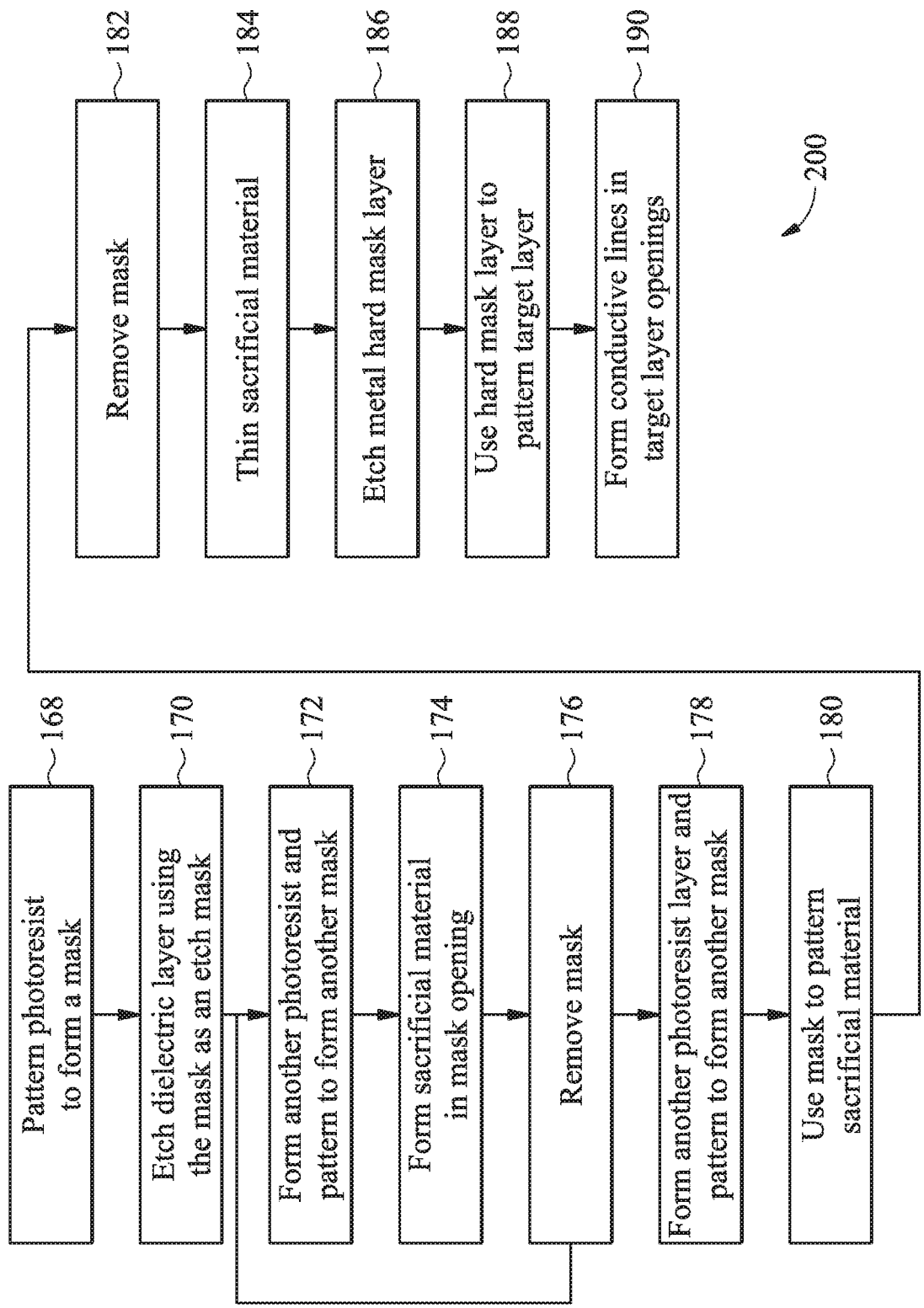
FIG. 26 is a flow chart of a method in accordance with some embodiments.

Referring to FIG. 26, a method 200 of forming an interconnect line in a target layer is provided. In step 168, a photoresist is patterned to form a mask, for example as shown in FIGS. 1-3. In step 170, a dielectric layer is etched using the mask as an etch mask, for example as shown in FIG. 4. In step 172, another photoresist is formed and patterned to form another mask, for example as shown in FIGS. 6-9. In step 174, a sacrificial material is formed in an opening of the mask, for example as shown in FIGS. 10-11. In step 176 the mask is removed, for example as shown in FIGS. 12A-B. In some embodiments, steps 172 to 176 may be repeated multiple times, for example to form conductive lines having a multiple line cuts with a smaller line cut pitch. In step 178 another photoresist is formed and patterned to form another mask, for example as shown in FIGS. 13A-B to 15A-B. In step 180, the mask is used to pattern the sacrificial material, for example as shown in FIGS. 16A-B. In step 182 the mask is removed, for example as shown in FIGS. 17A-B. In step 184 the sacrificial material is thinned, for example as shown in FIGS. 18A-B. In step 186 a metal hard mask layer is etched, for example as shown in FIGS. 19A-B. In step 188 the metal hard mask layer is used to pattern a target layer, for example as shown in FIGS. 21A-B. In step 190 conductive lines having one or more line cuts are formed in openings of a target layer, for example as shown in FIGS. 23 to 25A-B.

In some embodiments, the patterning methods described herein may be used to form interconnect lines in a target layer as depicted in FIGS. 25A-B. The interconnect lines may be formed with a fine pitch and multiple line cuts may be formed with a small line cut pitch. The interconnect lines may be formed with increased accuracy using a simplified patterning process. For example, the target layer can be patterned to form fine pitch interconnect lines having one or more line cuts using a single patterning process to pattern the target layer. Because the target layer is patterned in a single patterning process (or a simplified patterning process), increased accuracy of the pattern may be achieved. For example, if target layer 102 were etched in two or more different processes, the pattern that is actually etched into the target layer 102 may differ from the desired pattern, for example due to difficulties in exactly aligning an etch mask with a portion to be etched. When the target layer 102 is etched using a single etch step and/or a simplified patterning process as described herein, increased accuracy is possible. As such, multiple interconnect lines having one or more line cuts may be formed to have the same dimensions or substantially the same dimensions, which allows for greater control of resistance of the interconnect lines.

In some embodiments, the processes described above in connection with FIGS. 1 to 25A-B may be used to form power rail and/or metal island structures, such as the power rail and metal island structures depicted in FIGS. 27-30. For example, the power rail and metal island structures depicted in FIGS. 27-30 may be formed in target layer 102 using processes described above in connection with FIGS. 1 to 25A-B. In some embodiments, a plurality of spacers may be formed over a dielectric layer as described above in connection with FIGS. 1-5, where a gap between one or more spacers of the plurality of spacers define a recess that will be formed in a target layer for the forming of a power rail, and where gaps between other spacers of the plurality of spacers define recesses that will be formed in a target layer for the formation of a plurality of conductive lines adjacent to the power rail, where the conductive lines will extend in a direction that is parallel to a major axis of the power rail. A sacrificial material may be formed and patterned over the dielectric layer (as discussed in connection with FIGS. 6 to 18A-B), where the sacrificial material defines a plurality of line cuts extending in a direction that is perpendicular to the direction of the power rail and conductive lines. The spacers and the sacrificial material in combination may define the structures shown in FIGS. 27-30. The pattern of the sacrificial material and spacers is transferred to a target layer, for example as shown FIGS. 19A-B to 22A-B. Conductors are formed in the patterned target layer, as shown in FIGS. 23 to 25A-B, to form the structures shown in FIGS. 27-30.

In some embodiments, the processes described herein in connection with FIGS. 1 to 25A-B may be used to form narrower power rails and/or groups of metal islands that are well aligned to other groups of metal islands. Due to the processes used to form the power rail and metal islands, kinks may be present in the formed power rail. Kinks may reduce reliability of contacts that are made to the power rail. To avoid the kinks, contacts to the power rail may be limited to portions of the power rail that are outside of a "contact free zone" in which kinks may be present at the edges of the power rail.

FIG. 27 depicts a power rail and metal island structure 2300 that may be formed in a target layer 2316 using processes as described herein. In some embodiments, target layer 2316 is the same as, or similar to, target layer 102 as described in connection with FIGS. 1 to 25A-B. Power rail and metal island structure 2300 includes power rail 2302. In some embodiments, power rail 2302 may help to distribute a power source, such as Vdd, or a ground source, in a device. For example, power rail 2302 may be electrically connected to a power source or a ground node, and contacts (not shown) may be formed in different places along power rail 2302 that electrically connect to power rail 2302, and thereby connect to the power source or ground node using power rail 2302. The processes described herein may be used to form a power rail 2302 having relatively small dimensions. For example, power rail 2302 may have a thickness T4 of about 55 nm or less in some embodiments.

Power rail and metal island structure 2300 may also include metal islands 2312. In some embodiments, metal islands 2312 may be used to distribute power and/or signals in a device. As shown in FIG. 27, the processes described herein may be used to form an array of metal islands 2312 having a line cut pitch P2 greater than or equal to about 85.5 nm, and a line pitch P5 greater than or equal to about 30 nm. Because the processes described herein allow for an array of metal islands 2312 to be formed with a fine line pitch and a fine line cut pitch, a greater number of metal islands 2312 may be formed in the spaces adjacent to power rail 2302. Additionally, the processes described herein may be used to form a group 2304 of metal islands 2312 that are well aligned with another group 2306 of metal islands 2312. In some embodiments, metal island group 2304 is well aligned with another metal island group 2306, for example because metal island group 2304 and metal island group 2306 may be formed using a same line cut (i.e. a same strip of sacrificial material 136). Sidewalls of metal islands 2312 of metal island group 2304 may be aligned with sidewalls of metal islands 2312 of metal island group 2306. Further, as shown in FIG. 27, the processes described herein may be used to form a group of metal islands 2312 at a fine line cut pitch P2, such as greater than or equal to about 85.5 nm, where each metal island 2312 has the same, or substantially the same, dimensions as other metal islands 2312 in the group. For example, in some embodiments each metal island 2312 may each have a length L1 of about 45 nm to about 60 nm.

In some embodiments, the processes described herein may be used to form power rail and metal island structure 2400 in a target layer 2416 as shown in FIG. 28. In some embodiments, target layer 2416 is the same as, or similar to, target layer 102 as described in connection with FIGS. 1 to 25A-B. Power rail and metal island structure 2400 includes power rail 2402. In some embodiments, power rail 2402 may help to distribute a power source, such as Vdd or Ground, in a device. Power rail 2402 may be similar to power rail 2302, discussed above in connection with FIG. 27. For example, power rail 2402 may have a thickness T5 of about 55 nm or less in some embodiments. Power rail and metal island structure 2400 may also include metal islands 2412. Metal islands 2412 may be similar or the same as metal islands 2312, discussed above in connection with FIG. 27. Metal islands 2412 may have a line cut pitch P3, which may be the same as, or similar to, line cut pitch P2 discussed in connection with FIG. 27.

As shown in FIG. 28, the processes described herein that are used to form power rail and metal island structure 2400 may also form kinks 2414 extending into power rail 2402. For example, the processes used to form power rail and metal island structure may have inherent accuracy limitations, such as a limitation in an ability to align an etch mask with a specific portion of an underlying layer that is desired to be etched. Processing equipment used to form power rail and metal island structure 2400 may have inaccuracies or imperfections. As such, the processes described herein may result in the formation of kinks at the edges of power rail 2402. Kinks 2414 may reduce the reliability of any physical or electrical connections to the power rail 2402 that are formed in the edge regions of power rail 2402 in which kinks 2414 may be formed. In some embodiments, kinks 2414 may extend a distance D1 into power rail 2402, where D1 is about 5 nm to about 8 nm.

In some embodiments, to avoid forming contacts that could be impacted by one or more kinks 2414, and therefore have reduced reliability, one or more contact free zones 2408 may be included along edges of power rail 2402 in which kinks 2414 may be formed. For example, semiconductor devices may be designed and formed so that physical and/or electrical connections to power rail 2402 are formed outside of the contact free zone 2408 of power rail 2402. In some manufacturing processes, in advance of being formed, a semiconductor device may be designed using a computer-based processing system (for example processing system 300 of FIG. 31, discussed in detail below). The computer-based processing system may enable the use of one or more design rules that can be used to guide a designer in routing electrical connections in a virtual semiconductor device layout, for example to ensure that minimum distances mandated by a particular processing technology are respected in a particular design. In some embodiments, contact free zone 2408 may be in included as a design rule that prevents physical and/or electrical connections to power rail 2402 from being made inside of contact free zone 2408. As such, when a design is finalized and a semiconductor device is formed according to a planned design, all contacts to power rail 2402 are made outside of contact free zone 2408 in accordance with the design rule.

In some embodiments, contact free zone 2408 may extend a distance D2 into power rail 2402, where D2 is about 5 nm to about 10 nm. Multiple contact free zones 2408 may be included (for example on opposite sides of power rail 2402), or only a single contact free zone 2408 may be included in an embodiment.

FIG. 29 depicts a power rail and metal island structure 2500 formed in a target layer 2516 in accordance with some embodiments. In some embodiments, target layer 2516 is the same as, or similar to, target layer 102 as described in connection with FIGS. 1 to 25A-B. Power rail and metal island structure 2500 may be formed using the processes described above in connection with FIGS. 1 to 25A-B. Power rail and metal island structure 2500 may include power rail 2502 and metal islands 2512. Power rail 2502 may be the same as or similar to power rail 2402, and metal islands 2512 may be the same as or similar to metal islands 2412.

In some embodiments, certain of the processes described in connection with FIGS. 1-25A-B, for example the processes described above in connection with FIGS. 6 to 12A-B, may be used multiple times, which may allow the formation of metal islands 2512 having a smaller line cut pitch. In a 10 nm technology node, metal islands 2512 may have a line cut pitch P4 that is about 30 nm to 48 nm. In some embodiments, the inaccuracies that may occur during manufacturing (examples of which are discussed above) may become more problematic when the pitch is reduced. In some embodiments, when the pitch of metal islands (e.g. metal islands 2512) is reduced, it may be more difficult to produce multiple metal islands 2512 having the same dimensions or substantially similar dimensions. As such, when the pitch P4 of metal islands 2512 is about 30 nm to 48 nm, dimensions of metal islands 2512 may vary. For example, certain metal islands 2512 may have a length L2 that is the same as the length L1 of metal islands 2312 described in connection with FIG. 27. Other metal islands 2512 may have a length L3 that is about 10 nm to about 35 nm.

As described above, in some embodiments, the accuracy of the pattern that is made in a target layer 102 using processes described above in connection with FIGS. 1 to 25A-B depend on the accuracy of different processing steps (e.g., the accuracy at which the patterning masks used in the patterning processes are formed and patterned and/or the accuracy that can be achieved in an etching processes where an upper mask transfers its pattern to an underlying layer). Slight deviations in the desired pattern may occur, particularly when the target pitch of metal islands 2512 is reduced, for example to a pitch P4 of about 30 nm to 48 nm. The slight deviations may result in a slight misalignment of groups of metal islands. For example, as shown in FIG. 29, metal island group 2504 is offset from metal island group 2506. The deviations may also result in the formation of kinks 2514 as described above. Kinks 2514 may be the same as, or similar to, kinks 2414 described in connection with FIG. 27. As such, contact free zones 2508 may be required. Contact free zones 2508 may be the same as, or similar to, contact free zones 2408 discussed in connection with FIG. 28.

Figure 30:
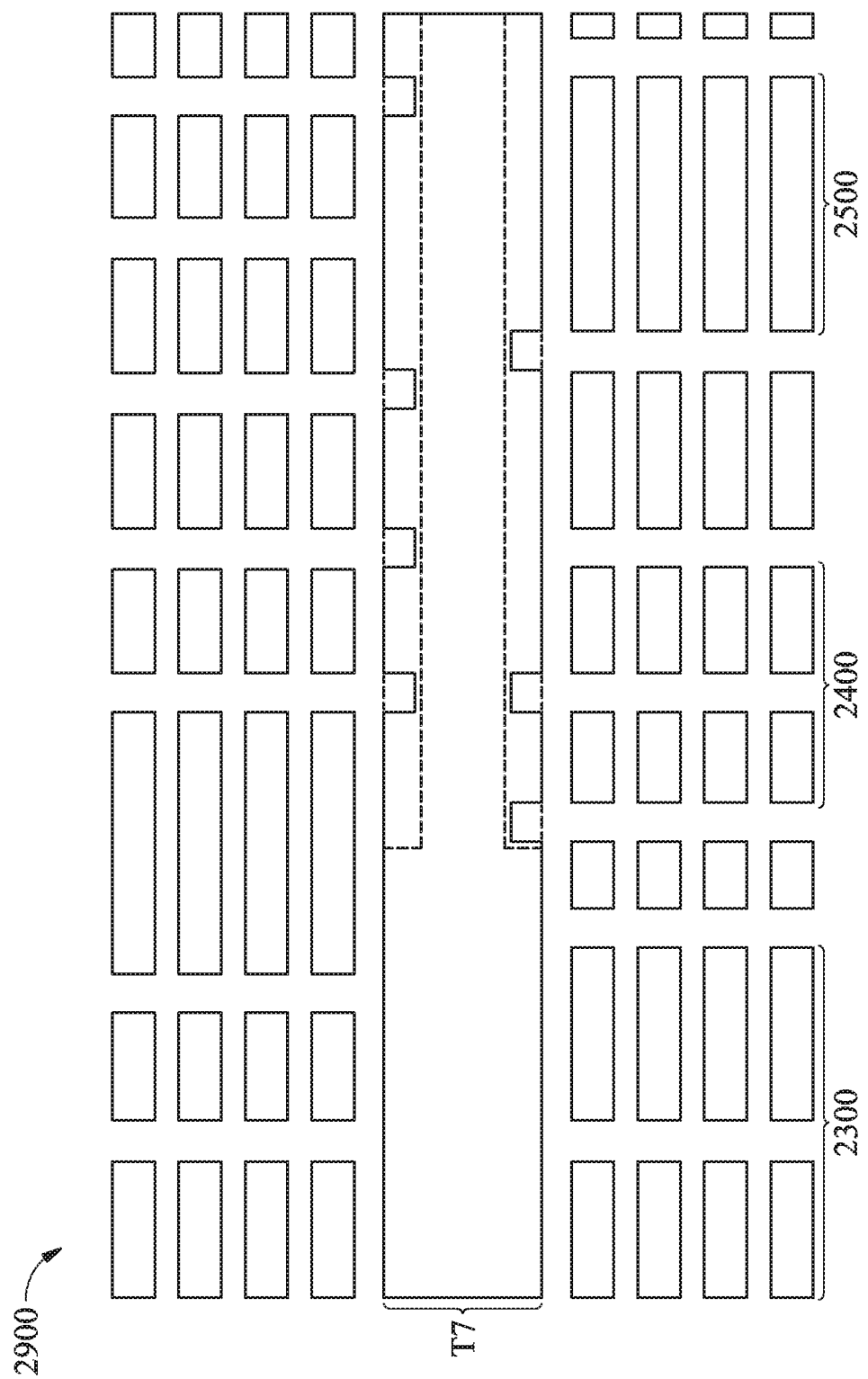

In some embodiments, a single power rail and metal island structure may be formed that includes some or all of the features discussed above in connection with FIGS. 27-29. FIG. 30 depicts power rail and metal island structure 2900. Metal structure 2900 may include various portions formed to different specifications. For example, in a first portion, power rail and metal island structure 2900 is formed to include the features of power rail and metal island structure 2300, discussed above in connection with FIG. 27. In a second portion, power rail and metal island structure 2900 is formed to include the features of power rail and metal island structure 2400, discussed above in connection with FIG. 28. In a third portion, power rail and metal island structure 2900 is formed to include the features of power rail and metal island structure 2500, discussed above in connection with FIG. 29.

As discussed above, a processing system, such as a computer, may be used to design and optimize a virtual layout of a semiconductor device to be formed. After the virtual layout is optimized on the processing system, the optimized layout can be used as a guide for subsequent forming of the semiconductor chip.

Figure 31:
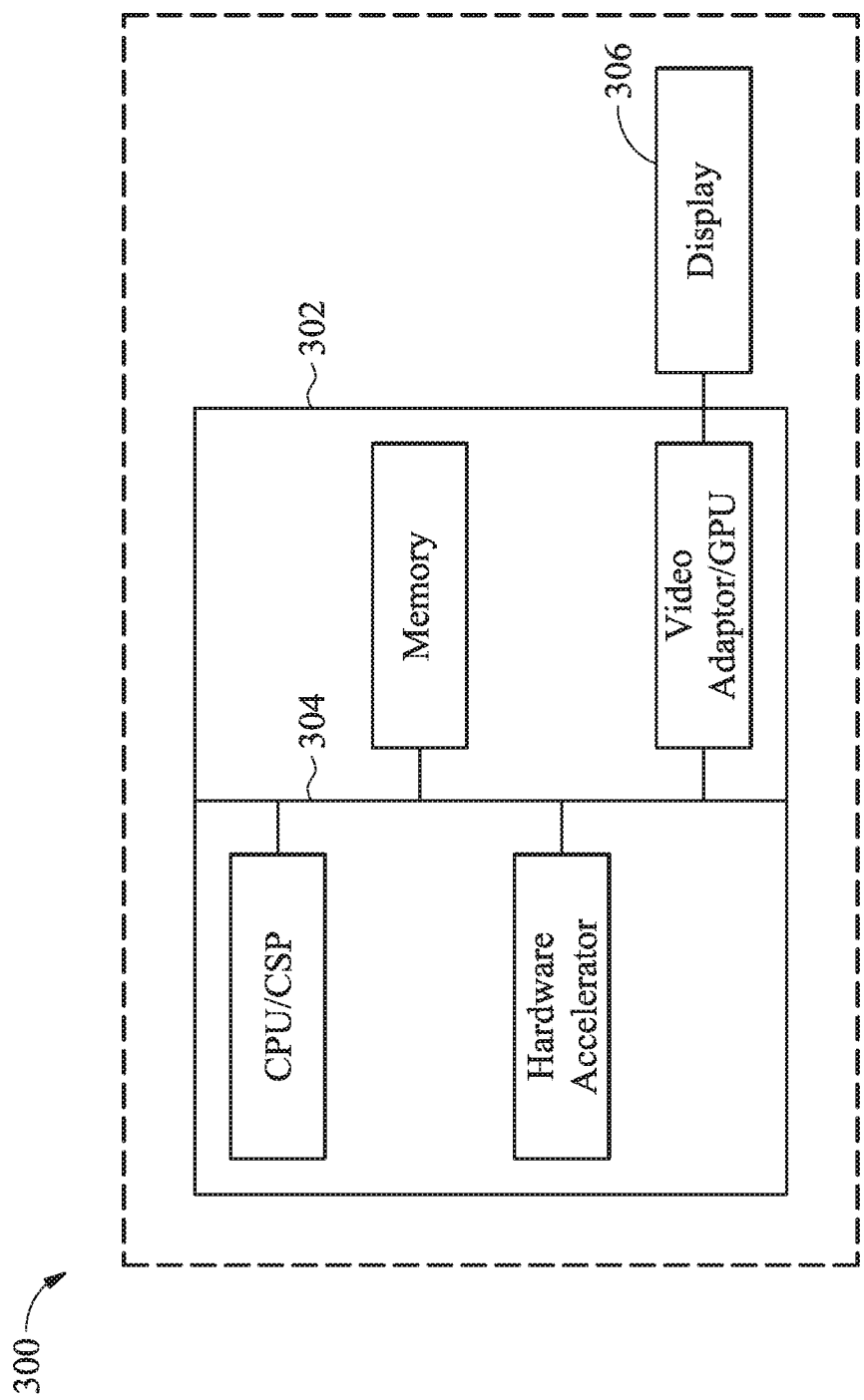
FIG. 31 is a block diagram of a processing system in accordance with some embodiments.

Referring to FIG. 31, illustrated therein is a block diagram of elements of a processing system 300 that may be used to generate a diagram showing a virtual layout of a semiconductor chip to be formed. The processing system 300 may include a processor 302 equipped with one or more input/output devices, such as a video adapter/graphics processing unit ("GPU"). The processor 302 may include a central processing unit ("CPU")/DSP, memory, and a hardware accelerator connected to a bus 304.

The bus 304 may be one or more of any type of several bus architectures including a memory bus or memory controller, a peripheral bus, video bus, or the like. The CPU may be formed with any type of electronic data processor. The memory may be formed with any type of system memory such as static random access memory (SRAM), dynamic random access memory (DRAM), synchronous DRAM (SDRAM), read-only memory (ROM), nonvolatile random access memory ("NVRAM"), a combination thereof, or the like. In an embodiment, the memory may include ROM for use at boot-up, and DRAM for data storage for use while executing programs. The memory may store programs that may enable users to view, modify, and/or optimize virtual layouts of semiconductor chips to be formed. The memory may store parameters, rules, or the like, to aid a user in designing, modifying and/or optimizing virtual layouts of semiconductor chips to be formed. For example, the memory may store one or more design rules that may be used to ensure that minimum distances required by a particular technology or process are met, thereby optimizing a virtual layout of a semiconductor chip to be formed.

The video adapter/GPU provides an interface to couple an external input and output from a display 306 to the processor. Display 306 may display a virtual layout of a semiconductor chip to be formed. Other devices may be coupled to the processor 302, and additional or fewer interface cards may be utilized. For example, a serial interface card (not shown) may be used to provide a serial interface for a printer.

The processor 302 may also include a network interface (not shown), which can be a wired link, such as an Ethernet cable or the like, and/or a wireless link to enable communication with a network such as a cellular communication network. The network interface allows the processor to communicate with remote units via the network. In an embodiment, the processor 302 is coupled to a local-area network or a wide-area network to provide communications to remote devices, such as other processors, the Internet, remote storage facilities, or the like.

It should be noted that processing system 300 may include other components. For example, processing system 300 may include power supplies, cables, a motherboard, removable storage media, cases, and the like. These other components, although not shown, are considered part of processing system 300.

Figure 32:
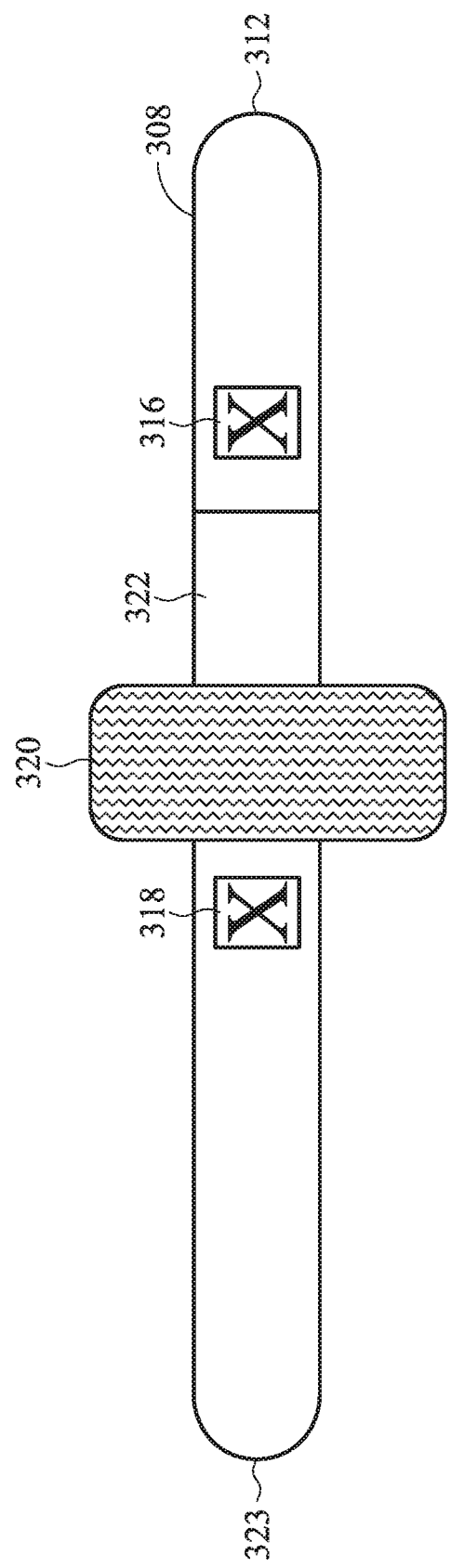
FIG. 32 is a plan view of a semiconductor device in accordance with some embodiments.

In some embodiments, planned semiconductor device may include conductive lines, interconnect lines, and a layout of a semiconductor chip to be formed may be optimized by removing undesired portions of conductive lines. For example, a plurality of conductive lines may have one or more line cuts, which in some embodiments may be formed using the methods discussed above in connection with FIGS. 1-25B. The line cuts may be made to a middle portion of a conductive line. After the plurality of conductive lines having one or more line cuts are formed, a portion of one or more of the conductive lines may be unnecessary or undesired. For example, as shown in FIG. 32, conductive line 308 may be used to form an electrical connection between first end 312 of conductive line 308 and via 316, and between second end 323 and via 318. A line cut 320 may be formed between via 316 and 318. As can be seen from FIG. 32, the portion 322 of conductive line 308 that extends between line cut 320 and via 316 may be unused (for example, this portion 322 of conductive line may not be required for any desired electrical connection in a given layout). In some devices, unnecessary or undesired metal lines may be disadvantageous in a semiconductor device. For example, unnecessary or undesired metal lines may degrade the RC performance of the semiconductor device, and/or may disadvantageously increase the size and/or footprint of the semiconductor device.

Figure 33A:
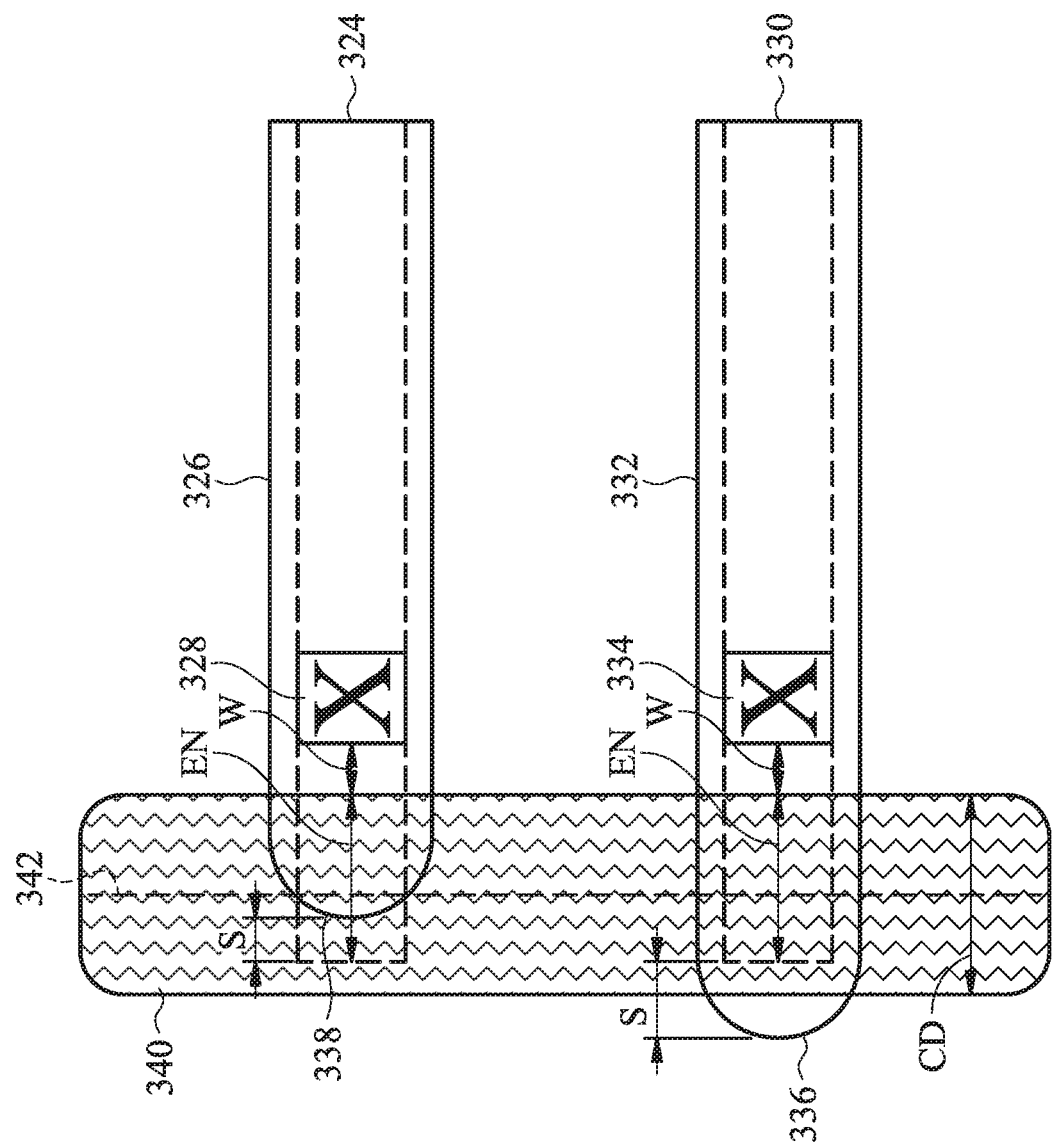
FIGS. 33A-B are plan views of virtual layouts and semiconductor devices in accordance with some embodiments.

In some embodiments, conductive lines may be formed in a manner that unnecessary or undesired line ends are not formed, which may improve the RC performance of the semiconductor device and/or reduce the size or footprint of the semiconductor device. FIG. 33A depicts a comparison of virtual layouts (e.g. 324, 330) compared to physical conductive features (e.g., 326, 332) that could be formed using the virtual layouts as a guide. FIG. 33A also indicates parameters that may be used to calculate a target cut width of a line cut that may be used during the formation of a physical conductive line (see FIGS. 34-47), that will enable an unnecessary or undesired line end to be omitted in a formed semiconductor device, thereby improving the RC constant of the device and/or reducing the size or footprint of the semiconductor device.

FIG. 33A shows a virtual layout 324 overlaid on a physical conductive line 326 that may be formed using virtual layout 324 as a guide. FIG. 33A further shows a virtual layout 330 overlaid on a physical conductive line 332 that may be formed using virtual layout 330 as a guide. In physical conductive line 326, the portion extending between via 328 and line end 338 is unused, and it would be advantageous for it to be removed, or not formed, in a semiconductor device that is being manufactured. In physical conductive line 332, the portion extending between via 334 and line end 336 is unused, and it would be advantageous for it to be removed, or not formed, in a semiconductor chip that is being manufactured.

In each of physical conductive line 326 and physical conductive line 332, EN is a width of a target virtual conductive line cut in a virtual layout, and W is a minimum distance between an edge of a virtual via in the virtual layout (e.g., 328 or 334) and a closest edge of the target virtual line cut EN. In some embodiments, W is a parameter that is mandated by design rules of a particular technology, for example to ensure that, when a semiconductor device is formed using the virtual layouts as a guide, physical conductive line 326 over via 328 and physical conductive line 332 over via 334 are not removed, for example due to inaccuracies introduced by processing technologies used to form the semiconductor device.

As shown in FIG. 33A, a physical conductive line that is formed using a virtual layout as a guide may differ from the virtual layout in various aspects, for example due to inaccuracies introduced by various processing technologies or imperfections or deviations in equipment used in the processing. In FIG. 33A, physical conductive line 326 (that has been formed using virtual layout 324 as a guide) is formed in a manner that line end 338 does not reach the planned line end of virtual layout 324. In some embodiments a distance between the line end 338 of the physical conductive line 326 and the planned line end of virtual layout 324 may differ a maximum distance S. Physical conductive line 332, on the other hand, may be formed so that line end 336 extends a maximum distance S past the planned line end of virtual layout 330. In other words, a variance of +/−S, or 2S, may exist between a planned line end of a planned conductive line and an actual line end of an actual conductive line, where the actual line end may be formed up to a maximum distance S on either side of the planned line end. As such, an actual line end may be formed within a bias range of 2S of a planned line end. In some embodiments, S may be about 0 nm to about 5 nm.

Figure 33B:
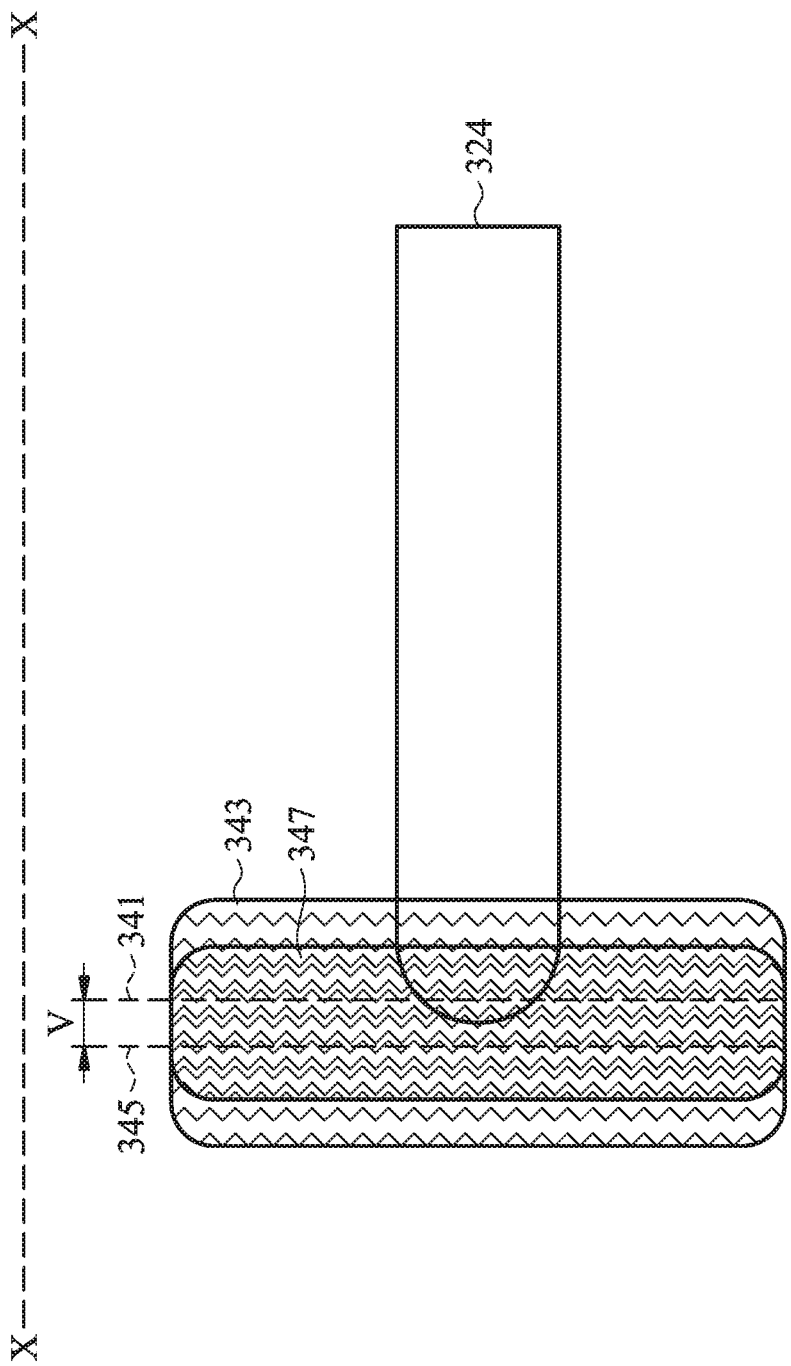

In some embodiments, during the forming of a semiconductor device it may be desired to match a planned line cut to a specific location of a conductive line. For example, it may be desired to place a center axis of a planned line cut so that it intersects a center point of line EN. However, due to processing limitations discussed herein, the ability for an exact match may be limited, and some variation may occur in normal processing. FIG. 33B depicts that, in the forming of an actual device, a planned center axis 341 of a planned line cut 343 may be offset from a center axis 345 of an actual line cut 347 that is formed using planned line cut 343 as a guide. An overlay distance V may be defined, where V is an distance along the X axis (shown in FIG. 33B) that a line cut may be shifted between the actual position and the planned position. Referring again to FIG. 33A, it is shown that actual line cut 340 that is made has been shifted so that center axis 342 is offset from a center point of virtual line EN. Referring to FIG. 33B, in a real manufacturing process, line cut 347 may actually be located a distance V to a first side of the planned line cut 343 along the x axis, or a distance V to a second side along the x axis, where the second side is opposite to the first side. In some embodiments, V may be about 0 nm to about 6 nm. A value of V may depend on the processing equipment used to form the line cut 340 and/or conductive lines 326 and 332, and any processing limitations or inaccuracies introduced by the equipment.

A variation in a target cut width CD may also be considered. For example, in some embodiments, it may be determined (for example using a virtual layout) that a line cut 340 having a target cut width CD is desired to remove an undesired line end of a particular conductive line. However, when the line cut 340 is used in the forming of a physical conductive line, the line cut 340 may have an actual cut width that varies slightly from the target cut width CD, for example due to accuracy limitations of a processing technology or variances of processing equipment. In some embodiments, an actual cut width may be wider than the target cut width CD an amount Z (not shown). In some embodiments, an actual cut width may be thinner than the target cut width CD an amount Z. As such, a cut width variance of +/−Z, or 2Z, may be considered. In some embodiments, Z may be about 0 nm to about 1 nm.

In some embodiments, an optimal cut width CD may be determined according to the above parameters. Optimal cut width CD may be determined according to the following relation:

$$\text{Cut } CD = 2X + S + 2^*(Z^2 + V^2)^{0.5},$$

where 2X is EN, the target length of the virtual conductive line that is desired to be removed in the virtual layout, S is half of bias range 2S, Z is half of cut width variance 2Z, and V is a distance that a line cut may be shifted between an actual position and a planned position. The determined optimal cut width CD may be used in the forming of a conductive line that has an unused line end removed, as discussed below (see FIGS. 34 through 47). A conductive line that is formed using a line cut having a cut width CD determined using this relation may have a wider process window during the forming of the conductive line.

Figure 34:
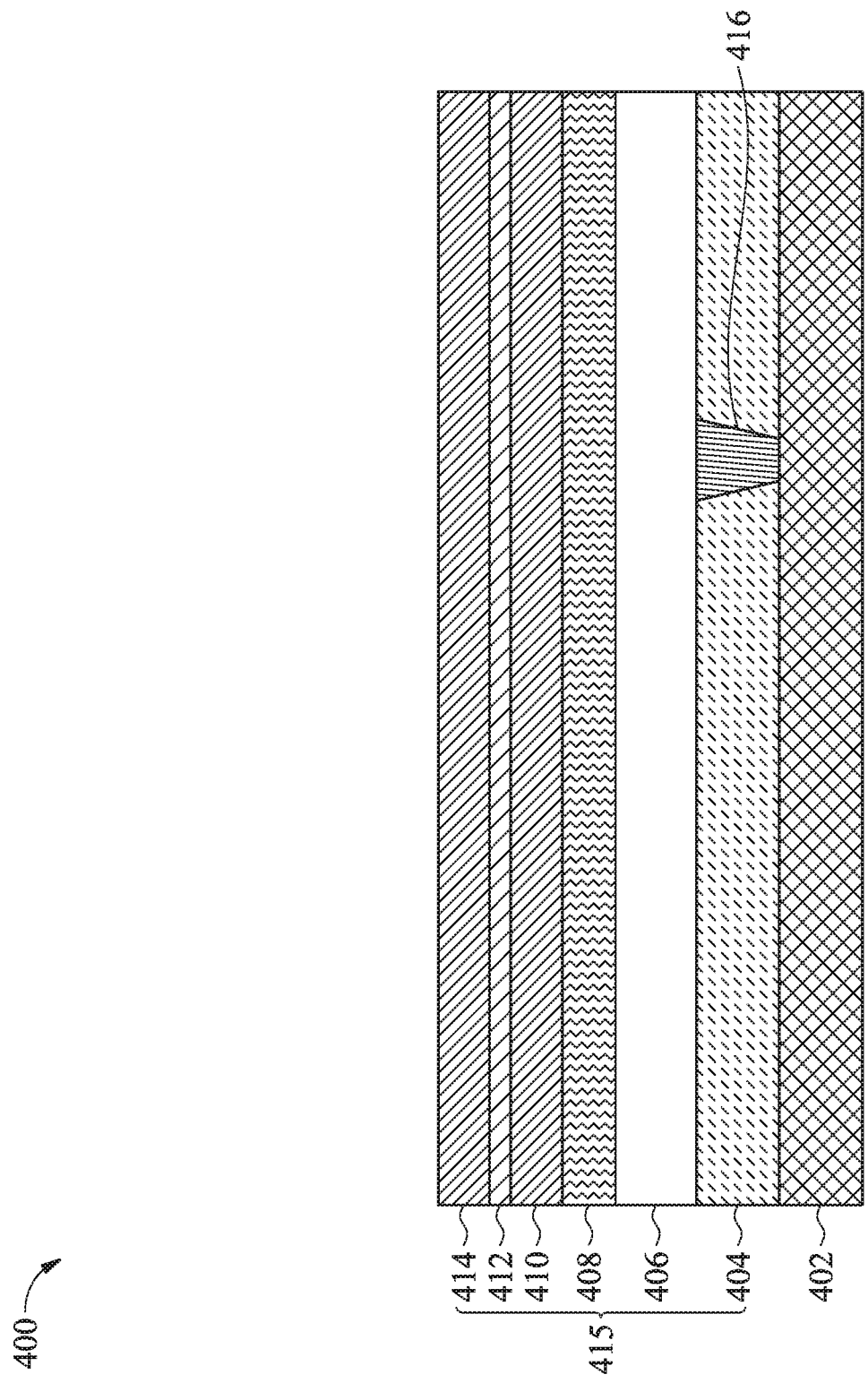
FIGS. 34 through 43 are cross sectional views of intermediary stages in the manufacturing of a semiconductor device in accordance with some embodiments.

FIGS. 34 through 47 depict the formation of a conductive line in accordance with some embodiments. In FIG. 34, film stack 415 is formed over semiconductor substrate 402. Film stack 415 includes dielectric layer 404 formed over semiconductor substrate 402, dielectric layer 406 formed over dielectric layer 404, hard mask layer 408 formed over dielectric layer 406, second cap layer 410 formed over hard mask layer 408, etch stop layer 412 formed over second cap layer 410, and first cap layer 414 formed over etch stop layer 412. Each layer is discussed in detail below.

As shown in FIG. 34, film stack 415 is formed over semiconductor substrate 402. Semiconductor substrate 402 may be formed of a semiconductor material such as silicon, doped or undoped, or an active layer of a semiconductor-on-insulator (SOI) substrate. Semiconductor substrate 402 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not illustrated), such as transistors, diodes, capacitors, resistors, etc., may be formed in and/or on an active surface of semiconductor substrate 402. One or more interconnect lines and/or vias (not illustrate) may be included in semiconductor substrate 402. For example, via 416 may be electrically connected to one or more devices (not shown) in semiconductor substrate 402, for example using one or more conductive lines (not shown) and/or one or more conductive vias (not shown).

Dielectric layer 404 is formed over semiconductor substrate 402. In some embodiments, dielectric layer 404 is an inter-metal dielectric (IMD) layer. In such embodiments, dielectric layer 404 comprises a low-k dielectric material having a dielectric constant (k value) lower than 3.8, lower than about 3.0, or lower than about 2.5, for example. In alternative embodiments, dielectric layer 404 is an IMD layer comprising high-k dielectric material having a k value higher than 3.8. Other materials may be used.

As shown in FIG. 34, via 416 is formed in dielectric layer 404. In some embodiments, via 416 may provide an electrical connection from a conductive line that will be formed in dielectric layer 406 (see FIG. 47) to a device in semiconductor substrate 402 (not shown). Via 416 may be formed by forming an opening in dielectric layer 404, for example using acceptable lithography procedures, such as lithography procedures described herein. One or more liners may be deposited in the opening. A conductive material may then be deposited in the opening over the one or more liners, for example using a plating process. After the plating process is complete, excess conductive material may overfill the opening and extend along a top surface of dielectric layer 404 (not shown). A planarizing process, such as a chemical mechanical polish process, may be used to remove the excess conductive material and make a top surface of via 416 level with a top surface of dielectric layer 404, as shown in FIG. 34. Other processes may be used.

Dielectric layer 406 is formed over dielectric layer 404. In some embodiments, a conductive line will be formed in dielectric layer 404. The conductive line may be formed in a manner that an undesired line end is not formed. Dielectric layer 406 may be formed using the same or similar processes described in connection with dielectric layer 404. In some embodiments, dielectric layer 404 has a same material composition as dielectric layer 406. In other embodiments, dielectric layer 404 has a different material composition that dielectric layer 406.

Hard mask layer 408 is formed over dielectric layer 406. Hard mask layer 408 may be formed of a material that comprises a metal (e.g., titanium nitride, titanium, tantalum nitride, tantalum, a metal-doped carbide (e.g., tungsten carbide), or the like) and/or a metalloid (e.g., silicon nitride, boron nitride, silicon carbide, or the like), and may be formed by PVD, Radio Frequency PVD (RFPVD), Atomic Layer Deposition (ALD), or the like. Other processes and materials may be used. In subsequent processing steps, a pattern is formed on hard mask layer 408 (See FIGS. 44A-B). The hard mask layer 408 is then used as an etching mask for etching dielectric layer 406.

Second cap layer 410 is formed over hard mask layer 408. Second cap layer 410 may be formed using a silicon oxide such as borophosphosilicate tetraethylorthosilicate (BP-TEOS) or undoped tetraethylortho silicate (TEOS) oxide, or the like. In some embodiments, second cap layer 410 is a low temperature oxide (LTO). As used herein, the term "LTO" refers to an oxide deposited using a relatively low process temperature (e.g., 200° C. or less). Second cap layer 410 may be formed by PVD, CVD, ALD, spin-on coating, or the like. Other processes and materials may be used.

Etch stop layer 412 is formed over second cap layer 410. In some embodiments, etch stop layer may be formed using SiC, SiOCx, SiN, SiONx, or the like. Etch stop layer 412 may be formed of a suitable material that has a high etching selectivity with respect to first cap layer 414. Etch stop layer 412 may be formed by PVD, CVD, ALD, spin-on coating, or the like. Other processes and materials may be used.

First cap layer 414 is formed over etch stop layer 412. First cap layer 414 may be formed using a silicon oxide such as BPTEOS or undoped TEOS oxide, or the like. In some embodiments, first cap layer 414 is a LTO. First cap layer 414 may be formed using a same material as second cap layer 410. In other embodiments, first cap layer 414 is formed of a different material than second cap layer 410. Second cap layer 410 may be formed by PVD, CVD, ALD, spin-on coating, or the like. Other processes and materials may be used.

Figure 35:
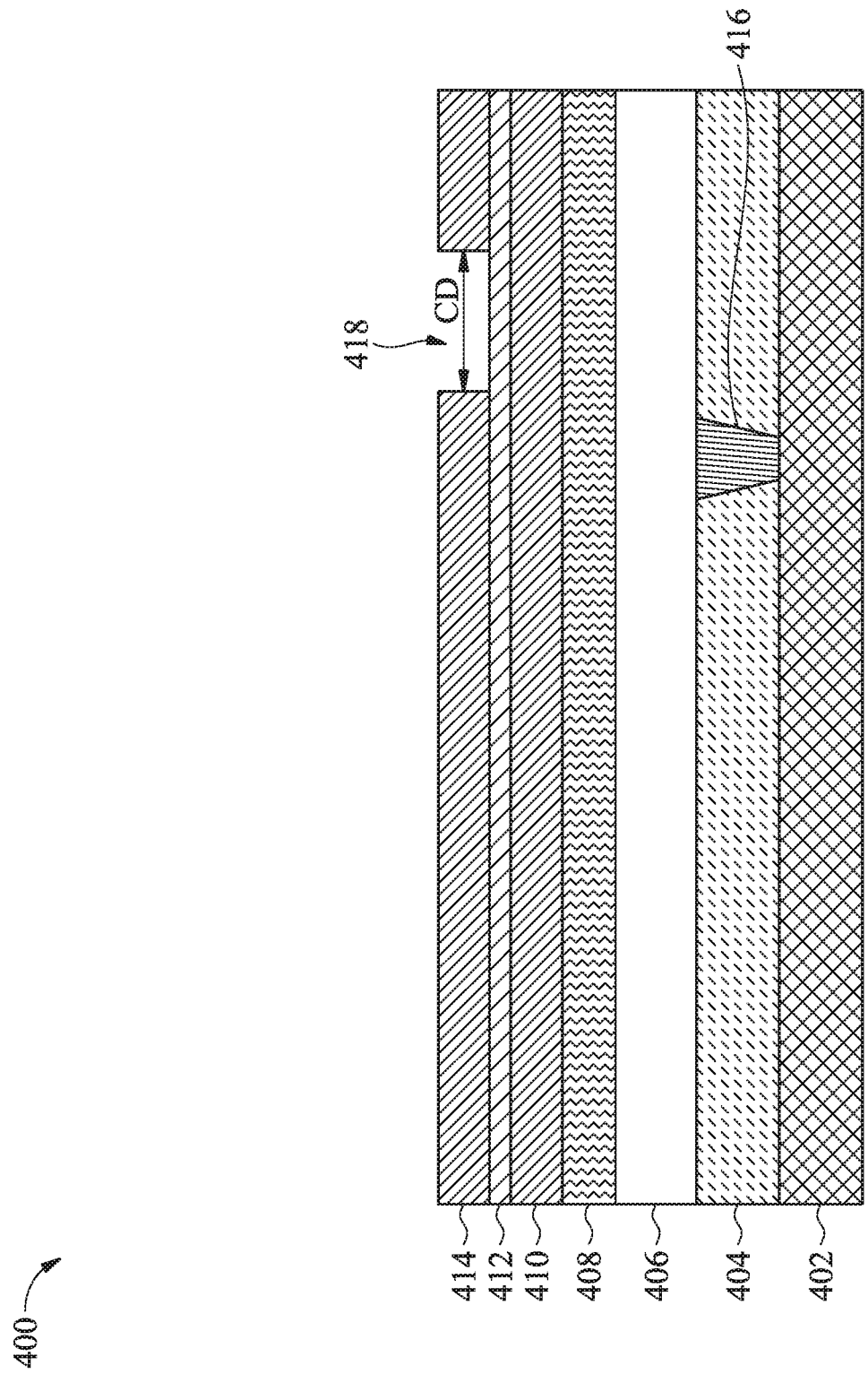

In FIG. 35, first cap layer 414 is patterned to form opening 418. Opening 418 overlies an area of dielectric layer 406 in which a mask 420 will be formed (see FIG. 37). Opening 418 may have a target width CD, which is determined as described in connection with FIGS. 33A-33B above. Opening 418 may be formed using acceptable lithography processes, for example as described herein.

Figure 36:
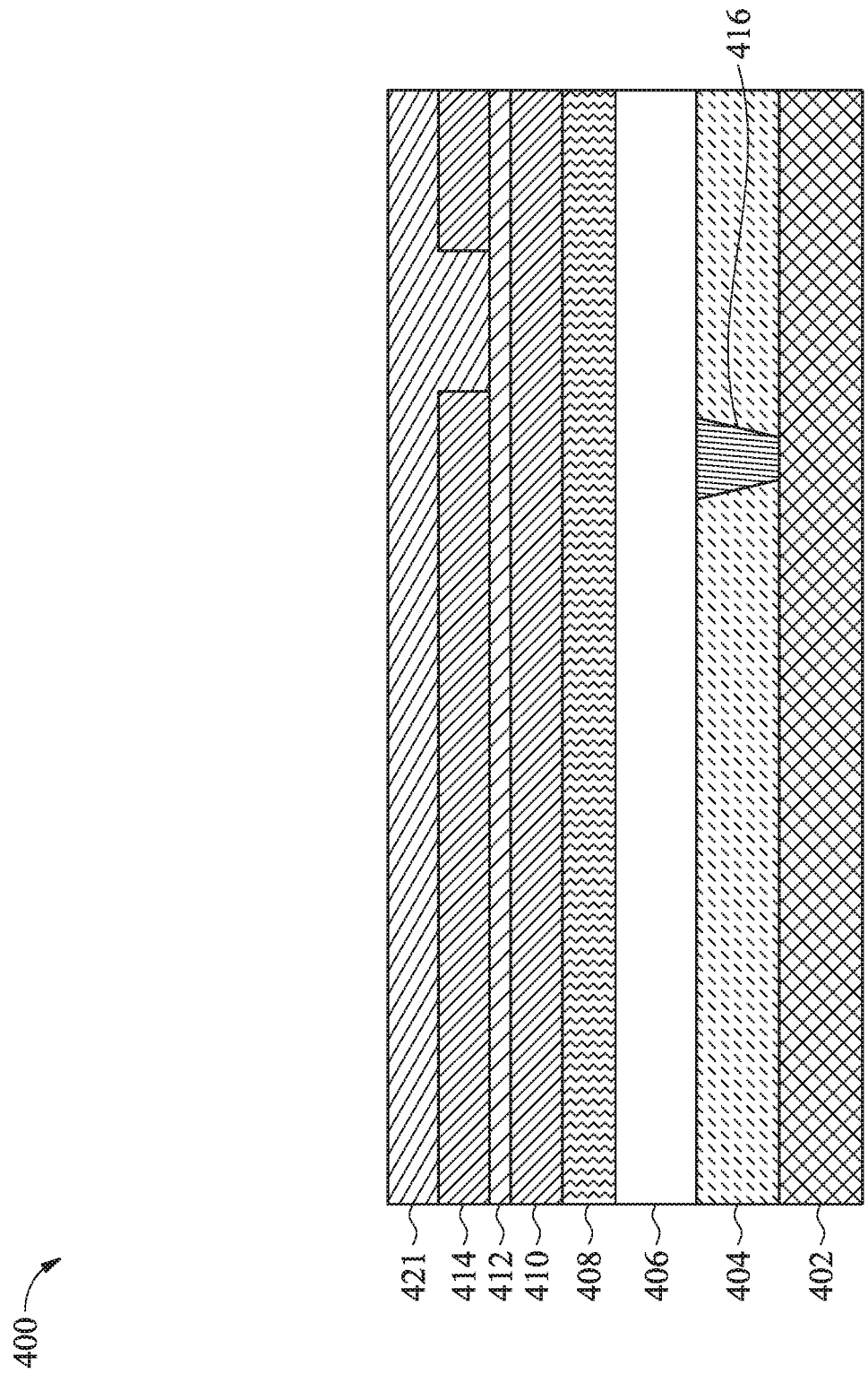

In FIG. 36, a mask material 421 is disposed over first cap layer 414 and in opening 418, thereby filling opening 418 with the mask material 421. In some embodiments, mask material 421 includes SiOx, SiNx, SiCx, a metal oxide, a metal nitride, or the like. In some embodiments, mask material 421 may include any suitable inorganic material that has a high etching selectivity with respect to a material of hard mask layer 408. Mask material 421 may be formed by PVD, CVD, ALD, spin-on coating, or the like. Other processes and materials may be used.

Figure 37:
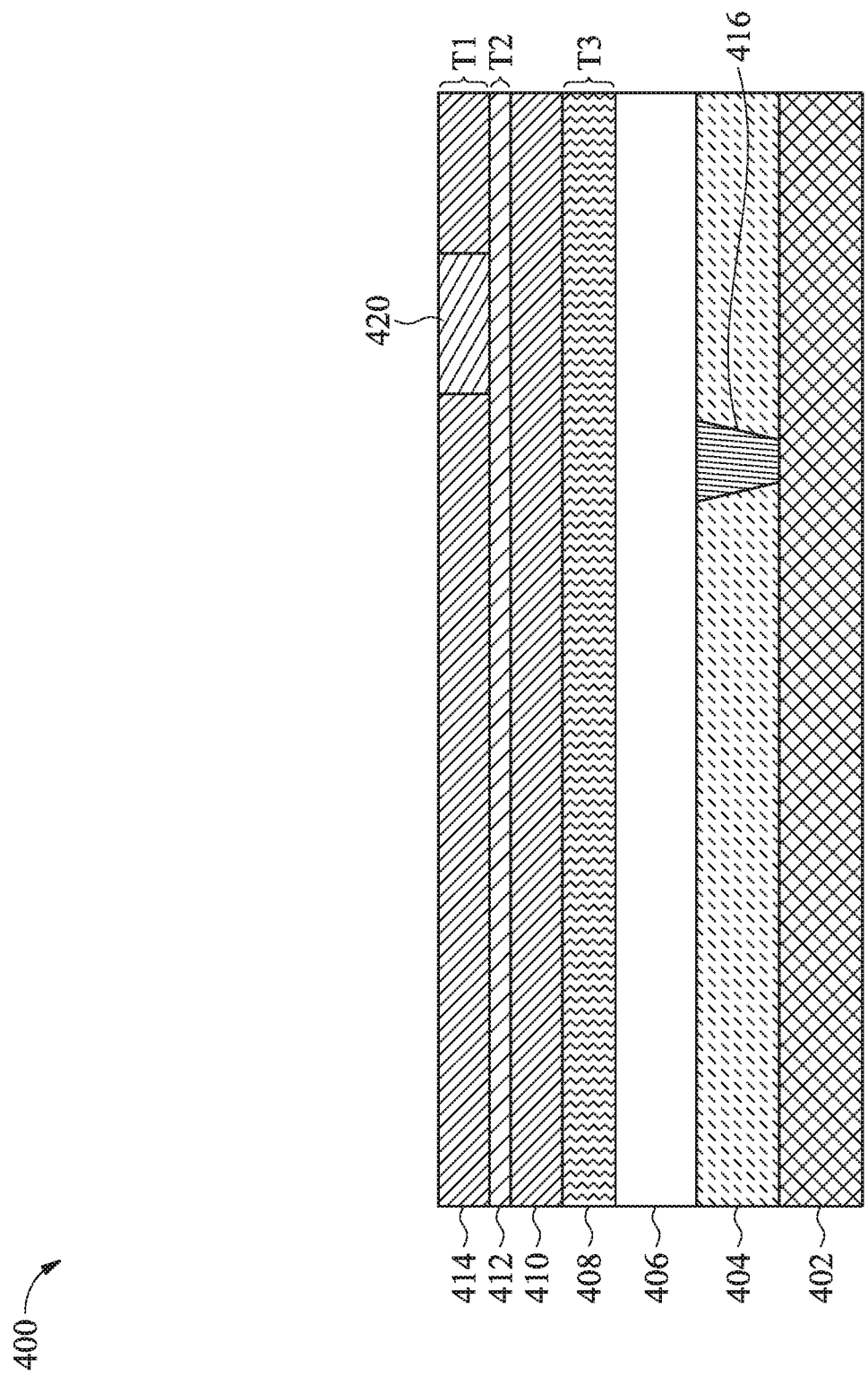

In FIG. 37, excess parts of mask material 421 are removed, forming mask 420. In some embodiments, excess parts of mask material may be removed using a grinding process, such as a chemical mechanical polish process. In other embodiments, an etching process may be used to remove excess parts of mask material 420. After the excess parts of mask material 420 are removed, upper and lower surfaces of mask 420 are planar with upper and lower surfaces of first cap layer 414. Other processes and materials may be used.

As shown in FIG. 37, first cap layer 414 and mask 420 have a thickness T1, and etch stop layer 412 has a thickness T2. In some embodiments, T1 is greater than or equal to half of the cut width CD, where cut width CD is determined as described in connection with FIGS. 33A-B. In other words, in some embodiments, T1≥0.5*CD. In some embodiments, a combined thickness of T1 and T2 satisfies the following relation:

$$T1+T2=T3*(1+\text{target } OE\%/sel(\text{hard mask layer } 408/\text{etch stop layer } 412),$$

where T1 is a thickness of first cap layer 414, T2 is a thickness of etch stop layer 412, T3 is a thickness of hard mask layer 408, target OE % is a target over etching percentage used in the manufacture of a semiconductor device, and sel (hard mask layer 408/etch stop layer 412) is an etching selectivity of hard mask layer 408 compared to etch stop layer 412. When the above relations are satisfied, when a hard mask layer is etched (see FIGS. 44A-B), mask layer 420, etch stop layer 412, and first cap layer 414 will be consumed. Because of the consuming of mask layer 420, etch stop layer 412, and first cap layer 414, hard mask layer 408 and second cap layer 410, after the etching process terminates, have a substantially uniform height. As such, a subsequent etching of dielectric layer 406 to form a conductive line therein will be able to be performed more reliably with less failure, and/or the etching window may be maintained and not undesirably reduced, which could cause difficulties in filling the openings in dielectric layer 406 with a conductive material.

Figure 38:
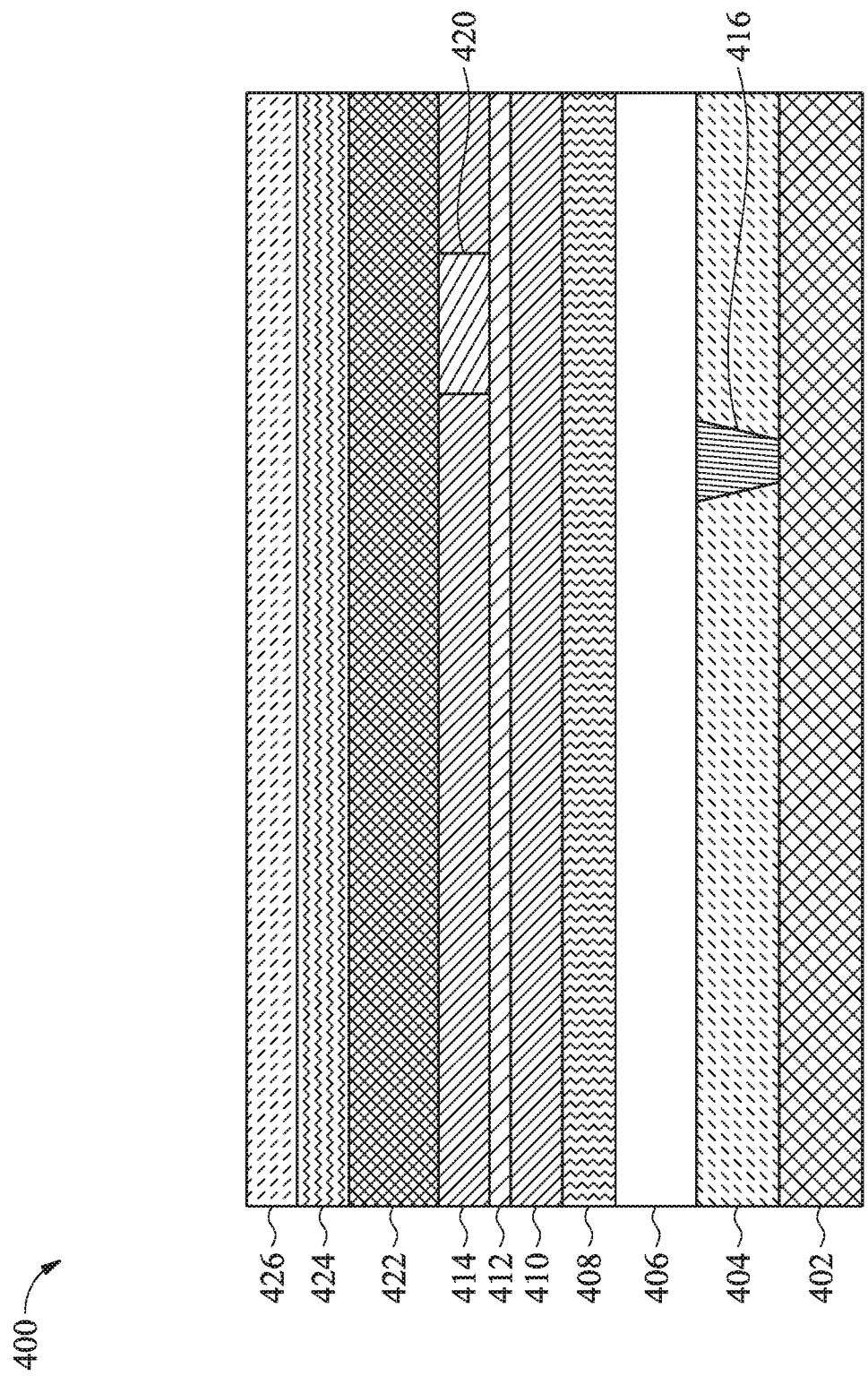

In FIG. 38, a tri-layer masking layer is formed over first cap layer 414 and mask 420. The tri-layer includes bottom layer (also sometimes referred to as under layer) 422, middle layer 424 over bottom layer 422, and upper layer 426 over middle layer 424. In accordance with some embodiments, upper layer 426 may be formed of a photo resist. A positive or a negative photosensitive material may be used. Middle layer 424 may be formed of an inorganic material, which may be a nitride (such as silicon nitride), an oxynitride (such as silicon oxynitride), an oxide (such as silicon oxide), silicon rich photoresist, or the like. Bottom layer 422 may be a polymer or an anti-reflective type material. Middle layer 424 may have a high etching selectivity relative to upper layer 426 and bottom layer 422. Therefore, upper layer 426 may be used as an etching mask for patterning middle layer 424, and middle layer 424 may be used as an etching mask for patterning bottom layer 422. Other materials may be used.

Figure 39:
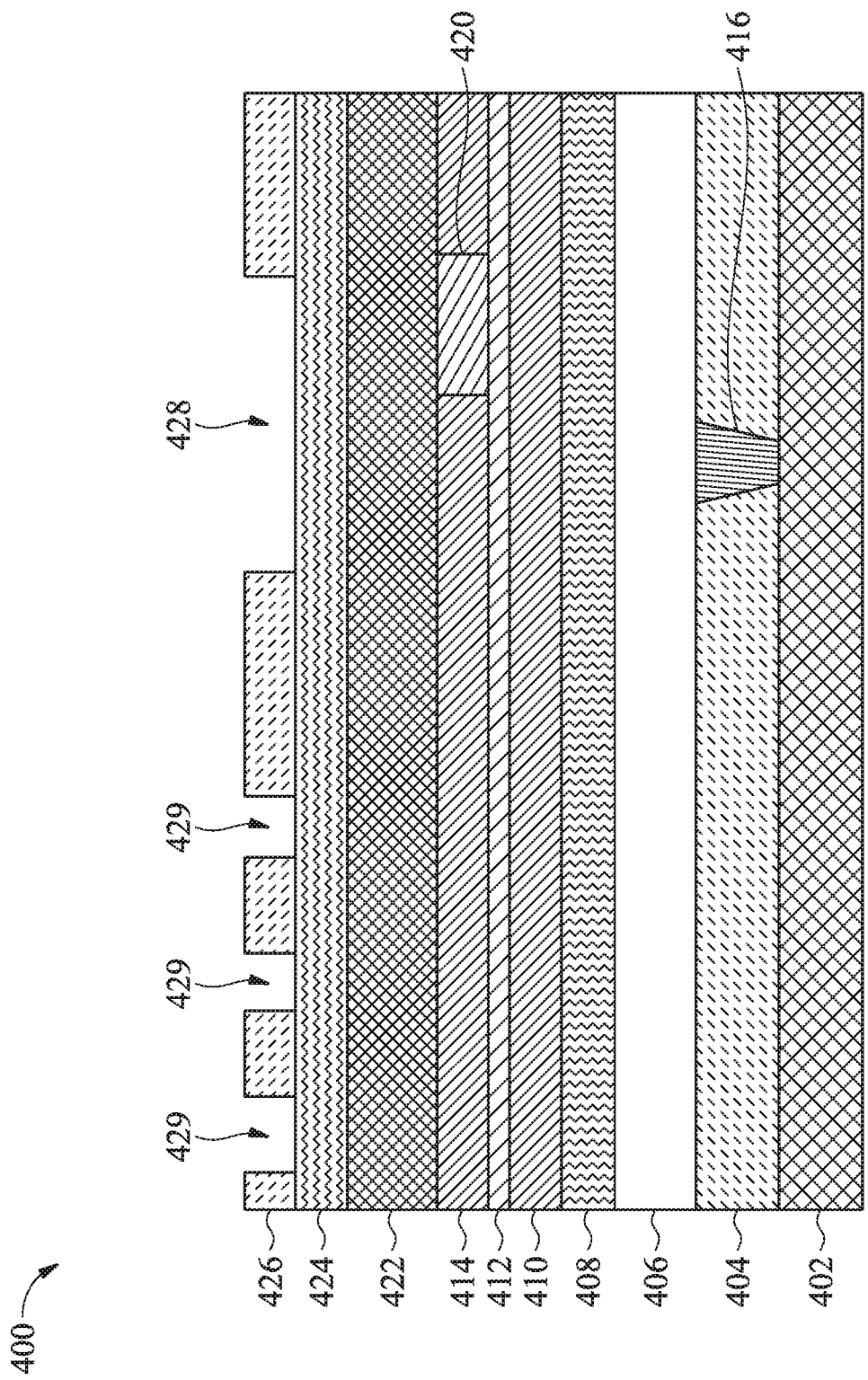

In FIG. 39, upper layer 426 is patterned to form openings 428 and 429. Openings 429 have a pattern of conductive lines that will be formed in dielectric layer 406. Opening 428, together with mask 420, has a pattern of another conductive line that will be formed in dielectric layer 406. As shown in FIG. 39, opening 428 may have a sidewall that is offset from a sidewall of mask 420, for example due to accuracy limitations of processing technologies or variances of equipment used to form the semiconductor device.

Figure 40:
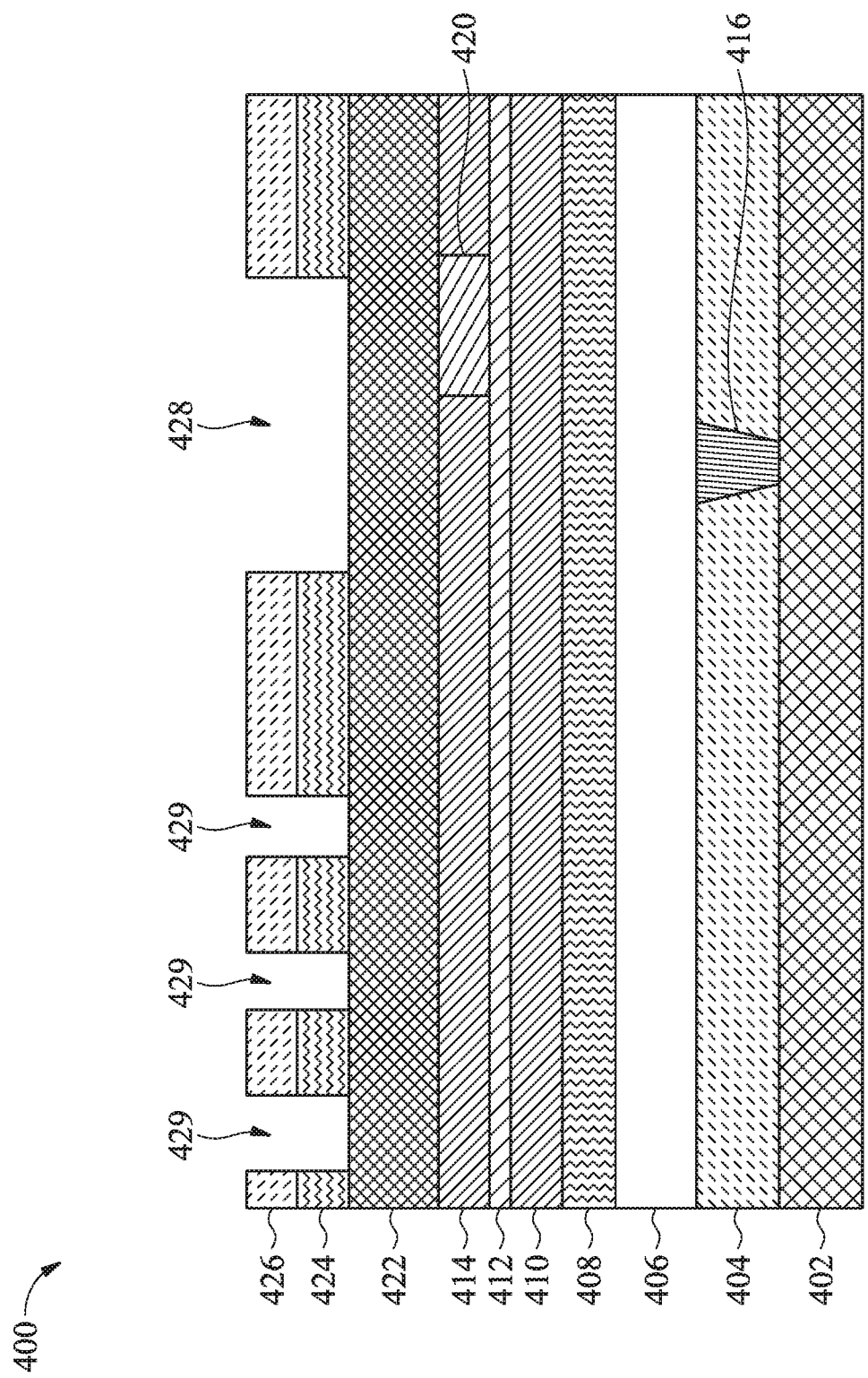

Next, referring to FIG. 40, middle layer 424 is etched using the patterned upper layer 426 as an etching mask, so that the pattern of upper layer 426 is transferred to middle layer 424.

Figure 41:
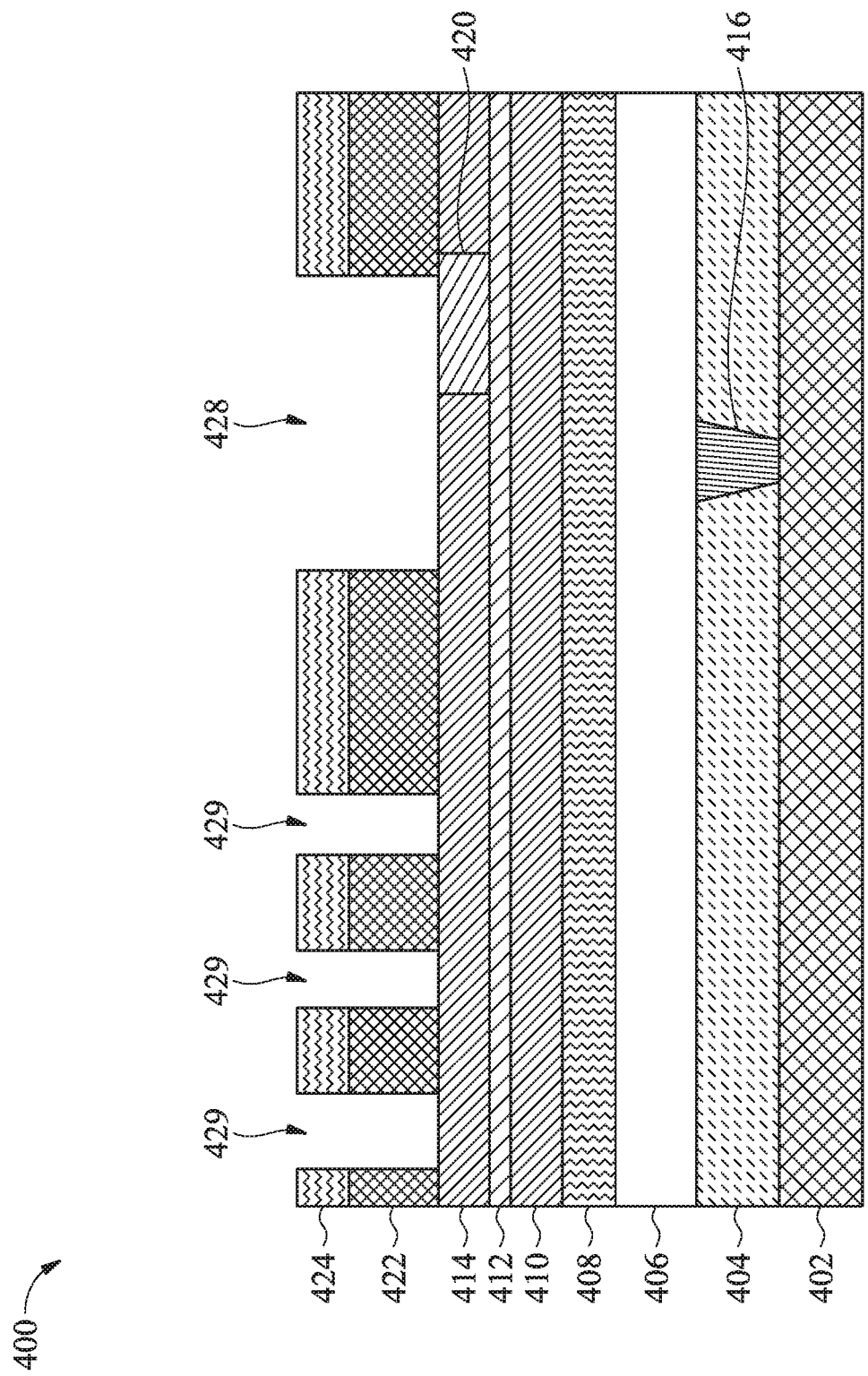

Referring to FIG. 41, after middle layer 424 is etched through, bottom layer 422 is patterned, where middle layer 424 is used as an etching mask. During the patterning of bottom layer 422, upper layer 426 may be consumed. The patterning of bottom layer 422 exposes a portion of top surface of mask 420 and portions of a top surface of first cap layer 414. After the patterning of bottom layer 422, any remaining portions of middle layer 424 may be removed.

Figure 42:
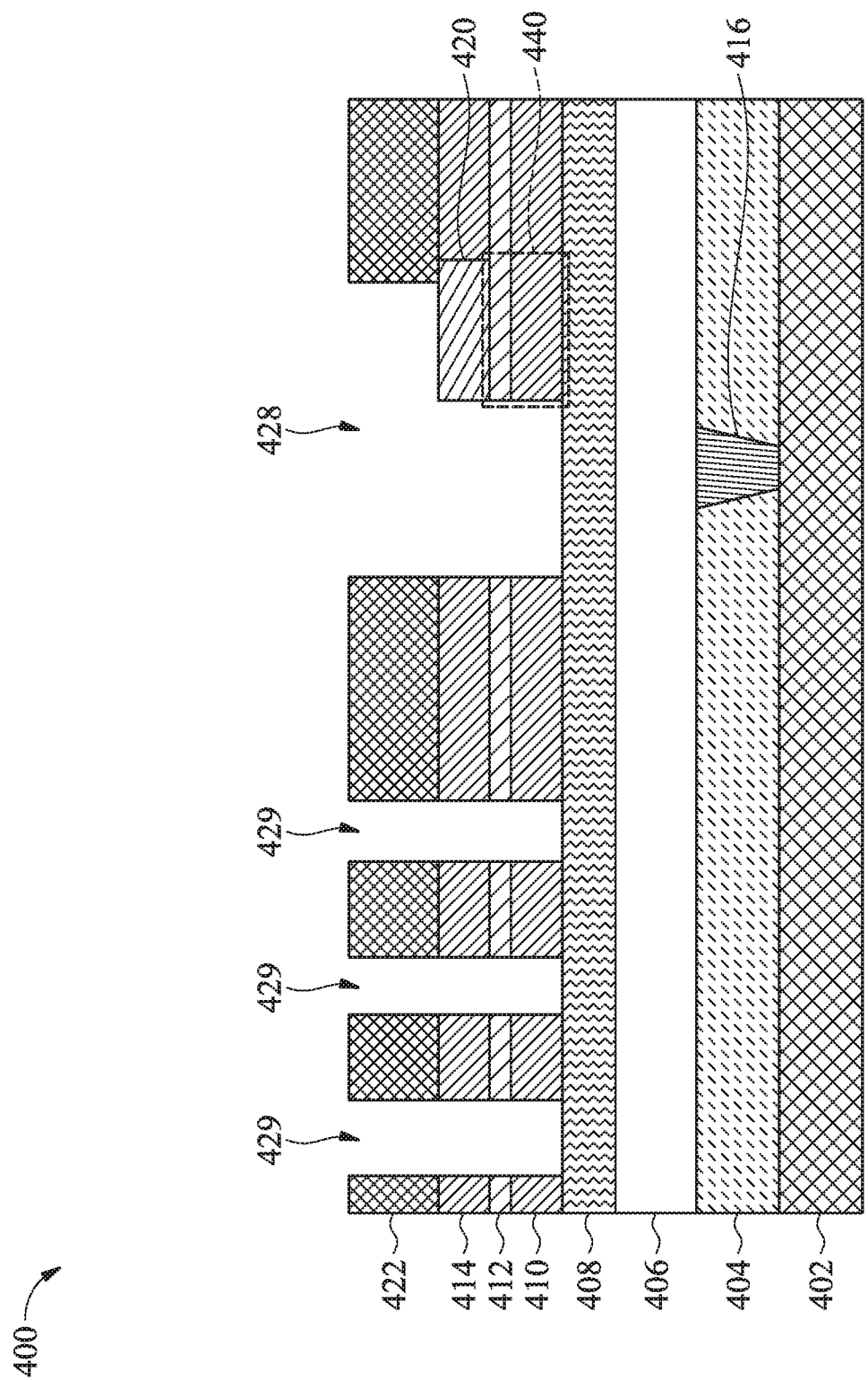

In FIG. 42, bottom layer 422 is then used as an etching mask to etch underlying first cap layer 414, etch stop layer 412, and second cap layer 410. Any suitable etching process may be used, such as wet etching or dry etching. In some embodiments, the etching process is anisotropic. As shown in FIG. 42, mask 420 prevents a portion 440 of etch stop layer 412 and second cap layer 410 that are under mask 420 from being etched. As such, a conductive line that is subsequently formed in opening 428 will have a smaller dimension that it would have without the forming of mask 420. Therefore, a line end (e.g. an unused line end) is not formed.

Figure 43:
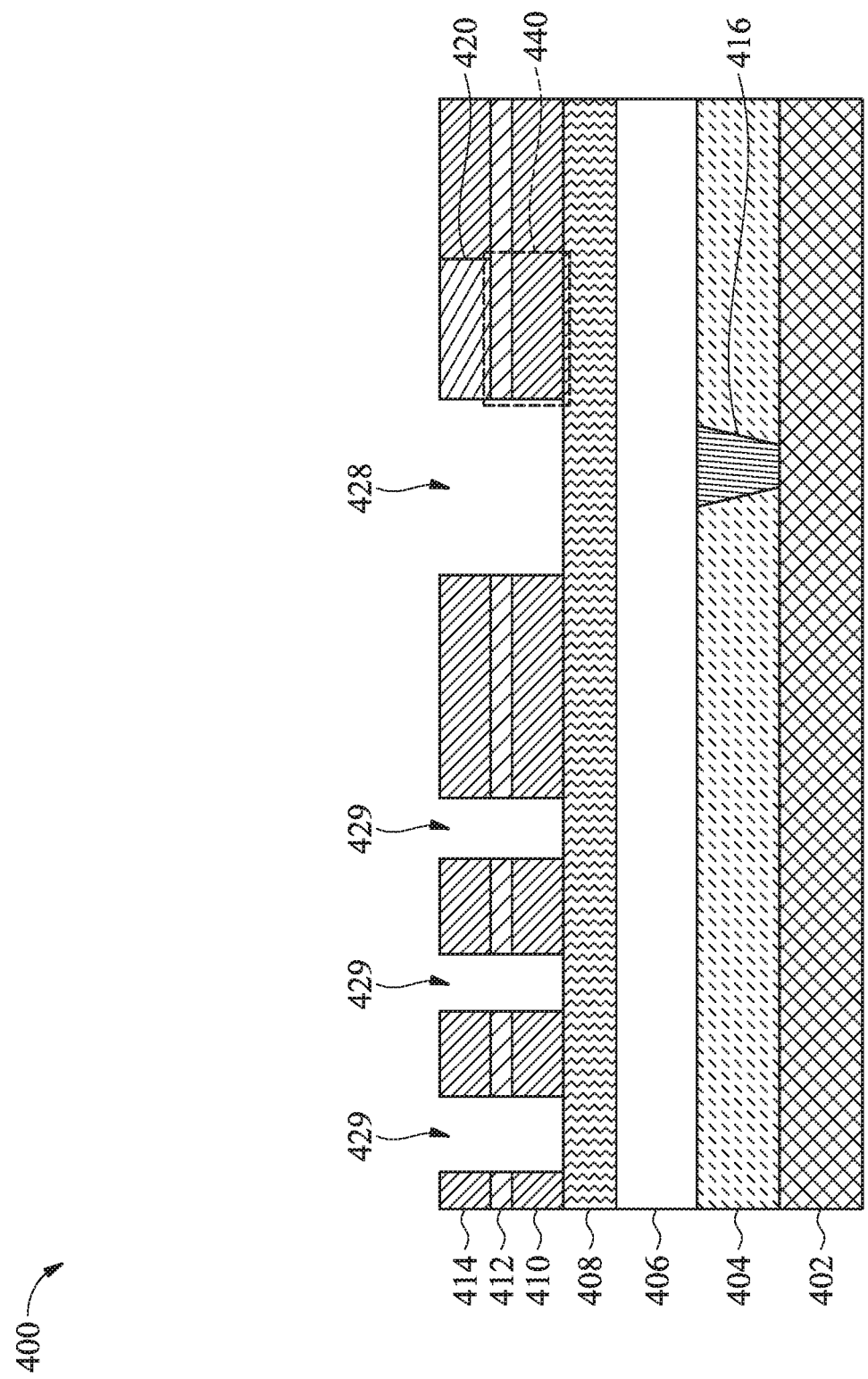

Referring to FIG. 43, after the patterning of first cap layer 414, etch stop layer 412, and second cap layer 410, remaining portions of bottom layer 422 are removed, for example in an ashing process. In some embodiments the patterning of first cap layer 414, etch stop layer 412, and second cap layer 410 consumes the bottom layer, and a separate step of removing the bottom layer 422 may be omitted.

Next, hard mask layer 408 is etched, thereby extending openings 428 and 429 into hard mask layer 408. FIGS. 44A and 44B depict a plan view and a cross sectional view of semiconductor device 400 after hard mask layer 408 is etched. The cross sectional view of FIG. 44A is taken along line A-A' shown in the plan view of FIG. 44B. Any suitable etching process may be used to hard mask layer 408, such as wet etching or dry etching. In some embodiments, the etching process is anisotropic. During the etching of hard mask layer 408, mask layer 420, etch stop layer 412, and first cap layer 414 are consumed. Because of the consuming of mask layer 420, etch stop layer 412, and first cap layer 414, hard mask layer 408 and second cap layer 410, after the etching process terminates, have a substantially uniform height. As such, a subsequent etching of dielectric layer 406 to form a conductive line therein will be able to be performed more reliably with less failure, and/or the etching window may be maintained and not undesirably reduced, which could cause difficulties in filling the openings in dielectric layer 406 with a conductive material.

In FIGS. 45A and 45B, dielectric layer 406 is etched, using hard mask layer 408 as an etching mask. The etching process extends openings 428 and 429 into dielectric layer 406. Any suitable etching process may be used. In some embodiments, the etching process is anisotropic. The etching of dielectric layer 406 exposes a top surface of dielectric layer 404 and via 416. Although via 416 has a rectangular top down view in FIG. 45B, in other embodiments via 416 may have any suitable shape, including a circle, an oval, a polygon, a square, or the like.

Figure 46:
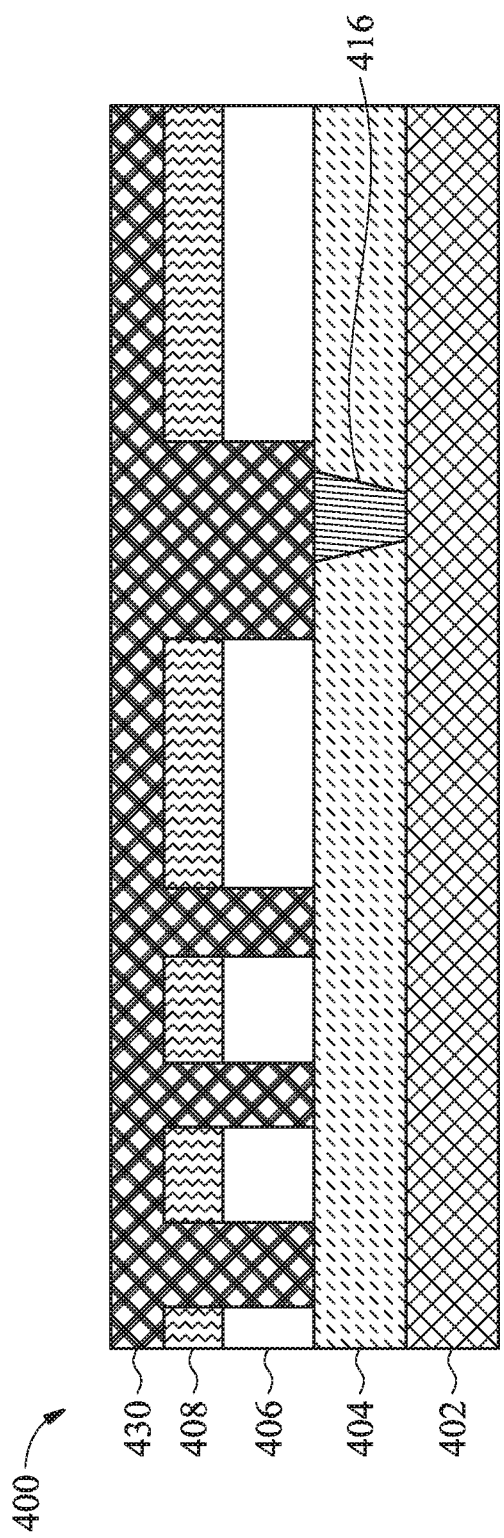
FIGS. 46 and 47 are cross sectional views of intermediary stages in the manufacturing of a semiconductor device in accordance with some embodiments.

In FIG. 46 openings 428 and 429 are filled with a conductive material 430. For example, in some embodiments one or more liners (not shown) may be deposited in openings 428 and 429 and on a top surface of hard mask layer 408. The liners may comprise TiO, TiN, TaO, TaN, or the like and may provide diffusion barrier, adhesion, and/or seed layers. The liners may be deposited using any suitable process, such as, PVD, CVD, ALD, and the like. The remainder of openings 428 and 429 may then be filled with conductive material 430, for example using a plating process. The liners and/or conductive material 430 contact via 416. Any suitable conductive material 430 may be used, such as copper or another metal. The resulting structure is shown in FIG. 46.

Figure 47:
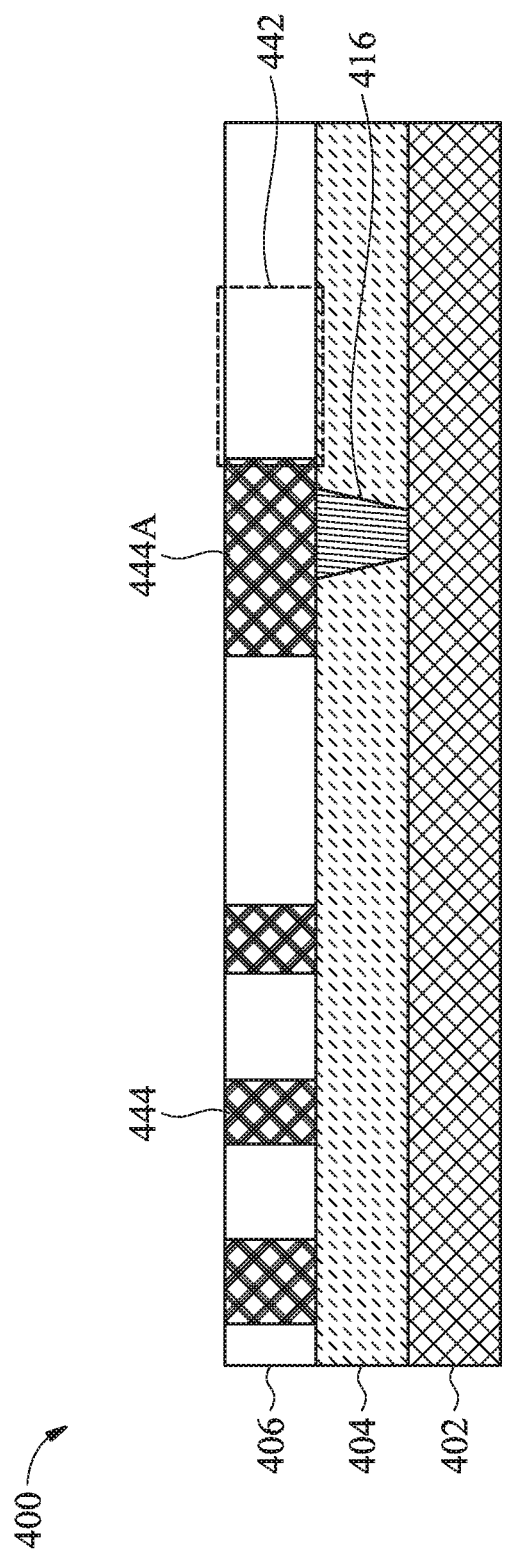

In FIG. 47, excess conductive material 430 is removed, for example using a grinding process such as a chemical mechanical polishing process. The grinding process may also remove remaining portions of hard mask layer 408. After the grinding process is complete, conductive lines 444 have been formed in dielectric layer 406. Top surfaces of conductive lines 444 are planar with a top surface of dielectric layer 406. Because of the use of mask 420, conductive line 444A has a length that is reduced compared to the length conductive line 444A would have had if mask 420 had not been used. Region 442 indicates a section of conductive line 444A that would have been formed without mask 420, but has not been formed in semiconductor device 400.

In subsequent processing, additional dielectric layers, with or without conductive lines, may be formed over dielectric layer 406. External contacts may be formed over semiconductor device 400, enabling the semiconductor device 400 to be electrically and/or physically connected to additional devices.

Figure 48:
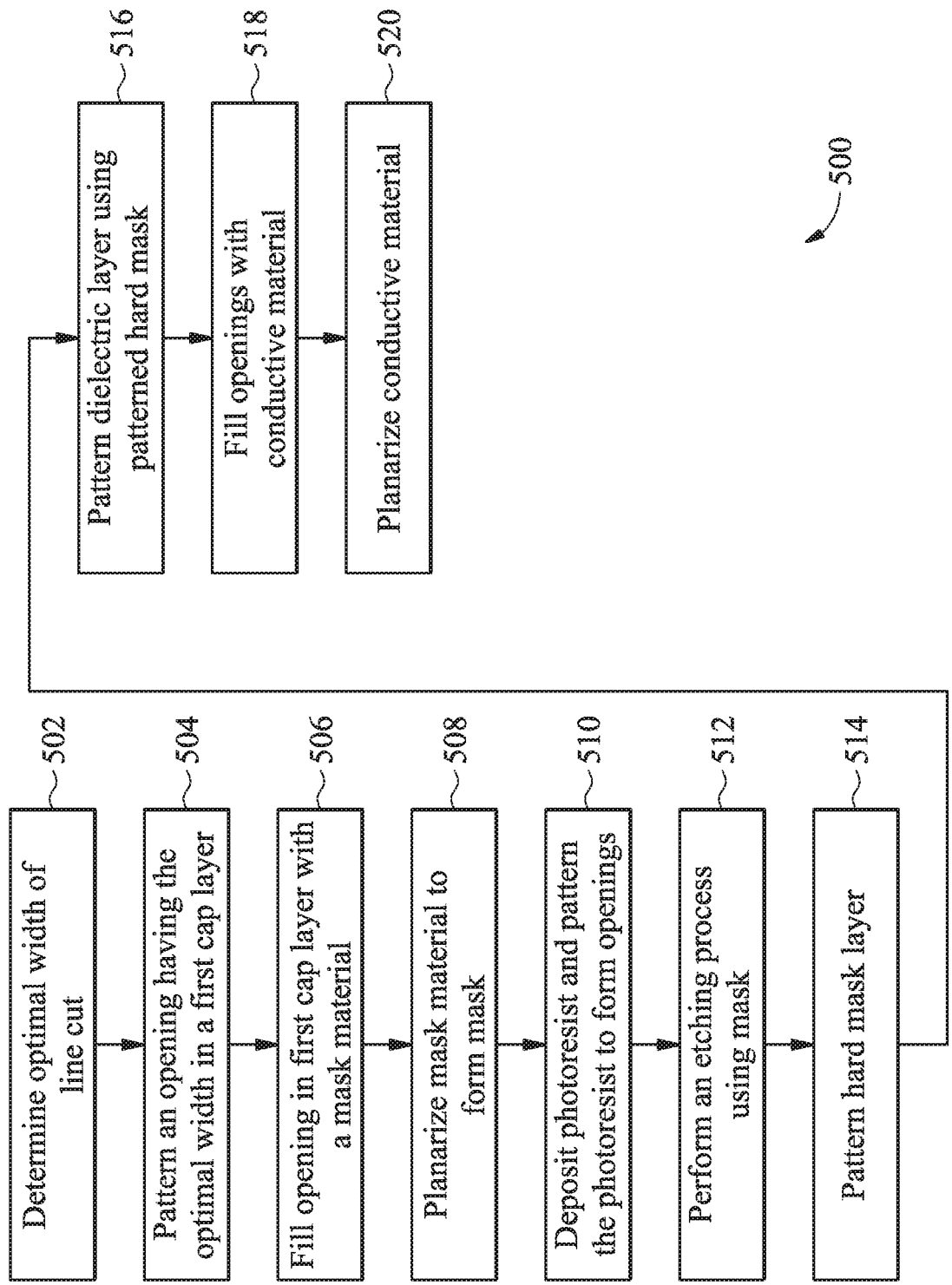
FIG. 48 is a flow chart of a method in accordance with some embodiments.

FIG. 48 depicts a method in accordance with some embodiments. In step 502, an optimal width of a line cut is determined, for example as discussed in connection with FIGS. 33A-B. In step 504 an opening having the optimal width is patterned in a first cap layer, for example as shown in FIG. 35. In step 506 the opening is filled with a mask material, for example as shown in FIG. 36. In step 508 the mask material is planarized, for example as shown in FIG. 37. In step 510 a photoresist is deposited and patterned to form openings, for example as shown in FIGS. 38-41. In step 512 an etching process is performed using the mask, for example as shown in FIG. 42. In step 514 a hard mask layer is patterned, for example as shown in FIGS. 44A and 44B. In step 516 a dielectric layer is patterned using the patterned hard mask, for example as shown in FIGS. 45A and 45B. In step 518 the openings in the dielectric layer are filled with a conductive material, for example as shown in FIG. 46. In step 520 the conductive material is planarized, for example as shown in FIG. 47.

As described herein, a semiconductor device and method of forming the semiconductor device are provided in accordance with some embodiments. A patterning process is performed to pattern lines in a target layer of a semiconductor device. In some embodiments, a dielectric layer is patterned using photolithography, and a patterned sacrificial material (sometimes referred to as a reverse material) is formed over the patterned dielectric layer. After the sacrificial material is formed, the sacrificial material is patterned by forming an opening in the sacrificial material. The patterned dielectric layer and the sacrificial material are used to pattern an underlying mask layer, which is in turn used to pattern a target layer using a single patterning step. Subsequently, conductive material(s) may be filled in the openings of the low-k dielectric layer to define interconnect lines, the interconnect lines having a line cut as defined by the patterned sacrificial material. The conductive lines may have a finer pitch than is achievable using other similar patterning processes, and or the interconnect lines may be formed with a finer pitch using a simplified patterning process. For example, the target layer can be patterned to form fine pitch conductive lines having one or more line cuts using a single patterning process to pattern the target layer. Because the target layer is patterned in a single patterning process, and/or using a simplified process as described herein, increased accuracy of the pattern may be achieved. As such, multiple interconnect lines may be formed to have the same dimensions or substantially the same dimensions, which allows for greater control of resistance of the interconnect lines.

In some embodiments, a target width of a line cut of a line end may be determined, for example using a virtual layout as described herein. A mask may be formed during the formation of a semiconductor device using the determined optimal width. The mask may prevent the patterning of a region of a dielectric layer underlying the mask, thereby preventing a line end from being formed in the dielectric layer during subsequent processing. As described herein, the RC performance of the semiconductor device may be improved, and/or the size or footprint required for the device may be reduced.

A method is provided in accordance with some embodiments. The method includes forming a first mask layer over a target layer. The method also includes forming a plurality of spacers over the first mask layer. The method also includes forming a second mask layer over the plurality of spacers and patterning the second mask layer to form a first opening, wherein in a plan view a major axis of the opening extends in a direction that is perpendicular to a major axis of a spacer of the plurality of spacers. The method also includes depositing a sacrificial material in the opening. The method also includes patterning the sacrificial material. The method also includes etching the first mask layer using the plurality of spacers and the patterned sacrificial material. The method also includes etching the target layer using the etched first mask layer to form second openings in the target layer. The method also includes filling the second openings in the target layer with a conductive material. In an embodiment, patterning the sacrificial material comprises patterning the sacrificial material using an extreme ultraviolet photolithography process. In an embodiment, gaps between adjacent spacers of the plurality of spacers have a pitch of 85.5 nm or less. In an embodiment, the sacrificial material comprises an inorganic material that has a high etching selectivity with respect to a material used to form the first mask layer. In an embodiment, the sacrificial material is a metal oxide or a metal nitride. In an embodiment, the method further includes planarizing the sacrificial material, wherein after the planarizing a top surface of the sacrificial material is level with a top surface of the plurality of spacers. In an embodiment, after the sacrificial material is patterned, the sacrificial material overlies one or more gaps between adjacent spacers. In an embodiment, forming the plurality of spacers over the target layer comprises: forming a tri-layer over a spacer layer; patterning a top layer of the tri-layer using lithography; etching a middle layer of the tri-layer through the patterned top layer; etching a bottom layer of the tri-layer through the middle layer; and etching the spacer layer through the bottom layer to form the plurality of spacers. In an embodiment the method further comprises planarizing the conductive material to form a plurality of interconnect lines, wherein two adjacent interconnect lines of the plurality of interconnect lines have a physical gap separating the two adjacent interconnect lines, the gap disposed in a region that underlies a portion of the sacrificial material that remains after patterning the sacrificial material.

A method is provided in accordance with some embodiments. The method includes forming a first cap layer over a second cap layer, the second cap layer being over a first mask layer, the first mask layer being over a dielectric layer. The method also includes patterning an opening in the first cap layer, the opening having a target width. The method also includes filling the opening with a first material to form a masking element. The method also includes forming a second mask layer over the first cap layer, and patterning the second mask layer to form a first mask, the first mask comprising a plurality of openings. The method also includes etching the first cap layer and the second cap layer using the first mask and the masking element, wherein the masking element prevents a portion of the second cap layer from being etched. The method also includes patterning the first mask layer through the second cap layer to form a second mask. The method also includes patterning the dielectric layer through the second mask, the patterning of the dielectric layer exposing a conductive feature underlying the dielectric layer. The method also includes forming a conductive line in the dielectric layer, the conductive line contacting the conductive feature. In an embodiment, the target width of the opening equals: $2X+S+2*(Z^2+V^2)^0.5$; wherein 2X is a target width of the opening in a virtual layout, S is half of a bias range 2S, Z is half of cut width variance 2Z, and V is a distance that a line cut may be shifted between an actual position and a planned position. In an embodiment the target width of the opening is determined by virtually designing a semiconductor device to be formed using a processing system. In an embodiment the masking element is formed of an inorganic material that has a high etching selectivity with respect to a material of the second mask layer. In an embodiment a thickness of the first cap layer is greater than or equal to half of the target width of the opening. In an embodiment an etch stop layer is disposed between the first cap layer and the second cap layer, and a combined thickness of the first cap layer and the etch stop layer satisfies the relation: $T1+T2=T3*(1+\text{target OE}\%/\text{SEL})$; wherein T1 is a thickness of the first cap layer, T2 is a thickness of the etch stop layer, T3 is a thickness of the second mask layer, target OE % is a target over etching percentage for a processing technology, and SEL is an etching selectivity of the second mask layer to the etch stop layer. In an embodiment, the masking element is consumed during the patterning of the second mask layer.

A device is provided in accordance with some embodiments. The device includes a dielectric layer. The device also includes a power rail extending through the dielectric layer, wherein a sidewall of the power rail comprises one or more kinks. The device also includes a first group of interconnect lines in the dielectric layer on a first side of the power rail. The device also includes a second group of interconnect lines in the dielectric layer on the first side of the power rail, wherein a first kink of the one or more kinks is laterally positioned between the first group of interconnect lines and the second group of interconnect lines. In an embodiment, a spacing between the first group of interconnect lines and the second group of interconnect lines is 85.5 nm or less. In an embodiment the device also includes a third group of interconnect lines in the dielectric layer on a second side of the power rail, the second side being opposite to the first side, wherein a size of interconnect lines of the first group of interconnect lines is the same as a size of interconnect lines of the second group of interconnect lines, and wherein sidewalls of the first group of interconnect lines are aligned with sidewalls of the second group of interconnect lines. In an embodiment all contacts to the power rail are made a minimum distance away from an edge of the power rail.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first mask layer over a target layer;
   forming a plurality of spacers over the first mask layer;
   forming a second mask layer over the plurality of spacers and patterning the second mask layer to form a first opening, wherein in a plan view a major axis of the first opening extends in a direction that is perpendicular to a major axis of a spacer of the plurality of spacers;
   depositing a sacrificial material in the first opening;
   patterning the sacrificial material;
   etching the first mask layer using the plurality of spacers and the patterned sacrificial material;
   etching the target layer using the etched first mask layer to form second openings in the target layer; and
   filling the second openings in the target layer with a conductive material.

2. The method according to claim 1, wherein patterning the sacrificial material comprises patterning the sacrificial material using an extreme ultraviolet photolithography process or an immersion exposure process.

3. The method according to claim 1, wherein gaps between adjacent spacers of the plurality of spacers have a pitch of 85.5 nm or less.

4. The method according to claim 1, wherein the sacrificial material comprises an inorganic material that has a high etching selectivity with respect to a material used to form the first mask layer.

5. The method according to claim 1, wherein the sacrificial material is a metal oxide, an inorganic oxide, or a metal nitride.

6. The method according to claim 1, further comprising planarizing the sacrificial material, wherein after the planarizing a top surface of the sacrificial material is level with a top surface of the plurality of spacers.

7. The method according to claim 1, wherein after the sacrificial material is patterned, the sacrificial material overlies one or more gaps between adjacent spacers.

8. The method according to claim 1, wherein forming the plurality of spacers over the target layer comprises:
   forming a tri-layer over a spacer layer;
   patterning a top layer of the tri-layer using lithography;
   etching a middle layer of the tri-layer through the patterned top layer;
   etching a bottom layer of the tri-layer through the middle layer; and
   etching the spacer layer through the bottom layer to form the plurality of spacers.

9. The method according to claim 1, further comprising planarizing the conductive material to form a plurality of interconnect lines, wherein two adjacent interconnect lines of the plurality of interconnect lines have a physical gap separating the two adjacent interconnect lines, the gap disposed in a region that underlies a portion of the sacrificial material that remains after patterning the sacrificial material.

10. A method, comprising:
    forming a first cap layer over a second cap layer, the second cap layer being over a first mask layer, the first mask layer being over a dielectric layer;
    patterning a first opening in the first cap layer, the first opening having a target width;
    filling the first opening with a first material to form a masking element;
    forming a second mask layer over the first cap layer, and patterning the second mask layer to form a first mask, the first mask comprising a plurality of second openings;
    etching the first cap layer and the second cap layer using the first mask and the masking element, wherein the masking element prevents a portion of the second cap layer from being etched;
    patterning the first mask layer through the second cap layer to form a second mask;
    patterning the dielectric layer through the second mask, the patterning of the dielectric layer exposing a conductive feature underlying the dielectric layer; and
    forming a conductive line in the dielectric layer, the conductive line contacting the conductive feature.

11. The method according to claim 10, wherein the target width of the first opening equals:

$$2X+S+2*(Z^2+V^2)^{0.5}$$

wherein 2X is a target width of the first opening in a virtual layout, S is half of a bias range 2S, Z is half of cut width variance 2Z, and V defines a tolerance of a line cut between an actual position and a planned position.

12. The method according to claim 11, wherein the target width of the first opening is determined by virtually designing a semiconductor device to be formed using a processing system.

13. The method according to claim 11, wherein the masking element is formed of an inorganic material that has a high etching selectivity with respect to a material of the second mask layer.

14. The method according to claim 11, wherein a thickness of the first cap layer is greater than or equal to half of the target width of the first opening.

15. The method according to claim 11, wherein an etch stop layer is disposed between the first cap layer and the second cap layer, and a combined thickness of the first cap layer and the etch stop layer satisfies the relation:

$$T1+T2=T3*(1+\text{target } OE\%/\text{SEL});$$

wherein T1 is a thickness of the first cap layer, T2 is a thickness of the etch stop layer, T3 is a thickness of the second mask layer, target OE % is a target over etching percentage for a processing technology, and SEL is an etching selectivity of the second mask layer to the etch stop layer.

16. The method according to claim 11, wherein the masking element is consumed during the patterning of the second mask layer.

17. A method, comprising:
forming a first mask layer over a target layer;
forming a second mask layer over the first mask layer;
patterning the second mask layer to form a second patterned mask layer, the second patterned mask layer having a first patterned line and a second patterned line;
forming a third patterned mask layer, wherein the third patterned mask layer comprises a third patterned line interposed between the first patterned line and the second patterned line, wherein the third patterned line connects the first patterned line to the second patterned line;
patterning the target layer using the first patterned line, the second patterned line, and the third patterned line as a mask to form an opening in the target layer; and
forming a conductive material in the opening.

18. The method of claim 17, wherein forming the third patterned mask layer comprises:
forming a first sacrificial layer over the second patterned mask layer;
patterning the first sacrificial layer to have a first recess, at least a portion of the first patterned line and the second patterned line being exposed in the first recess;
filling the first recess with a second sacrificial layer; and
removing the first sacrificial layer, wherein the second sacrificial layer comprises a pattern of the third patterned line.

19. The method of claim 17, wherein a distance between the first patterned line and the second patterned line is 85.5 nm or less.

20. The method of claim 18 further comprising planarizing the second sacrificial layer prior to patterning the target layer.

* * * * *